(12) United States Patent
Saito

(10) Patent No.: US 7,023,670 B2
(45) Date of Patent: Apr. 4, 2006

(54) MAGNETIC SENSING ELEMENT WITH IN-STACK BIASING USING FERROMAGNETIC SUBLAYERS

(75) Inventor: Masamichi Saito, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 134 days.

(21) Appl. No.: 10/298,868

(22) Filed: Nov. 18, 2002

(65) Prior Publication Data
US 2003/0103299 A1 Jun. 5, 2003

(30) Foreign Application Priority Data
Nov. 19, 2001 (JP) .............................. 2001-352571
Mar. 11, 2002 (JP) .............................. 2002-064780

(51) Int. Cl.
*G11B 5/39* (2006.01)
(52) U.S. Cl. ................................ 360/324.12; 360/324.2
(58) Field of Classification Search ........... 360/324.12, 360/314, 324.2
See application file for complete search history.

(56) References Cited

U.S. PATENT DOCUMENTS

| | | | |
|---|---|---|---|
| 6,023,395 A | 2/2000 | Dill et al. | |
| 6,473,279 B1 * | 10/2002 | Smith et al. | 360/324.12 |
| 6,741,432 B1 * | 5/2004 | Pinarbasi | 360/324.11 |
| 6,741,433 B1 * | 5/2004 | Nishioka | 360/324.2 |
| 6,747,852 B1 * | 6/2004 | Lin et al. | 360/324.12 |
| 6,807,033 B1 * | 10/2004 | Zhu | 360/324.12 |
| 6,831,816 B1 * | 12/2004 | Gill | 360/324.12 |
| 2003/0179513 A1 * | 9/2003 | Pinarbasi | 360/324.12 |
| 2003/0235016 A1 * | 12/2003 | Gill | 360/324.2 |

* cited by examiner

*Primary Examiner*—Craig A. Renner
(74) *Attorney, Agent, or Firm*—Brinks Hofer Gilson & Lione

(57) ABSTRACT

In a magnetic sensing element, the magnetization direction of a ferromagnetic layer is pinned by an exchange coupling magnetic field between a second antiferromagnetic layer and the ferromagnetic layer, and the magnetization of a free magnetic layer is oriented in a direction substantially perpendicular to the magnetization of a pinned magnetic layer by an RKKY interaction between the ferromagnetic layer and the free magnetic layer with a nonmagnetic layer therebetween. Consequently, the control of the magnetization direction of the free magnetic layer is adjusted in two stages, i.e., by the magnitude of the exchange coupling magnetic field between the second antiferromagnetic layer and the ferromagnetic layer and by the magnitude of the RKKY interaction between the ferromagnetic layer and the free magnetic layer, thus facilitating fine controls.

33 Claims, 18 Drawing Sheets

MAGNETIC SENSING ELEMENT WITH IN-STACK BIASING USING FERROMAGNETIC SUBLAYERS

BACKGROUND OF THE INVENTION

1. Field of the Invention

The present invention relates to magnetic sensing elements mainly used for magnetic sensors, hard disk drives, etc., and to methods for fabricating the same. More particularly, the invention relates to a magnetic sensing element which is suitable for track narrowing and which has improved magnetic sensitivity, and to a method for fabricating the same.

2. Description of the Related Art

FIG. 17 is a sectional view which shows a structure of a conventional magnetic sensing element, viewed from the surface facing a recording medium.

The magnetic sensing element shown in FIG. 17 is a spin-valve thin-film magnetic sensing element which is one type of giant magnetoresistive (GMR) element using a giant magnetoresistance effect, and it detects a recorded magnetic field from a magnetic recording medium, such as a hard disk.

The spin-valve thin-film magnetic sensing element includes a multilayer film 9 in which a substrate 8, a first antiferromagnetic layer 1, a pinned magnetic layer 2, a nonmagnetic material layer 3, and a free magnetic layer 4 are deposited in that order from the bottom; a pair of second antiferromagnetic layers 6 formed on the multilayer film 9; and a pair of electrode layers 7 formed on the second antiferromagnetic layers 6.

Typically, the first antiferromagnetic layer 1 and the second antiferromagnetic layers 6 are composed of Fe—Mn alloy films, Ni—Mn alloy films, or Pt—Mn alloy films; the pinned magnetic layer 2 and the free magnetic layer 4 are composed of Ni—Fe alloy films; the nonmagnetic material layer 3 is composed of a Cu film; and the electrode layers 7 are composed of Cr films.

Preferably, the magnetization of the pinned magnetic layer 2 is aligned in a single domain state in the Y direction (the direction of a leakage magnetic field from the recording medium, i.e., in the height direction) by an exchange anisotropic magnetic field with the first antiferromagnetic layer 1, and the magnetization of the free magnetic layer 4 is aligned in the X direction by exchange anisotropic magnetic fields from the second antiferromagnetic layers 6.

That is, preferably, the magnetization direction of the pinned magnetic layer 2 is substantially perpendicular to the magnetization direction of the free magnetic layer 4.

In the spin-valve magnetic sensing element, a sensing current is applied from one of the electrode layers 7 formed on the second antiferromagnetic layers 6 to the free magnetic layer 4, the nonmagnetic material layer 3, and the pinned magnetic layer 2. The recording medium, such as a hard disk, travels in the Z direction. When a leakage magnetic field is applied in the Y direction from the recording medium, the magnetization direction of the free magnetic layer 4 is changed from the X direction to the Y direction. Electrical resistance changes due to the relationship between the varying magnetization direction of the free magnetic layer 4 and the pinned magnetization direction of the pinned magnetic layer 2, which is referred to as the magnetoresistance effect, and the leakage magnetic field from the magnetic recording medium is detected by a voltage change based on the change in the electrical resistance.

In order to fabricate the spin-valve magnetic sensing element shown in FIG. 17, after the multilayer film 9 is formed, a resist layer R for a lift-off process is formed on the multilayer film 9 as shown in FIG. 18, and the second antiferromagnetic layers 6 and the electrode layers 7 are formed by ion beam sputtering or the like. Layers 6a having the same composition as that of the second antiferromagnetic layers 6, and layers 7a having the same composition as that of the electrode layers 7 are formed on the resist layer R.

Sputtered particles are not easily deposited on the regions covered by both ends of the resist layer R. Therefore, in the vicinities of the regions covered by the ends of the resist layer R, the thicknesses of the second antiferromagnetic layers 6 and the electrode layers 7 are small, and as shown in FIGS. 17 and 18, the thicknesses of the second antiferromagnetic layers 6 and the electrode layers 7 decrease in the side regions sandwiching the track.

Consequently, the effect of the exchange coupling magnetic field between the free magnetic layer 4 and the second antiferromagnetic layer 6 at each side region S is decreased. As a result, the magnetization direction of the free magnetic layer 4 in the side region S is not completely pinned in the X direction, and when an external magnetic field is applied, the magnetization direction of the free magnetic layer 4 is varied.

In particular, when the track is narrowed in order to improve the recording density in the magnetic recording medium, side reading may occur in which, in addition to information in the magnetic recording track to be read within the track width Tw region, information in the adjoining magnetic recording tracks is also read in the side regions S.

In the structure in which the second antiferromagnetic layers 6 are deposited on both sides in the track width direction of the free magnetic layer 4, the central region in the track width direction of the free magnetic layer 4 tends to be insufficiently aligned in a single domain state and the magnetization direction tends to be insufficiently controlled.

Consequently, instead of the structure of the magnetic sensing element shown in FIG. 17 in which the second antiferromagnetic layers 6 are deposited on both sides of the free magnetic layer 4 with a distance corresponding to the track width therebetween, a structure has been devised in which, as shown in FIG. 19, by depositing a second antiferromagnetic layer 10 on the entire upper surface of a free magnetic layer 4, the region corresponding to the track width Tw of the free magnetic layer 4 is aligned in a single domain state, and the magnetization is directed substantially perpendicular to the magnetization direction of a pinned magnetic layer 2.

In order to align the region corresponding to the track width Tw of the free magnetic layer 4 in a single domain state and direct the magnetization substantially perpendicular to the magnetization direction of the pinned magnetic layer 2, the exchange coupling magnetic field between the free magnetic layer 4 and the second antiferromagnetic layer 10 must be increased. If the exchange coupling magnetic field is excessively increased, the magnetization of the free magnetic layer 4 is not varied when a leakage magnetic field from the recording medium is applied in the Y direction, and magnetic sensitivity is lost.

In the structure shown in FIG. 19, it is very difficult to adjust the magnitude of the exchange coupling magnetic field between the free magnetic layer 4 and the antiferromagnetic layer 10 so that the magnetization direction of the free magnetic layer 4 is substantially perpendicular to the magnetization direction of the pinned magnetic layer 2 and the magnetization direction of the free magnetic layer 4 is varied by the leakage magnetic field. The structure shown in FIG. 19 is thus impractical.

SUMMARY OF THE INVENTION

It is an object of the present invention to provide a magnetic sensing element in which the alignment in a single domain state and control of the magnetization direction of the free magnetic layer can be performed appropriately and easily, thus promoting track narrowing, and to provide a method for fabricating the same.

In one aspect of the present invention, a magnetic sensing element includes a multilayer film including a first antiferromagnetic layer, a pinned magnetic layer, the magnetization direction of the pinned magnetic layer being pinned by the first antiferromagnetic layer, a nonmagnetic material layer, and a free magnetic layer, the magnetization direction of the free magnetic layer being varied by an external magnetic field. Each of the pinned magnetic layer and the free magnetic layer is composed of a ferromagnetic material. The multilayer film also includes a ferromagnetic layer and a second antiferromagnetic layer deposited above or below at least a region corresponding to the track width of the free magnetic layer with a nonmagnetic layer therebetween, the magnetization direction of the ferromagnetic layer being oriented substantially perpendicular to the magnetization direction of the pinned magnetic layer by an exchange coupling magnetic field with the second antiferromagnetic layer.

In the present invention, the magnetization direction of the ferromagnetic layer is directed substantially perpendicular to the magnetization direction of the pinned magnetic layer, and the free magnetic layer is formed on the ferromagnetic layer with the nonmagnetic layer therebetween. Consequently, the alignment in a single domain state and control of the magnetization direction of the free magnetic layer are adjusted in two stages, i.e., by the magnitude of the exchange coupling magnetic field between the antiferromagnetic layer and the ferromagnetic layer and by the magnitude of magnetic coupling between the ferromagnetic layer and the free magnetic layer, thus facilitating fine controls.

In the present invention, since the alignment in a single domain state and control of the magnetization direction of the free magnetic layer can be performed appropriately and easily, it is possible to promote further track narrowing in the magnetic sensing element.

In the present invention, even in the structure in which the ferromagnetic layer and the second antiferromagnetic layer are deposited on the region corresponding to the track width of the free magnetic layer with the nonmagnetic layer therebetween, the magnetization direction of the free magnetic layer can be reliably directed substantially perpendicular to the magnetization direction of the pinned magnetic layer, and the magnetization direction of the free magnetic layer can be varied by a leakage magnetic field.

Consequently, in the present invention, it is possible to prevent the center and the sides in the region corresponding to the track width of the free magnetic layer from having different magnetization directions.

Preferably, the free magnetic layer is aligned in a single domain state by an interlayer coupling magnetic field with the ferromagnetic layer with the nonmagnetic layer therebetween, and the magnetization of the free magnetic layer is directed substantially perpendicular to the magnetization direction of the pinned magnetic layer.

For example, an RKKY interaction occurs between the free magnetic layer and the ferromagnetic layer with the nonmagnetic layer therebetween. As a result, the free magnetic layer is aligned in a single domain state, and the magnetization of the free magnetic layer is directed substantially perpendicular to the magnetization direction of the pinned magnetic layer.

As described above, since the free magnetic layer is aligned in a single domain state and the magnetization direction of the free magnetic layer is controlled by the interlayer coupling magnetic field between the ferromagnetic layer and the free magnetic layer with the nonmagnetic layer therebetween, the longitudinal bias magnetic field applied to the free magnetic layer can be prevented from being disturbed and the magnetic domain structure of the free magnetic layer can be prevented from being disturbed by an external magnetic field, such as a leakage magnetic field from the recording medium.

In order to produce a stable RKKY interaction between the free magnetic layer and the ferromagnetic layer, the nonmagnetic layer is preferably composed of at least one material selected from the group consisting of Ru, Rh, Ir, Cr, Re, and Cu.

When the nonmagnetic layer is composed of Ru, and the free magnetic layer and the ferromagnetic layer in a synthetic ferrimagnetic state in which the magnetization directions of the free magnetic layer and the ferromagnetic layer are antiparallel to each other, preferably, the thickness of the Ru nonmagnetic layer is in the range of 8 to 11 Å or in the range of 15 to 21 Å.

In the present invention, the exchange coupling magnetic field between the second antiferromagnetic layer and the ferromagnetic layer is increased so that the magnetization direction of the ferromagnetic layer is strongly pinned in a direction substantially perpendicular to the magnetization direction of the pinned magnetic layer, and the magnitude the interlayer coupling magnetic field between the free magnetic layer and the ferromagnetic layer with the nonmagnetic layer therebetween is set smaller than the magnitude of the exchange coupling magnetic field between the second antiferromagnetic layer and the ferromagnetic layer. Thereby, the magnetization of the free magnetic layer must be reliably directed in a direction substantially perpendicular to the magnetization direction of the pinned magnetic layer, and also the magnetization direction of the free magnetic layer must be varied by the leakage magnetic field.

In order to increase the exchange coupling magnetic field between the second antiferromagnetic layer and the ferromagnetic layer and to set the magnitude of the interlayer coupling magnetic field between the free magnetic layer and the ferromagnetic layer smaller than the magnitude of the exchange coupling magnetic field, in the present invention, the magnitude of the magnetic moment (Ms×t; product of saturation magnetization and layer thickness) per unit area of the ferromagnetic layer may be set smaller than the magnitude of the magnetic moment (Ms×t; product of saturation magnetization and layer thickness) per unit area of the free magnetic layer.

Specifically, the ratio of the magnitude of the magnetic moment (Ms×t) per unit area of the free magnetic layer to the magnitude of the magnetic moment (Ms×t) per unit area of the ferromagnetic layer is preferably in the range of 3 to 20.

Preferably, the ferromagnetic layer has a laminated structure including a sublayer composed of NiFe (Permalloy) or NiFeX, wherein X is at least one element selected from the group consisting of Al, Si, Ti, V, Cr, Mn, Cu, Zr, Nb, Mo, Ru, Rh, Hf, Ta, W, Ir, and Pt, in contact with the nonmagnetic layer and a sublayer composed of a Co-containing ferromagnetic material in contact with the second antiferromagnetic layer. Consequently, the magnitude of the interlayer coupling magnetic field between the free magnetic layer and the ferromagnetic layer can be decreased appropriately, and the exchange coupling magnetic field between the second antiferromagnetic layer and the ferromagnetic layer can be increased.

Alternatively, the ferromagnetic layer may have a single-layer structure composed of NiFe (Permalloy) with a thickness greater than 0 nm and less than or equal to 3 nm. Consequently, the free magnetic layer can be aligned in a single domain state, the magnetization of the free magnetic layer can be reliably directed in a direction substantially perpendicular to the magnetization direction of the pinned magnetic layer, and the magnetization direction of the free magnetic layer can be varied by the leakage magnetic field.

Alternatively the ferromagnetic layer may have a single-layer structure composed of CoFeCr or CoFe.

Preferably, the free magnetic layer includes a magnetic region composed of NiFe or NiFeX, wherein X is at least one element selected from the group consisting of Al, Si, Ti, V, Cr, Mn, Cu, Zr, Nb, Mo, Ru, Rh, Hf, Ta, W, Ir, and Pt, at least on the side in contact with the nonmagnetic layer. Consequently, the interlayer coupling magnetic field between the free magnetic layer and the ferromagnetic layer can be decreased appropriately.

More preferably, the free magnetic layer includes a magnetic region composed of a Co-containing ferromagnetic material on the side in contact with the nonmagnetic material layer. Consequently, it is possible to prevent the material (Ni, etc.) of the free magnetic layer from diffusing into the nonmagnetic material layer in contact with the free magnetic layer, thus preventing a decrease in the rate of change in magnetoresistance.

The Co-containing ferromagnetic material is preferably CoFe or CoFeCr.

In the magnetic sensing element having the structure of the present invention, the read efficiency η can be set at 10% to 50%. The read efficiency η is defined as follows.

η=[(maximum change in resistance in magnetic sensing element due to leakage magnetic field from recoridng medium)/(theoretical value of maximum change in resistnace in magnetic sensing element)]×100

The theoretical value of the maximum change in resistance in the magnetic sensing element corresponds to a difference between the resistance obtained when the magnetization directions of the free magnetic layer and the pinned magnetic layer are antiparallel to each other and the resistance obtained when the magnetization directions of the free magnetic layer and the pinned magnetic layer are parallel to each other.

In the magnetic sensing element of the present invention, in the presence of an applied external magnetic field, the magnetization direction of the region corresponding to the track width of the free magnetic layer can be inclined 12° or more with respect to the magnetization direction in the absence of the external magnetic field.

In the present invention, in the multilayer film, the first antiferromagnetic layer, the pinned magnetic layer, the nonmagnetic material layer, the free magnetic layer, the nonmagnetic layer, the ferromagnetic layer, and the second antiferromagnetic layer may be deposited in that order from the bottom.

Alternatively, in the multilayer film, the second antiferromagnetic layer, the ferromagnetic layer, the nonmagnetic layer, the free magnetic layer, the nonmagnetic material layer, the pinned magnetic layer, and the first antiferromagnetic layer may be deposited in that order from the bottom.

In the free magnetic layer of the present invention, only a portion in the thickness direction of the free magnetic layer has a width in the track width direction that is equal to the track width, and the remaining portion has a width in the track width direction that is larger than the track width.

If a portion of the free magnetic layer has a width in the track width direction that is larger than the track width, the demagnetizing field generated in the free magnetic layer due to surface magnetic charges occurring at both side faces of the free magnetic layer can be decreased, and the fluctuation in the magnetization direction in the free magnetic layer can be reduced.

In particular, if the magnetic sensing element is a current-perpendicular-to-plane (CPP) type, in which a current is applied perpendicular to the planes of the individual layers of the multilayer film, and is a top type, in which the nonmagnetic material layer, the pinned magnetic layer, and the first antiferromagnetic layer are placed above the free magnetic layer, it is easy to form the free magnetic layer so that a portion of the free magnetic layer has a width in the track width direction that is larger than the track width.

Preferably, the free magnetic layer includes a plurality of ferromagnetic sublayers having different magnetic moments per unit area, a nonmagnetic intermediate sublayer being placed between the two adjacent ferromagnetic sublayers, and the magnetization directions of the two adjacent ferromagnetic sublayers are antiparallel, thus being in a ferrimagnetic state. Consequently, the real magnetic moment per unit area of the free magnetic layer can be decreased, and the rate of variation in the magnetization direction of the free magnetic layer with respect to an external magnetic field can be improved. That is, it is possible to improve the magnetic sensitivity of the magnetic sensing element. The demagnetizing field in the free magnetic layer can also be decreased.

Preferably, the nonmagnetic intermediate sublayer is composed of at least one material selected from the group consisting of Ru, Rh, Ir, Cr, Re, and Cu.

Preferably, at least one of the plurality of ferromagnetic sublayers is composed of a magnetic material represented by the formula CoFeNi, wherein the Fe content is in the range of 9 to 17 atomic percent, the Ni content is in the range of 0.5 to 10 atomic percent, and the balance is Co.

Preferably, an interlayer composed of a CoFe alloy or Co is formed between the ferromagnetic sublayer closest to the nonmagnetic material layer and the nonmagnetic material layer. When the interlayer is formed, at least one of the plurality of ferromagnetic sublayers is composed of a magnetic material represented by the formula CoFeNi, wherein the Fe content is in the range of 7 to 15 atomic percent, the Ni content is in the range of 5 to 15 atomic percent, and the balance is Co.

In the present invention, preferably, all of the plurality of ferromagnetic sublayers are composed of the CoFeNi described above.

When the free magnetic layer is in a synthetic ferrimagnetic state, in which a plurality of ferromagnetic sublayers having different magnetic moments per unit area are deposited with a nonmagnetic intermediate sublayer being placed between the two adjacent ferromagnetic sublayers, and the magnetization directions of the two adjacent ferromagnetic sublayers are antiparallel, in order to maintain the antiparallel magnetization state appropriately, the exchange coupling magnetic fields due to the RKKY interactions between the ferromagnetic sublayers must be increased by improving the material quality for the free magnetic layer.

NiFe alloys are often used as magnetic materials for forming the ferromagnetic sublayers. Although the NiFe alloys have been used for free magnetic layers, etc. due to superior soft magnetic properties, when the free magnetic layer has a laminated ferrimagnetic structure, antiparallel coupling between the ferromagnetic sublayers is not substantially strong.

Therefore, in the present invention, a CoFeNi alloy is used for at least one of the ferromagnetic sublayers and preferably for all of the ferromagnetic sublayers in order to improve the material quality for the ferromagnetic sublayers and to strengthen antiparallel coupling between the ferromagnetic sublayers. By incorporating Co, the antiparallel coupling can be strengthened.

Consequently, the exchange coupling magnetic fields due to RKKY interactions generated between the ferromagnetic sublayers can be increased. Specifically, the strength of the magnetic field at which the antiparallel state is lost, i.e., the spin-flop magnetic field (Hsf), can be increased to approximately 293 kA/m.

If the compositional ranges described above are satisfied, the magnetostrictions of the ferromagnetic sublayers can be set in the range of $-3 \times 10^{-6}$ to $3 \times 10^{-6}$, and the coercive forces can be decreased to 790 A/m or less.

The present invention may be effectively applied to a magnetic sensing element of a current-perpendicular-to-plane (CPP) type, in which an upper electrode layer is electrically connected to the top of the multilayer film, a lower electrode layer is electrically connected to the bottom of the multilayer film, and a current is applied perpendicular to the planes of the individual layers of the multilayer film.

In the case of the CPP-type magnetic sensing element, the multilayer film preferably includes a metalloid ferromagnetic Heusler alloy layer. Consequently, the spin-up electron/spin-down electron ratio in the multilayer film can be controlled, and the rate of change in magnetoresistance can be improved.

When the metalloid ferromagnetic Heusler alloy layer is a part of the free magnetic layer, preferably, a NiFe layer having superior soft magnetic properties is in contact with the metalloid ferromagnetic Heusler alloy layer. Consequently, it is possible to improve the rate of change in magnetoresistance.

In the present invention, the first antiferromagnetic layer and the second antiferromagnetic layer can be composed of the same antiferromagnetic material.

In the present invention, preferably, the first antiferromagnetic layer and/or the second antiferromagnetic layer is composed of any one of a PtMn alloy; an X—Mn alloy, wherein X is at least one element selected from the group consisting of Pd, Ir, Rh, Ru, Os, Ni, and Fe; and a Pt—Mn—X' alloy, wherein X' is at least one element selected from the group consisting of Pd, Ir, Rh, Ru, Au, Ag, Os, Cr, Ni, Ar, Ne, Xe, and Kr.

In another aspect of the present invention, a method for fabricating a magnetic sensing element includes the steps of:

(a) depositing a second antiferromagnetic layer, a ferromagnetic layer, a nonmagnetic layer, a free magnetic layer, a nonmagnetic material layer, a pinned magnetic layer, an intermediate antiferromagnetic layer, and a nonmagnetic protective layer composed of a noble metal in that order from the bottom on a substrate;

(b) performing annealing in a first magnetic field to generate an exchange coupling magnetic field between the second antiferromagnetic layer and the ferromagnetic layer, thereby pinning the magnetization of the ferromagnetic layer in the track width direction;

(c) trimming the nonmagnetic protective layer partially or entirely;

(d) forming an upper antiferromagnetic layer on the nonmagnetic protective layer or the intermediate antiferromagnetic layer, thus producing a first antiferromagnetic layer including the intermediate antiferromagnetic layer and the upper antiferromagnetic layer; and (e) performing annealing in a second magnetic field to generate an exchange coupling magnetic field between the first antiferromagnetic layer and the pinned magnetic layer, thereby pinning the magnetization of the pinned magnetic layer in a direction substantially perpendicular to the magnetization direction of the-ferromagnetic layer.

In the present invention, in step (a), layers from the second antiferromagnetic layer to the nonmagnetic protective layer are continuously deposited on the substrate.

In the present invention, the nonmagnetic protective layer is composed a noble metal which is not easily oxidized. Consequently, the thickness of the nonmagnetic protective layer is not increased by oxidation, unlike a Ta film which has been conventionally used as a nonmagnetic protective layer.

Since a sufficient oxidation-inhibiting effect can be obtained even if the nonmagnetic protective layer is thin, the nonmagnetic protective layer can be removed by an ion milling process with low energy, and it is possible to appropriately protect the intermediate antiferromagnetic layer formed under the nonmagnetic protective layer from being damaged by the ion milling process.

Even if the noble metal element is diffused into the intermediate antiferromagnetic layer and the upper antiferromagnetic layer by annealing or the like, the properties of the antiferromagnetic layers are not degraded. In contrast with Ru or the like, in the Ta films which have been conventionally used, if the element is diffused into the antiferromagnetic layers, the properties (functions) of the antiferromagnetic layers are easily degraded.

In the present invention, preferably, the nonmagnetic protective layer is composed of at least one material selected from the group consisting of Ru, Re, Pd, Os, Ir, Pt, Au, and Rh.

In step (a), if the intermediate antiferromagnetic layer is formed with a thickness in the range of 10 to 50 Å or in the range of 30 to 40 Å, an exchange coupling magnetic field is not generated between the intermediate antiferromagnetic layer and the pinned magnetic layer by annealing in the first magnetic field in step (b), and it is possible to prevent the magnetizations of the pinned magnetic layer and the free magnetic layer from being directed in the same direction.

In the prevent invention, as described above, even if the nonmagnetic protective layer is thin, a sufficient oxidation-inhibiting effect can be obtained. Specifically, in step (a), the nonmagnetic protective layer may be formed with a thickness of 3 to 10 Å.

In step (c), preferably, the nonmagnetic protective layer is trimmed to such an extent that the nonmagnetic protective layer has a thickness of 3 Å or less or the nonmagnetic protective layer is entirely removed.

When the nonmagnetic protective layer is entirely removed in step (c), the first antiferromagnetic layer includes the intermediate antiferromagnetic layer and the upper antiferromagnetic layer only. However, if the nonmagnetic protective layer is entirely removed, the surface of the intermediate antiferromagnetic layer may be damaged by ion milling, resulting in a decrease in antiferromagnetism.

In the present invention, if the thickness of the nonmagnetic protective layer is decreased to a thickness of 3 Å or less, even if the nonmagnetic protective layer remains between the intermediate antiferromagnetic layer and the upper antiferromagnetic layer, the intermediate antiferromagnetic layer, the nonmagnetic protective layer, and the upper antiferromagnetic layer in combination can serve as the first antiferromagnetic layer.

DESCRIPTION OF THE PREFERRED EMBODIMENTS

Figure 1:
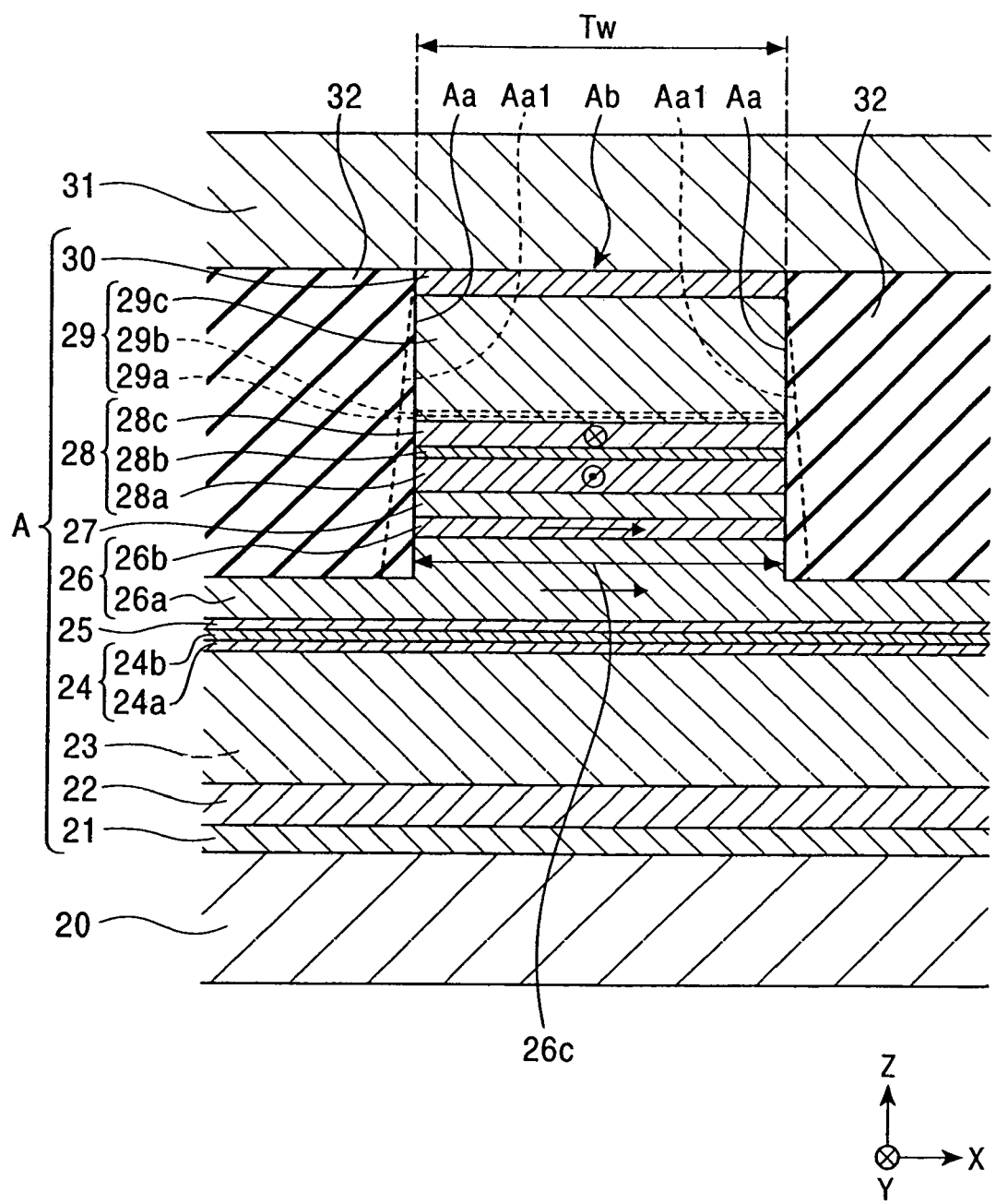
FIG. 1 is a sectional view of a magnetic sensing element in a first embodiment of the present invention.

FIG. 1 is a partial sectional view of a magnetic sensing element in a first embodiment of the present invention.

The magnetic sensing element shown in FIG. 1 is a GMR head which reads external signals recorded in a recording medium. The surface facing the recording medium is perpendicular to the planes of thin layers constituting the magnetic sensing element and is parallel to the magnetization direction of the free magnetic layer of the magnetic sensing element in the absence of an external magnetic field. In FIG. 1, the surface facing the recording medium corresponds to a plane parallel to the X-Z plane.

Additionally, when the magnetic sensing element is used for a floating-type magnetic head, the surface facing the recording medium corresponds to a so-called "ABS".

The magnetic sensing element is formed on the trailing end of a slider, for example, composed of alumina-titanium carbide ($Al_2O_3$—TiC). The slider is connected to an elastically deformable support composed of a stainless steel or the like at a surface opposite to the surface facing the recording medium, and thus a magnetic head device is produced.

The track width direction means a width direction of a region in which the magnetization direction is varied by an external magnetic field. For example, the track width direction corresponds to the magnetization direction of the free magnetic layer in the absence of an external magnetic field, i.e., the X direction in the drawing.

The recording medium faces the surface facing the recording medium of the magnetic sensing element, and travels in the Z direction in the drawing. The leakage magnetic field from the recording medium is directed in the Y direction in the drawing.

Referring to FIG. 1, a lower shielding layer 20 which also serves as a lower electrode layer is formed on the trailing end of the slider with an alumina layer (not shown in the drawing) therebetween. A multilayer film A is formed on the lower shielding layer 20, in which an underlayer 21; a seed layer 22; a second antiferromagnetic layer 23; a ferromagnetic layer 24 including a first ferromagnetic sublayer 24a and a second ferromagnetic sublayer 24b; a nonmagnetic layer 25; a free magnetic layer 26 including a first magnetic sublayer 26a and a second magnetic sublayer 26b; a nonmagnetic material layer 27; a synthetic ferri-pinned-type pinned magnetic layer 28 including a second pinned magnetic sublayer 28a, a nonmagnetic intermediate sublayer 28b, and a first pinned magnetic sublayer 28c; a first antiferromagnetic layer 29; and a protective layer 30 are deposited in that order from the bottom.

The multilayer film A has a width in the track width direction corresponding to the track width Tw from the protective layer 30 to a portion of the first magnetic sublayer 26a of the free magnetic layer 26. The width in the track width direction is larger than the track width Tw in the remaining portion of the first magnetic sublayer 26a, the ferromagnetic layer 24, the second antiferromagnetic layer 23, the seed layer 22, and the underlayer 21.

Insulating layers 32 are formed on both sides in the track width direction of the protective layer 30 to the middle of the first magnetic sublayer 26a, and an upper shielding layer 31 which also serves as an upper electrode layer is formed on the insulating layers 32 and the protective layer 30 of the multilayer film A.

The magnetic sensing element in the first embodiment of the present invention includes the lower shielding layer 20 to the upper shielding layer 31.

In the magnetic sensing element shown in FIG. 1, although the lower shielding layer 20 also serves as the lower electrode layer and the upper shielding layer 31 also serves as the upper electrode layer, a lower shielding layer and a lower electrode layer may be composed of different materials and an upper shielding layer and an upper electrode layer may be composed of different materials.

The magnetic sensing element shown in FIG. 1 is a so-called "top-type spin-valve magnetic sensing element".

The lower shielding layer 20, the underlayer 21, the seed layer 22, the second antiferromagnetic layer 23, the ferromagnetic layer 24, the nonmagnetic layer 25, the free magnetic layer 26, the nonmagnetic material layer 27, the pinned magnetic layer 28, the first antiferromagnetic layer 29, the protective layer 30, the insulating layers 32, and the upper shielding layer 31 are formed by thin-film formation processes, such as sputtering and vapor deposition processes.

Sputtering may be performed using a known sputtering system, such as magnetron sputtering system, RF diode sputtering system, RF triode sputtering system, ion beam sputtering system, or face target sputtering system. In the present invention, in addition to sputtering and vapor deposition processes, a molecular beam epitaxy (MBE) process, an ionized cluster beam (ICB) process, etc., may be used.

As shown in FIG. 1, in the multilayer film A including the underlayer 21 to the protective layer 30, the side faces Aa in the track width direction (X direction) of the protective layer 30 to a portion of the first magnetic sublayer 26a of the free magnetic layer 26 are continuous planes perpendicular to a surface Ab of the multilayer film A. However, the side faces in the track width direction of the protective layer 30 to a portion of the first magnetic sublayer 26a of the free magnetic layer 26 may be inclined planes Aa1 as indicated by dotted lines in FIG. 1.

In the magnetic sensing element shown in FIG. 1, the optical track width Tw is determined by the width in the track width direction of the nonmagnetic material layer 27. In this embodiment, the optical track width Tw can be set at 0.1 µm or less, and more particularly, 0.06 µm or less so as to cope with a recording density of 200 Gbit/in$^2$ or more.

The magnetic sensing element shown in FIG. 1 is a so-called "spin-valve magnetic sensing element". The magnetization direction of the pinned magnetic layer 28 is appropriately pinned in the Y direction and the magnetization direction of the free magnetic layer 26 is appropriately aligned in the X direction, and thus the magnetization directions of the pinned magnetic layer 28 and the free magnetic layer 26 are perpendicular to each other. When a leakage magnetic field from a recording medium enters the magnetic sensing element in the Y direction, the magnetization of the free magnetic layer 26 is varied with high sensitivity, and electrical resistance changes due to the relationship between the varying magnetization direction of the free magnetic layer 26 and the pinned magnetization direction of the pinned magnetic layer 28. The leakage magnetic field from the magnetic recording medium is detected by a voltage change based on the change in the electrical resistance.

The relative angle between the magnetization direction of the second pinned magnetic sublayer 28a and the magnetization direction the free magnetic layer 26 directly contributes to a change in electrical resistance (output), and preferably, the magnetization direction of the second pinned magnetic sublayer 28a and the magnetization direction the free magnetic layer 26 are perpendicular to each other when a sensing current is applied and a signal magnetic field is not applied.

Additionally, the recording medium facing the magnetic sensing element travels in the Z direction.

The protective layer 30 is composed of a conductive material, such as Ta, and has a thickness of 30 Å.

The lower shielding layer 20 and the upper shielding layer 31 are composed of a magnetic material, such as NiFe. Preferably, the easy magnetization axes of the lower shielding layer 20 and the upper shielding layer 31 are directed in the track width direction (X direction). The lower shielding layer 20 and the upper shielding layer 31 may be formed by electrolytic plating.

The underlayer 21 is preferably composed of at least one of Ta, Hf, Nb, Zr, Ti, Mo, and W. The underlayer is formed with a thickness of approximately 50 Å or less. The underlayer 21 may be omitted. In this embodiment, the underlayer 21 has a thickness of 30 Å.

The seed layer 22 is composed of NiFe, NiFeCr, Cr, or the like. In this embodiment, the seed layer 22 has a thickness of 50 Å.

Since the magnetic sensing element in this embodiment is a CPP type in which a sensing current flows perpendicular to the planes of the individual layers, the sensing current must also be transmitted through the seed layer properly. Therefore, preferably, the seed layer does not have high resistivity. That is, in the CPP-type magnetic sensing element, preferably, the seed layer is composed of a low-resistivity material, such as a NiFe alloy or Cr. The seed layer may be omitted.

Each of the second antiferromagnetic layer 23 and the first antiferromagnetic layer 29 is composed of any one of a PtMn alloy; an X—Mn alloy, wherein X is at least one element selected from the group consisting of Pd, Ir, Rh, Ru, Os, Ni, and Fe; and a Pt—Mn—X' alloy, wherein X' is at least one element selected from the group consisting of Pd, Ir, Rh, Ru, Au, Ag, Os, Cr, Ni, Ar, Ne, Xe, and Kr.

In this embodiment, the first antiferromagnetic layer 29 and the second antiferromagnetic layer 23 may be composed of the same antiferromagnetic material.

Although these alloys have a disordered face-centered cubic (fcc) structure as deposited, the structure is transformed into an ordered face-centered tetragonal (fct) structure of CuAuI type by annealing treatment.

The second antiferromagnetic layer 23 has a thickness in the range of 80 to 300 Å, for example, 150 Å.

In the PtMn alloy or the X—Mn alloy for forming the antiferromagnetic layers, the Pt content or the X content is preferably in the range of 37 to 63 atomic percent, and more preferably in the range of 47 to 57 atomic percent.

In the Pt—Mn—X'— alloy, the X'+Pt content is preferably in the range of 37 to 63 atomic percent, and more preferably in the range of 47 to 57 atomic percent. Furthermore, in the Pt—Mn—X' alloy, the X' content is preferably in the range of 0.2 to 10 atomic percent. However, when X' is at least one element selected from the group consisting of Pd, Ir, Rh, Ru, Os, Ni, and Fe, the X' content is preferably in the range of 0.2 to 40 atomic percent.

By using the alloys described above, followed by annealing, antiferromagnetic layers generating large exchange coupling magnetic fields can be obtained. In particular, if a PtMn alloy is used, it is possible to obtain the second antiferromagnetic layer 23 and the first antiferromagnetic layer 29 with an exchange coupling magnetic field of 48 kA/m or more, for example, exceeding 64 kA/m, and with a blocking temperature, i.e., a temperature at which the exchange coupling magnetic field is lost, of 380° C. which is remarkably high.

When the magnetic sensing element shown in FIG. 1 is fabricated by a method for fabricating the magnetic sensing element in this embodiment which will be described below, the first antiferromagnetic layer 29 has a multilayer structure including an intermediate antiferromagnetic layer 29a with a thickness of 10 to 50 Å, a nonmagnetic protective layer 29b composed of a noble metal with a thickness of 1 to 3 Å, and an upper antiferromagnetic layer 29c.

The intermediate antiferromagnetic layer 29a and the upper antiferromagnetic layer 29c are composed of the same antiferromagnetic material, and specifically, the PtMn alloy, X—Mn alloy, or Pt—Mn—X' alloy described above.

The total thickness of the intermediate antiferromagnetic layer 29a and the upper antiferromagnetic layer 29c is in the range of 80 to 500 Å, and, for example, 150 Å. The intermediate antiferromagnetic layer 29a does not exhibit antiferromagnetism alone because its thickness is small in the range of 10 to 50 Å. The intermediate antiferromagnetic layer 29a exhibits antiferromagnetism in combination with the upper antiferromagnetic layer 29c, and an exchange coupling magnetic field is thereby generated between the first antiferromagnetic layer 29 and the pinned magnetic layer 28.

The nonmagnetic protective layer 29b, which has a thickness of 1 to 3 Å and is composed of at least one of Ru, Re, Pd, Os, Ir, Pt, Au, and Rh, causes an antiferromagnetic interaction between the intermediate antiferromagnetic layer 29a and the upper antiferromagnetic layer 29c. Thus, the intermediate antiferromagnetic layer 29a and the upper antiferromagnetic layer 29c are allowed to function as a combined antiferromagnetic layer. Even if the material for the nonmagnetic protective layer 29b is diffused into the intermediate antiferromagnetic layer 29a and the upper antiferromagnetic layer 29c, the antiferromagnetism is not degraded.

The first antiferromagnetic layer 29 may be composed of the intermediate antiferromagnetic layer 29a and the upper antiferromagnetic layer 29c without the nonmagnetic protective layer 29b.

Each of the first pinned magnetic sublayer 28c and the second pinned magnetic sublayer 28a is composed of a ferromagnetic material, such as a NiFe alloy, Co, a CoFeNi alloy, a CoFe alloy, or a CoNi alloy, and preferably, is composed of a CoFe alloy or Co. The first pinned magnetic sublayer 28c and the second pinned magnetic sublayer 28a are preferably composed of the same material.

The nonmagnetic intermediate sublayer 28b is composed of at least one of Ru, Rh, Ir, Cr, Re, and Cu, and in particular, is preferably composed of Ru.

Each of the first pinned magnetic sublayer 28c and the second pinned magnetic sublayer 28a has a thickness of approximately 10 to 70 Å. For example, the first pinned magnetic sublayer 28c has a thickness of 30 Å and the second pinned magnetic sublayer 28a has a thickness of 40 Å. The nonmagnetic intermediate sublayer has a thickness of approximately 3 to 10 Å, and for example, 8 Å.

A laminate in which the first pinned magnetic sublayer 28c and the second pinned magnetic sublayer 28a having different magnetic moments (Ms×t; product of saturation magnetization and layer thickness) per unit area are disposed with the nonmagnetic intermediate sublayer 28b therebetween functions as a pinned magnetic layer.

The first pinned magnetic sublayer 28c is in contact with the first antiferromagnetic layer 29. An exchange anisotropic magnetic field due to exchange coupling (exchange coupling magnetic field) is generated at the interface between the first pinned magnetic sublayer 28c and the first antiferromagnetic layer 29, and the magnetization direction of the first pinned magnetic sublayer 28c is pinned in the Y direction. If the magnetization direction of the first pinned magnetic sublayer 28c is pinned in the Y direction, the magnetization direction of the second pinned magnetic sublayer 28a which is opposed to the first pinned magnetic sublayer 28c with the nonmagnetic intermediate sublayer 28b therebetween is pinned antiparallel to the magnetization of the first pinned magnetic layer 28c.

If the first pinned magnetic sublayer 28c and the second pinned magnetic sublayer 28a form a ferrimagnetic state in which the magnetization directions are antiparallel, since the first magnetic pinned sublayer 28c and the second pinned magnetic sublayer 28a pin each other's magnetization directions, it is possible to strongly pin the magnetization direction of the entire pinned magnetic layer in a predetermined direction.

The magnetization direction of the pinned magnetic layer corresponds to the direction of the resultant magnetic moment (Ms×t) per unit area determined by the sum of the magnetic moment (Ms×t) per unit area of the first pinned magnetic sublayer 28c and the magnetic moment (Ms×t) per unit area of the second pinned magnetic sublayer 28a.

In the magnetic sensing element shown in FIG. 1, the first pinned magnetic sublayer 28c and the second pinned magnetic sublayer 28a are composed of the same material and are formed with different thicknesses so as to have different magnetic moments (Ms×t) per unit area.

The demagnetizing field (dipole magnetic field) due to the pinned magnetizations of the first pinned magnetic sublayer 28c and the second pinned magnetic sublayer 28a can be cancelled because the magnetostatic coupling magnetic fields of the first pinned magnetic sublayer 28c and the second pinned magnetic sublayer 28a counteract each other. As a result, the contribution of the demagnetizing field (dipole magnetic field) by the pinned magnetization of the pinned magnetic layer 28 to the variable magnetization of the free magnetic layer 26 can be reduced.

Consequently, the variable magnetization of the free magnetic layer 26 is more easily corrected in a desired direction, and it is possible to obtain a spin-valve magnetic sensing element which exhibits superior symmetry with a small degree of asymmetry.

Herein, asymmetry is defined as the degree of asymmetry of a regenerated output waveform, and if the waveform is symmetrical, the asymmetry is decreased. Therefore, as the asymmetry is brought closer to zero, the regenerated output waveform has a more superior symmetry.

The asymmetry is zero when the magnetization direction of the free magnetic layer 26 and the direction of the pinned magnetization of the pinned magnetic layer 28 are perpendicular to each other. When the asymmetry is greatly increased, it is not possible to read the data accurately from the media, resulting in an error. Therefore, as the asymmetry is decreased, the reliability of processing of regenerated signals is improved, resulting in a superior spin-valve magnetic sensing element.

The demagnetizing field (dipole magnetic field) Hd due to the pinned magnetization of the pinned magnetic layer 28 has a nonuniform distribution in which the values are large at the ends and small in the center in the element height direction, and in some cases, the free magnetic layer 26 may be prevented from being aligned in a single-domain state. However, by using the pinned magnetic layer 28 having the laminated structure as described above, the dipole magnetic field Hd can be decreased, and thus nonuniform distribution of the magnetization is prevented from occurring due to the formation of domain walls in the free magnetic layer, and thus it is possible to prevent Barkhausen noise, etc. from occurring.

Additionally, the pinned magnetic layer 28 may have a single-layer structure using any one of the magnetic materials described above, or may have a two-layer structure including a layer composed of any one of the magnetic materials described above and a diffusion-preventing layer, such as a Co layer.

The nonmagnetic material layer 27 prevents magnetic coupling between the pinned magnetic layer 28 and the free magnetic layer 26, and is preferably composed of a conductive nonmagnetic material, such as Cu, Cr, Au, or Ag, and more preferably, Cu. The nonmagnetic material layer 27 has a thickness, for example, in the range of approximately 18 to 30 Å. In this embodiment, the nonmagnetic material layer 27 has a thickness of 30 Å.

The nonmagnetic material layer 27 may be composed of an insulating material, such as $Al_2O_3$ or $SiO_2$. However, in a CPP-type magnetic sensing element, such as the one in this embodiment, since a sensing current must be also transmitted perpendicular to the plane of the nonmagnetic material layer 27, when the nonmagnetic material layer 27 is composed of an insulating material, the thickness of the nonmagnetic material layer 27 must be decreased to 50 Å or less so that the withstand voltage is decreased. If a nonmagnetic material layer 27 is composed of a film partially containing an insulating material, such as $Al_2O_3$, $TaO_2$, or a $Cu-Al_2O_3$ composite film, the nonmagnetic material layer may be also used as a current-limiting layer.

In the magnetic sensing element shown in FIG. 1, the free magnetic layer 26 has a two-layer structure including the first magnetic sublayer 26a and the second magnetic sublayer 26b.

The first magnetic sublayer 26a in contact with the nonmagnetic layer 25 is composed of NiFe (Permalloy) or NiFeX, wherein X is at least one element selected from the group consisting of Al, Si, Ti, V, Cr, Mn, Cu, Zr, Nb, Mo, Ru, Rh, Hf, Ta, W, Ir, and Pt. The second magnetic sublayer 26b in contact with the nonmagnetic material layer 27 is composed of a ferromagnetic material containing cobalt (Co), such as Co, CoFe, or CoFeNi. In this embodiment, the first magnetic sublayer 26a has a thickness of 100 Å, and the second magnetic sublayer 26b has a thickness of 20 Å. As the Co-containing ferromagnetic material, preferably, CoFe or CoFeCr is selected.

By forming the second magnetic sublayer 26b of the free magnetic layer 26 using the Co-containing ferromagnetic material, it is possible to prevent the material (Ni, etc.) of the free magnetic layer 26 from diffusing into the nonmagnetic material layer 27, thus preventing a decrease in the rate of change in magnetoresistance.

The interface between the first magnetic sublayer 26a and the second magnetic sublayer 26b may not be clearly defined, unlike the state shown in FIG. 1, for example, in the case when thermal diffusion occurs between the first magnetic sublayer 26a and the second magnetic sublayer 26b. In such a case, the interface becomes indefinite. When the interface between the first magnetic sublayer 26a and the second magnetic sublayer 26b is not clearly defined, the free magnetic layer 26 may include at least a magnetic region composed of NiFe or NiFeX on the side in contact with the nonmagnetic layer 25 and a magnetic region composed of the Co-containing ferromagnetic material on the side in contact with the nonmagnetic material layer 27.

In this embodiment, the ferromagnetic layer 24 and the second antiferromagnetic layer 23 are disposed, with the nonmagnetic layer 25 therebetween, below a region 26c corresponding to the track width of the free magnetic layer 26.

The nonmagnetic layer 25 is composed of at least one of Ru, Rh, Ir, Cr, Re, and Cu. In this embodiment, the nonmagnetic layer 25 has a thickness of 8 Å.

The ferromagnetic layer 24 has a two-layer structure including the first ferromagnetic sublayer 24a and the second ferromagnetic sublayer 24b. In this embodiment, for example, the first ferromagnetic sublayer 24a has a thickness of 8 Å and the second ferromagnetic sublayer 24b has a thickness of 6 Å.

In the magnetic sensing element shown in FIG. 1, the second ferromagnetic sublayer 24b in contact with the nonmagnetic layer 25 is composed of NiFe (Permalloy) or NiFeX, wherein X is at least one element selected from the group consisting of Al, Si, Ti, V, Cr, Mn, Cu, Zr, Nb, Mo, Ru, Rh, Hf, Ta, W, Ir, and Pt.

The first ferromagnetic sublayer 24a in contact with the second antiferromagnetic layer 23 is composed of a ferromagnetic material containing cobalt (Co), such as Co and CoFe. By forming the first ferromagnetic sublayer 24a using the Co-containing ferromagnetic material, the exchange coupling magnetic field between the second antiferromagnetic layer 23 and the ferromagnetic layer 24 can be increased. As the Co-containing ferromagnetic material, preferably, CoFe or CoFeCr is selected.

Additionally, as in the case of the free magnetic layer 26, the ferromagnetic layer 24 may include at least a magnetic region composed of NiFe or NiFeX on the side in contact with the nonmagnetic layer 25 and a magnetic region composed of the Co-containing ferromagnetic material on the side in contact with the second antiferromagnetic layer 23.

Alternatively, the ferromagnetic layer 24 may have a single-layer structure composed of NiFe (Permalloy) with a thickness greater than 0 nm and less than or equal to 3 nm.

The ferromagnetic layer 24 may have a single-layer structure composed of CoFeCr or CoFe.

In either one of the single-layer structures described above, satisfactory read characteristics can be obtained according to the experimental results which will be described below.

In the magnetic sensing element shown in FIG. 1, the magnetization direction of the ferromagnetic layer 24 is directed substantially perpendicular to the magnetization direction of the pinned magnetic layer 28 by the exchange coupling magnetic field with the second antiferromagnetic layer 23.

Since the free magnetic layer 26 composed of a ferromagnetic material is deposited on the ferromagnetic layer 24 with the nonmagnetic layer 25 therebetween, the free magnetic layer 26 is aligned in a single domain state by the interlayer coupling magnetic field between the free magnetic layer 26 and the ferromagnetic layer 24 with the nonmagnetic layer 25 therebetween, i.e., the RKKY interaction in this case, and the magnetization of the free magnetic layer 26 is directed substantially perpendicular to the magnetization direction of the pinned magnetic layer 28.

Since the free magnetic layer 26 is aligned in a single domain state and the magnetization direction of the free magnetic layer 26 is controlled by the interlayer coupling magnetic field with the ferromagnetic layer 24 with the nonmagnetic layer 25 therebetween as described above, the longitudinal bias magnetic field applied to the free magnetic layer 26 can be prevented from being disturbed and the magnetic domain structure of the free magnetic layer 26 can be prevented from being disturbed by an external magnetic field, such as a leakage magnetic field from a recording medium.

The ferromagnetic layer 24 may include a plurality of ferromagnetic sublayers having different magnetic moments per unit area, a nonmagnetic intermediate sublayer being placed between the two adjacent ferromagnetic sublayers, the magnetization directions of the two adjacent ferromagnetic sublayers being antiparallel, and thus the ferromagnetic layer 24 is in a ferrimagnetic state. Consequently, the magnetization direction of the ferromagnetic layer 24 can be strongly pinned in one direction.

When the nonmagnetic layer 25 is composed of Ru and a synthetic ferrimagnetic state is formed in which the magnetization directions of the free magnetic layer 26 and the ferromagnetic layer 24 are antiparallel, the thickness of the Ru layer is preferably in the range of 8 to 11 Å or in the range of 15 to 21 Å.

In the present invention, the magnetization direction of the ferromagnetic layer 24 is strongly pinned in a direction substantially perpendicular to the magnetization direction of the pinned magnetic layer 28 by increasing the exchange coupling magnetic field between the second antiferromagnetic layer 23 and the ferromagnetic layer 24, and then the free magnetic layer 26 is aligned in a single domain state and the magnetization of the free magnetic layer 26 is reliably directed in a direction substantially perpendicular to the magnetization direction of the pinned magnetic layer 28 by setting the magnitude of the interlayer coupling magnetic field between the free magnetic layer 26 and the ferromagnetic layer 24 smaller than the magnitude of the exchange coupling magnetic field, and also the magnetization direction of the free magnetic layer 26 must be varied by the leakage magnetic field.

In order to increase the exchange coupling magnetic field between the second antiferromagnetic layer 23 and the ferromagnetic layer 24 and to set the magnitude of the interlayer coupling magnetic field between the free magnetic layer 26 and the ferromagnetic layer 24 smaller than the magnitude of the exchange coupling magnetic field, in this embodiment, the magnitude of the magnetic moment (Ms×t; product of saturation magnetization and layer thickness) per unit area of the ferromagnetic layer 24 is smaller than the magnitude of the magnetic moment (Ms×t; product of saturation magnetization and layer thickness) per unit area of the free magnetic layer 26.

The magnetic moment (Ms×t; product of saturation magnetization and layer thickness) per unit area of the ferromagnetic layer 24 is the sum of the magnetic moment (Ms×t) per unit area of the first ferromagnetic sublayer 24a and the magnetic moment (Ms×t) per unit area of the second ferromagnetic sublayer 24b. The magnetic moment (Ms×t; product of saturation magnetization and layer thickness) per unit area of the free magnetic layer 26 is the sum of the magnetic moment (Ms×t) per unit area of the first magnetic sublayer 26a and the magnetic moment (Ms×t) per unit area of the second magnetic sublayer 26b.

Specifically, the ratio of the magnitude of the magnetic moment (Ms×t) per unit area of the free magnetic layer 26 to the magnitude of the magnetic moment (Ms×t) per unit area of the ferromagnetic layer 24 is in the range of 3 to 20.

In the ferromagnetic layer 24, by forming the second ferromagnetic sublayer 24b in contact with the nonmagnetic layer 25 using NiFe (Permalloy) or NiFeX, wherein X is at least one element selected from the group consisting of Al, Si, Ti, V, Cr, Mn, Cu, Zr, Nb, Mo, Ru, Rh, Hf, Ta, W, Ir, and Pt, the magnitude of the interlayer coupling magnetic field between the free magnetic layer 26 and the ferromagnetic layer 24 is appropriately decreased.

In the free magnetic layer 26, by forming the first magnetic sublayer 26a in contact with the nonmagnetic layer 25 using NiFe (Permalloy) or NiFeX, wherein X is at least one element selected from the group consisting of Al, Si, Ti, V, Cr, Mn, Cu, Zr, Nb, Mo, Ru, Rh, Hf, Ta, W, Ir, and Pt, the magnitude of the interlayer coupling magnetic field between the free magnetic layer 26 and the ferromagnetic layer 24 is appropriately decreased.

In the magnetic sensing element shown in FIG. 1, the alignment in a single domain state and control of the magnetization direction of the free magnetic layer are adjusted in two stages, i.e., by the magnitude of the exchange coupling magnetic field between the second antiferromagnetic layer 23 and the ferromagnetic layer 24 and by the magnitude of the interlayer coupling magnetic field between the ferromagnetic layer 24 and the free magnetic layer 26, thus facilitating fine controls.

Therefore, since the alignment in a single domain state and control of the magnetization direction of the free magnetic layer can be performed appropriately and easily, the magnetic sensing element can be made suitable for further track narrowing.

In the structure in which the ferromagnetic layer 24 and the second antiferromagnetic layer 23 are disposed below the region corresponding to the track width of the free magnetic layer 26 with the nonmagnetic layer 25 therebetween, the magnetization of the free magnetic layer 26 can also be reliably directed in a direction substantially perpendicular to the magnetization direction of the pinned magnetic layer 28 and the magnetization direction of the free magnetic layer 26 can be varied by the leakage magnetic field.

Therefore, in the magnetic sensing element shown in FIG. 1, in the region 26c corresponding to the track width of the free magnetic layer 26, the magnetization direction of the central part and the magnetization direction of both ends do not substantially differ from each other.

In the magnetic sensing element shown in FIG. 1, both sides of the multilayer film A from the protective layer 30 to the middle of the first magnetic sublayer 26a are trimmed so as to have a width in the track width direction corresponding to the track width Tw, and the widths in the track width direction of the rest of the first magnetic sublayer 26a, the ferromagnetic layer 24, the second antiferromagnetic layer 23, the seed layer 22, and the underlayer 21 are larger than the track width Tw.

Figure 2:
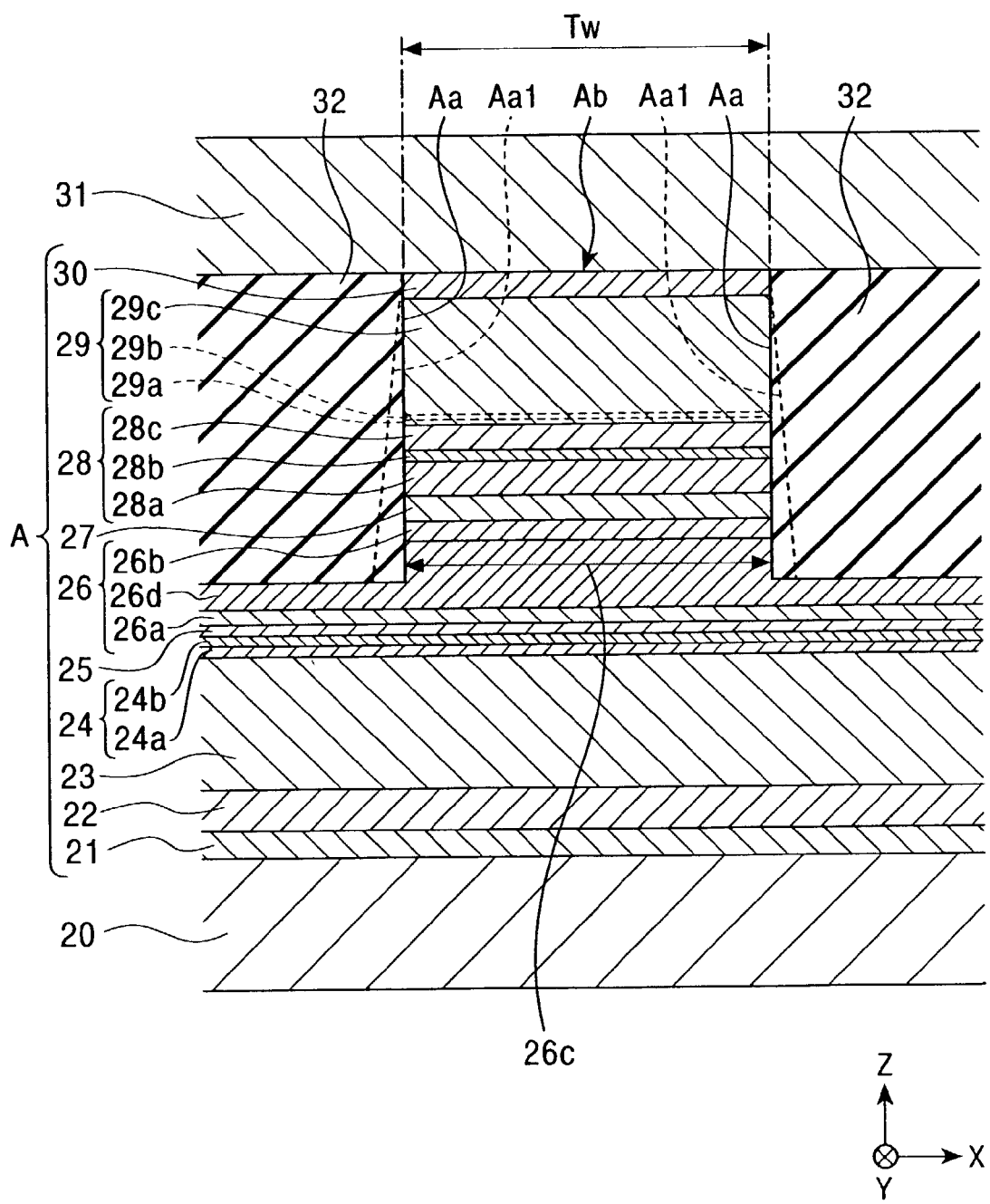
FIG. 2 is a sectional view of a magnetic sensing element in a second embodiment of the present invention.
Figure 3:
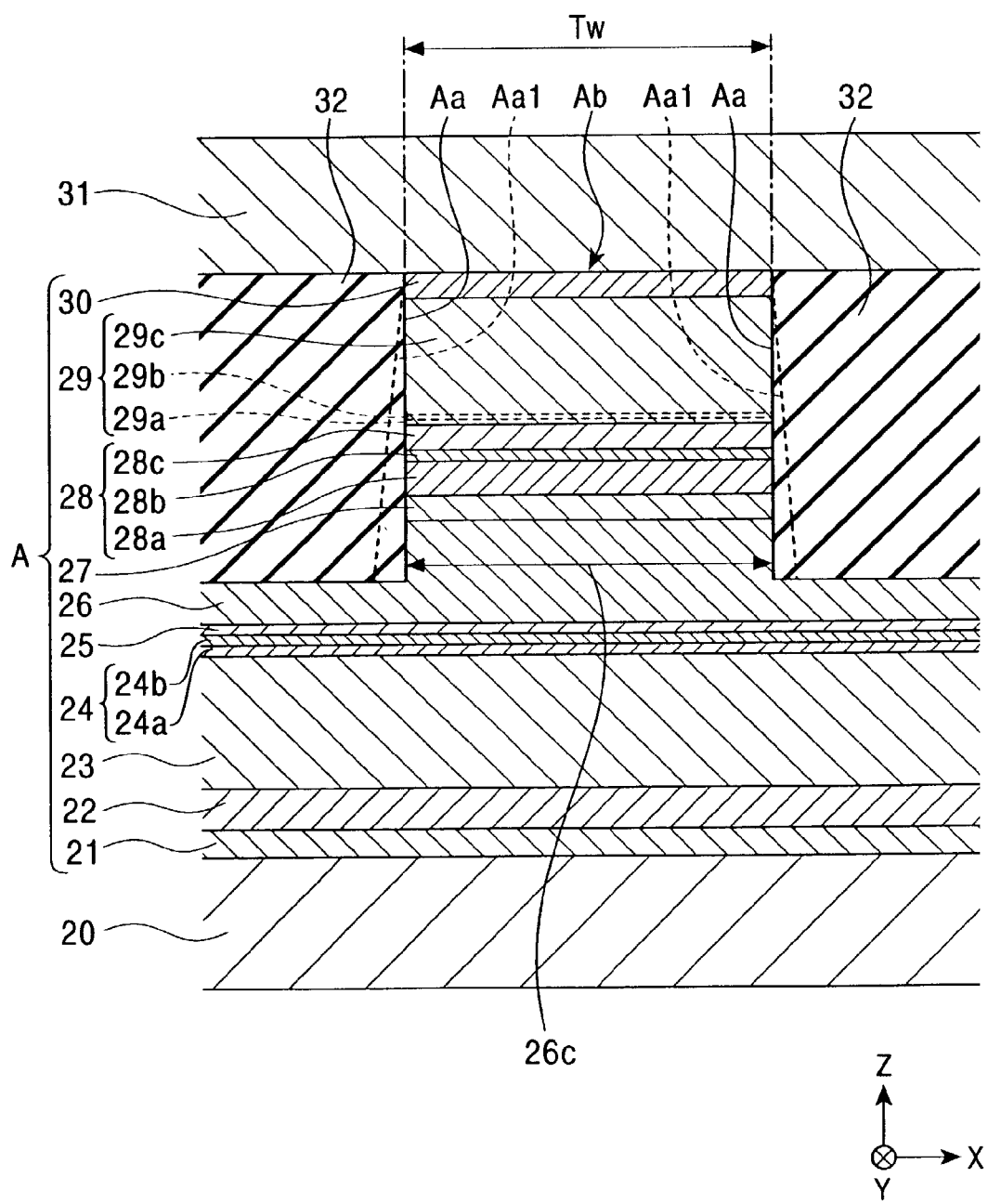
FIG. 3 is a sectional view of a magnetic sensing element in a third embodiment of the present invention.

FIG. 2 is a partial sectional view of a magnetic sensing element in a second embodiment of the present invention, viewed from the surface facing a recording medium, and FIG. 3 is a partial sectional view of a magnetic sensing element in a third embodiment of the present invention, viewed from the surface facing a recording medium.

The second embodiment shown in FIG. 2 differs from the first embodiment shown in FIG. 1 in that a free magnetic layer 26 has a three-layer structure including a first magnetic sublayer 26a, a second magnetic sublayer 26b, and an intermediate magnetic sublayer 26d. Except for the free magnetic layer 26, the magnetic sensing element shown in FIG. 2 has the same construction as that of the magnetic sensing element shown in FIG. 1.

The first magnetic sublayer 26a in contact with the nonmagnetic layer 25 is composed of NiFe or NiFeX, wherein X is at least one element selected from the group consisting of Al, Si, Ti, V, Cr, Mn, Cu, Zr, Nb, Mo, Ru, Rh, Hf, Ta, W, Ir, and Pt, as described with reference to FIG. 1. Alternatively, the free magnetic layer 26 includes a magnetic region composed of NiFe or NiFeX on the side in contact with the nonmagnetic layer 25.

The second magnetic sublayer 26b in contact with the nonmagnetic material layer 27 is composed of a magnetic material containing Co. Alternatively, the free magnetic layer 26 includes a magnetic region composed of a magnetic material containing Co on the side in contact with the nonmagnetic material layer 27. Examples of magnetic materials containing Co include CoFe, CoFeNi, and CoFeCr.

In the second embodiment, the intermediate magnetic sublayer 26d is provided, for example, in order to adjust the magnetic moment (Ms×t) per unit area of the free magnetic layer 26, and the material for the intermediate magnetic sublayer 26d is determined in consideration of the magnetic moment.

The intermediate magnetic sublayer 26d is composed of NiFe, NiFeX, or a magnetic material containing Co. For example, the first magnetic sublayer 26a is composed of $Ni_{85at\%}Fe_{10at\%}Nb_{5at\%}$, the intermediate magnetic sublayer 26d is composed of $Ni_{80at\%}Fe_{20at\%}$, and the second magnetic sublayer 26b is composed of $Co_{90at\%}Fe_{10at\%}$.

In some cases, the interface between the first magnetic sublayer 26a and the intermediate magnetic sublayer 26d and the interface between the intermediate magnetic sublayer 26d and the second magnetic sublayer 26b are not clearly defined due to thermal diffusion, etc. In the specific example described above, if a magnetic region composed of NiFeNb is present in the free magnetic layer 26 on the side in contact with the nonmagnetic material layer 25, a magnetic region composed of CoFe is present on the side in contact with the nonmagnetic material layer 27, and a magnetic region composed of NiFe is present therebetween, it is assumed that the free magnetic layer 26 originally has a three-layer structure.

Additionally, the free magnetic layer 26 may have a structure including more than 3 sublayers.

In the magnetic sensing element shown in FIG. 3, a free magnetic layer 26 has a single-layer structure composed of a ferromagnetic material. The free magnetic layer 26 is preferably composed of NiFe or NiFeX, wherein X is at least one element selected from the group consisting of Al, Si, Ti, V, Cr, Mn, Cu, Zr, Nb, Mo, Ru, Rh, Hf, Ta, W, Ir, and Pt. According to the experimental results which will be described below, when the free magnetic layer 26 has a single-layer structure composed of CoFe, read sensitivity η is decreased, hysteresis is degraded, and read characteristics are degraded compared to the case in which the free magnetic layer 26 is composed of NiFe or NiFeX.

In the embodiment shown in FIG. 3, the ferromagnetic layer 24 also has a single-layer structure. The ferromagnetic layer 24 may be composed of NiFe; NiFeX, wherein X is at least one element selected from the group consisting of Al, Si, Ti, V, Cr, Mn, Cu, Zr, Nb, Mo, Ru, Rh, Hf, Ta, W, Ir, and Pt; CoFe; CoFeCr; or the like. In order to increase the exchange coupling magnetic field with the second antiferromagnetic layer 23, the ferromagnetic layer 24 with the single structure is preferably composed of a Co-containing ferromagnetic material.

Additionally, one of the ferromagnetic layer 24 and the free magnetic layer 26 may have a single-layer structure and the other has a multilayer structure composed of ferromagnetic materials.

In the magnetic sensing element shown in FIG. 2 or 3, the ratio of the magnitude of the magnetic moment per unit area of the free magnetic layer 26 to the magnitude of the magnetic moment per unit area of the ferromagnetic layer 24 is the same as that of the magnetic sensing element shown in FIG. 1 described above.

In a multilayer film of a magnetic sensing element of the present invention, both sides from the top of the multilayer film to the middle of the first magnetic sublayer 26a of the free magnetic layer 26 shown in FIG. 1 are not necessarily trimmed.

Figure 4:
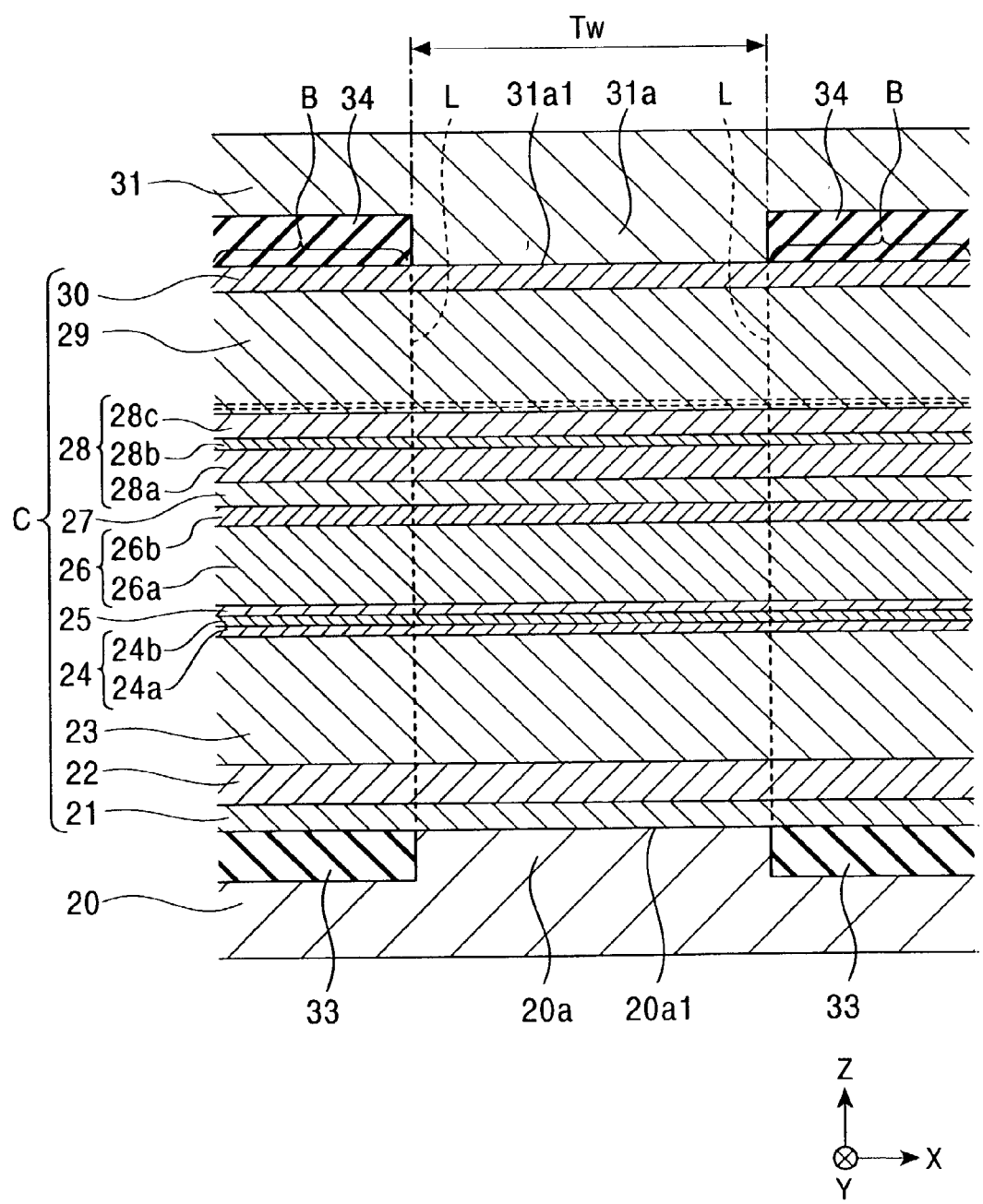
FIG. 4 is a sectional view of a magnetic sensing element in a fourth embodiment of the present invention.

FIG. 4 is a partial sectional view of a magnetic sensing element in a fourth embodiment of the present invention, viewed from the surface facing a recording medium. The magnetic sensing element shown in FIG. 4 includes a multilayer film C which has the same layered structure as that of the multilayer film A shown in FIG. 1 and in which side regions B sandwiching the region corresponding to the track width are not trimmed.

In the magnetic sensing element sown in FIG. 4, a lower shielding layer 20 and an upper shielding layer 31 are provided with a protruding section 20a and a protruding section 31a, respectively, which are connected to the multilayer film C. The track width Tw is determined by either one of the width in the track width direction of a junction 20a1 of the protruding section 20a and the width in the track width direction of a junction 30a1 of the protruding section 31a that is smaller. Insulating layers 33 and insulating layers 34 composed of alumina or the like are formed on both sides of the protruding section 20a and the protruding section 31a, respectively.

In the magnetic sensing element shown in FIG. 4, since the widths in the track width direction of the pinned magnetic layer 28 and the free magnetic layer 26 are larger than the track width Tw, the rate of so-called "side reading", in which an external magnetic field is also detected by the side regions B, is increased, and the magnetic track width tends to be extended.

Therefore, in the multilayer film C, preferably, the side regions B of at least the protective layer 30, the first antiferromagnetic layer 29, the pinned magnetic layer 28, and the nonmagnetic material layer 27 are trimmed so as to have the side faces indicated by the dotted lines L.

However, if the side regions B are completely trimmed down to the ferromagnetic layer 24 and the second antiferromagnetic layer 23, it becomes difficult to reliably align the free magnetic layer 26 in a single domain state and to direct the magnetization of the free magnetic layer 26 in a direction substantially perpendicular to the magnetization direction of the pinned magnetic layer 28. If the side regions B are completely trimmed down to the free magnetic layer 26, the demagnetizing field in the track width direction of the free magnetic layer 26 is increased, and it becomes difficult to control the magnetic domain of the free magnetic layer.

Therefore, as shown in FIG. 1, the structure in which both side regions are trimmed down to a portion of the free magnetic layer 26 is preferred.

As is the case of the magnetic sensing element shown in FIG. 1, if the magnetic sensing element is a current-perpendicular-to-plane (CPP) type, in which a current is applied perpendicular to the planes of the individual layers of the multilayer film A, and is a top type, in which the nonmagnetic material layer 27, the pinned magnetic layer 28, and the first antiferromagnetic layer 29 are placed above the free magnetic layer 26, it is easy to form the free magnetic layer 26 so that a portion of the free magnetic layer 26 has a width in the track width direction that is equal to the track width Tw and the remaining portion has a width in the track width direction that is larger than the track width.

If a portion of the free magnetic layer 26 has a width in the track width direction that is larger than the track width Tw, the demagnetizing field generated in the free magnetic layer 26 due to surface magnetic charges occurring at both side faces of the free magnetic layer can be decreased, and the fluctuation in the magnetization direction in the free magnetic layer 26 can be reduced.

Figure 5:
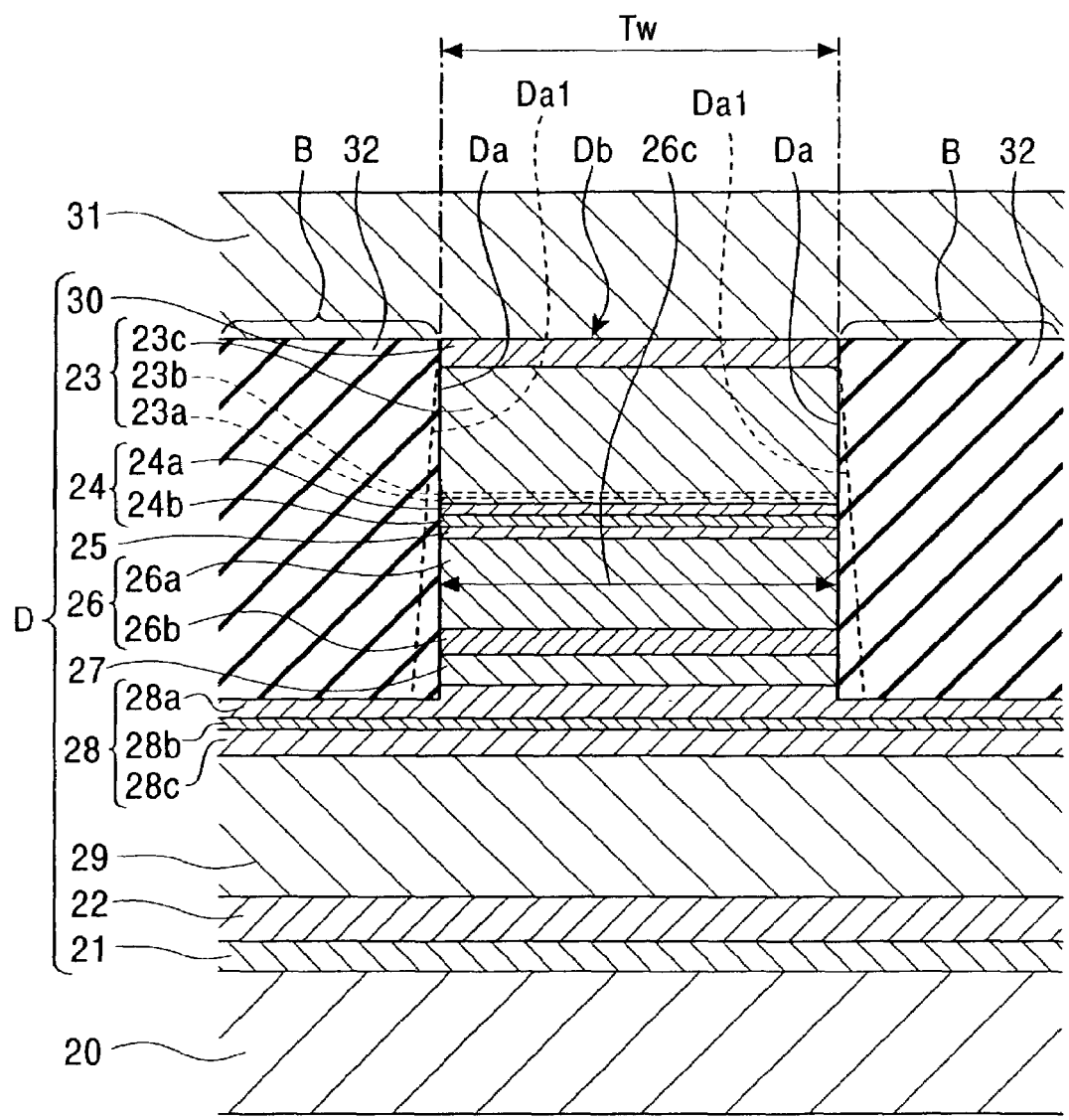
FIG. 5 is a sectional view of a magnetic sensing element in a fifth embodiment of the present invention.

FIG. 5 is a partial sectional view of a magnetic sensing element in a fifth embodiment of the present invention, viewed from the surface facing a recording medium.

The magnetic sensing element shown in FIG. 5 differs from the magnetic sensing element shown in FIG. 1 in that, instead of the multilayer film A shown in FIG. 1, a multilayer film D is formed, in which an underlayer 21; a seed layer 22; a first antiferromagnetic layer 29; a synthetic-ferri-pinned type pinned magnetic layer 28 including a first pinned magnetic sublayer 28c, a nonmagnetic intermediate sublayer 28b, and a second pinned magnetic sublayer 28a; a non-magnetic material layer 27; a free magnetic layer 26 including a second magnetic sublayer 26b and a first magnetic sublayer 26a; a nonmagnetic layer 25; a ferromagnetic layer 24 including a second ferromagnetic sublayer 24b and a first ferromagnetic sublayer 24a; a second antiferromagnetic layer 23, and a protective layer 30 are deposited in that order from the bottom. The magnetic sensing element shown in FIG. 5 is a so-called "bottom-type spin-valve magnetic sensing element".

In FIG. 5, the layers represented by the same reference numerals as those in FIG. 1 are composed of the same materials with the same thicknesses as those of the layers shown in FIG. 1.

However, in the magnetic sensing element shown in FIG. 5, the second antiferromagnetic layer 23 may have a multilayer structure including an intermediate antiferromagnetic layer 23a with a thickness of 10 to 50 Å, a nonmagnetic protective layer 23b composed of a noble metal with a thickness of 1 to 3 Å, and an upper antiferromagnetic layer 23c.

The intermediate antiferromagnetic layer 23a and the upper antiferromagnetic layer 23c are composed of the same antiferromagnetic material, and specifically, composed of the PtMn alloy, X—Mn alloy, or Pt—Mn—X' alloy.

The total thickness of the intermediate antiferromagnetic layer 23a and the upper antiferromagnetic layer 23c is in the range of 80 to 300 Å, and, for example, 150 Å. The intermediate antiferromagnetic layer 23a does not exhibit antiferromagnetism alone because its thickness is small in the range of 10 to 50 Å. The intermediate antiferromagnetic layer 23a exhibits antiferromagnetism in combination with the upper antiferromagnetic layer 23c, and an exchange coupling magnetic field is thereby generated between the intermediate antiferromagnetic layer 23a and the ferromagnetic layer 24.

The nonmagnetic protective layer 23b, which is thin with a thickness of 1 to 3 Å and is composed of at least one of Ru, Re, Pd, Os, Ir, Pt, Au, and Rh, causes an antiferromagnetic interaction between the intermediate antiferromagnetic layer 23a and the upper antiferromagnetic layer 23c. Thus, the intermediate antiferromagnetic layer 23a and the upper antiferromagnetic layer 23c are allowed to function as a combined antiferromagnetic layer. Even if the material for the nonmagnetic protective layer 23b is diffused into the intermediate antiferromagnetic layer 23a and the upper antiferromagnetic layer 23c, the antiferromagnetism is not degraded.

The second antiferromagnetic layer 23 may be composed of the intermediate antiferromagnetic layer 23a and the upper antiferromagnetic layer 23c without the nonmagnetic protective layer 23b. Alternatively, the second antiferromagnetic layer 23 may be a single antiferromagnetic layer.

In the multilayer film D, the protective layer 30, the second antiferromagnetic layer 23, the ferromagnetic layer 24, the nonmagnetic layer 25, the free magnetic layer 26, the nonmagnetic material layer 27, a portion of the second pinned magnetic sublayer 28a have thicknesses in the track width direction corresponding to the track width Tw, and the rest of the second pinned magnetic sublayer 28a, the non-magnetic intermediate sublayer 28b, the first pinned magnetic sublayer 28c, the first antiferromagnetic layer 29, the seed layer 22, and the underlayer 21 have thicknesses in the track width direction that are larger than the track width Tw.

In the magnetic sensing element shown in FIG. 5, the side faces Da in the track width direction (X direction) of the layers from the protective layer 30 to a portion of the second pinned magnetic sublayer 28a are continuous planes perpendicular to a surface Db of the multilayer film D. However, the side faces in the track width direction of the protective layer 30 to a portion of the second pinned magnetic sublayer 28a may be inclined planes Da1 as indicated by dotted lines in FIG. 5.

In the magnetic sensing element shown in FIG. 5, the optical track width Tw is determined by the width in the track width direction of the nonmagnetic material layer 27. In this embodiment, the optical track width Tw can be set at 0.1 μm or less, and more particularly, 0.06 μm or less so as to cope with a recording density of 200 Gbit/in$^2$ or more.

In the magnetic sensing element shown in FIG. 5, the magnetization of the ferromagnetic layer 24 is directed in a direction substantially perpendicular to the magnetization direction of the pinned magnetic layer 28 by the exchange coupling magnetic field between the ferromagnetic layer 24 and the second antiferromagnetic layer 23.

Since the free magnetic layer 26 is disposed on the ferromagnetic layer 24 with the nonmagnetic layer 25 therebetween, the free magnetic layer 26 is aligned in a single domain state by the interlayer coupling magnetic field between the free magnetic layer 26 and the ferromagnetic layer 24 with the nonmagnetic layer 25 therebetween, i.e., the RKKY interaction in this case, and the magnetization of the free magnetic layer 26 is directed substantially perpendicular to the magnetization direction of the pinned magnetic layer 28.

Since the free magnetic layer 26 is aligned in a single domain state and the magnetization direction of the free magnetic layer 26 is controlled by the interlayer coupling magnetic field with the ferromagnetic layer 24 with the nonmagnetic layer 25 therebetween as described above, the longitudinal bias magnetic field applied to the free magnetic layer 26 can be prevented from being disturbed and the magnetic domain structure of the free magnetic layer 26 can be prevented from being disturbed by an external magnetic field, such as a leakage magnetic field from a recording medium.

In the magnetic sensing element shown in FIG. 5, the alignment in a single domain state and control of the magnetization direction of the free magnetic layer 26 are adjusted in two stages, i.e., by the magnitude of the exchange coupling magnetic field between the second antiferromagnetic layer 23 and the ferromagnetic layer 24 and by the magnitude of the interlayer coupling magnetic field between the ferromagnetic layer 24 and the free magnetic layer 26, thus facilitating fine controls.

Therefore, since the alignment in a single domain state and control of the magnetization direction of the free magnetic layer 26 can be performed appropriately and easily, the magnetic sensing element can be made suitable for further track narrowing.

In the structure in which the ferromagnetic layer 24 and the second antiferromagnetic layer 23 are deposited on a region 26c corresponding to the track width of the free magnetic layer 26 with the nonmagnetic layer 25 therebetween, it is also possible to reliably direct the magnetization of the free magnetic layer 26 in a direction substantially perpendicular to the magnetization direction of the pinned magnetic layer 28 and to vary the magnetization direction of the free magnetic layer 26 by the leakage magnetic field.

Therefore, in the magnetic sensing element shown in FIG. 5, in the region 26c corresponding to the track width of the free magnetic layer 26, the magnetization direction of the central part and the magnetization direction of both ends do not substantially differ from each other.

In the magnetic sensing element shown in FIG. 5, since the first antiferromagnetic layer 29 and the pinned magnetic layer 28 are disposed below the ferromagnetic layer 24 and the second antiferromagnetic layer 23, when a fabrication method is employed in which an exchange anisotropic magnetic field is generated between the ferromagnetic layer 24 and the second antiferromagnetic layer 23 after a strong exchange anisotropic magnetic field is generated between the first antiferromagnetic layer 29 and the pinned magnetic layer 28, magnetization directions are easily adjusted.

Figure 6:
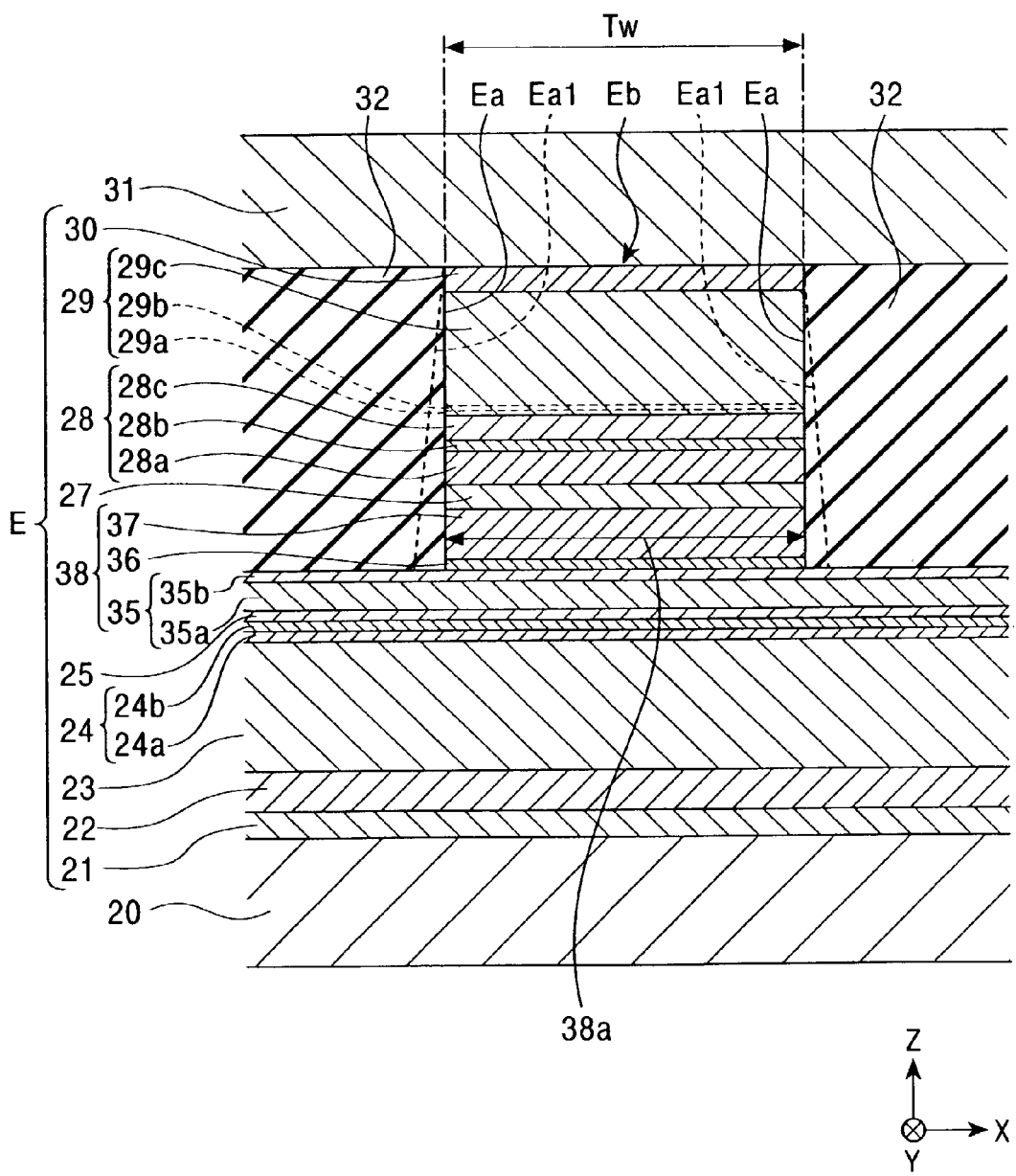
FIG. 6 is a sectional view of a magnetic sensing element in a sixth embodiment of the present invention.

FIG. 6 is a partial sectional view of a magnetic sensing element in a sixth embodiment of the present invention, viewed from the surface facing a recording medium.

The magnetic sensing element shown in FIG. 6, which is a top-type magnetic sensing element, differs from the magnetic sensing element shown in FIG. 1 in that a free magnetic layer 38 is a so-called "synthetic-ferri-free-type" free magnetic layer, in which a first free magnetic sublayer 35 and a second free magnetic sublayer 37 having different magnetic moments per unit area are deposited with a nonmagnetic intermediate sublayer 36 therebetween and the magnetization directions of the first free magnetic sublayer 35 and the second free magnetic sublayer 37 are antiparallel, thus forming a ferrimagnetic state.

In FIG. 6, the layers represented by the same reference numerals as those in FIG. 1 are composed of the same materials with the same thicknesses as those of the layers shown in FIG. 1.

The first free magnetic sublayer 35 has a two-layer structure including a first magnetic portion 35a and a second magnetic portion 35b. The first free magnetic sublayer 35 may have a multilayer structure including more than 2 layers or a single-layer structure.

The first magnetic portion 35a in contact with the nonmagnetic layer 25 is composed of NiFe (Permalloy) or NiFeX, wherein X is at least one element selected from the group consisting of Al, Si, Ti, V, Cr, Mn, Cu, Zr, Nb, Mo, Ru, Rh, Hf, Ta, W, Ir, and Pt, and the second magnetic portion 35b in contact with the nonmagnetic intermediate sublayer 36 is composed of a Co-containing ferromagnetic material, such as Co, CoFe, or CoFeNi.

In this embodiment, the first magnetic portion 35a has a thickness of 40 Å, and the second magnetic portion 35b has a thickness of 10 Å.

The nonmagnetic intermediate sublayer 36 is composed of at least one of Ru, Rh, Ir, Cr, Re, and Cu. When the nonmagnetic intermediate sublayer 36 is composed of Ru so that the free magnetic layer 38 has a synthetic ferrimagnetic state, the thickness of the Ru layer is preferably 8 to 11 Å.

The second free magnetic sublayer 37 is composed of a Co-containing ferromagnetic material, such as Co, CoFe, or CoFeNi. The second free magnetic sublayer 37 has a thickness of 80 Å.

By forming the second free magnetic sublayer 37 using the Co-containing ferromagnetic material, it is possible to prevent the material of the second free magnetic sublayer 37 from diffusing into the nonmagnetic material layer 27, thus preventing a decrease in the rate of change in magnetoresistance.

As in the magnetic sensing element shown in FIG. 6, when a plurality of ferromagnetic material layers (the first free magnetic sublayer 35 and the second free magnetic sublayer 37) having different magnetic moments per unit area are in a synthetic ferrimagnetic state, the real magnetic moment (Ms×t) per unit area of the free magnetic layer 38 can be decreased, and the rate of variation in the magnetization direction of the free magnetic layer 38 with respect to an external magnetic field can be improved. That is, it is possible to improve the magnetic sensitivity of the magnetic sensing element. The demagnetizing field in the free magnetic layer 38 can also be decreased.

The magnetization direction of the free magnetic layer 38 corresponds to the direction of the resultant magnetic moment (Ms×t) per unit area determined by the sum of the magnetic moment (Ms×t) per unit area of the first free magnetic sublayer 35 and the magnetic moment (Ms×t) per unit area of the second free magnetic sublayer 37.

In this embodiment, the ferromagnetic layer 24 and the second antiferromagnetic layer 23 are also disposed below the region 38a corresponding to the track width of the free magnetic layer 38 with the nonmagnetic layer 25 therebetween.

In this embodiment at least one of the second magnetic portion 35b of the first free magnetic sublayer 35 and the second free magnetic sublayer 37 is preferably composed of a magnetic material represented by the formula CoFeNi, wherein the Fe content is in the range of 9 to 17 atomic percent, the Ni content is in the range of 0.5 to 10 atomic percent, and the balance is Co.

When an interlayer composed of a CoFe alloy or Co is formed between the second free magnetic sublayer 37 and the nonmagnetic material layer 27, at least one of the second magnetic portion 35b of the first free magnetic sublayer 35 and the second free magnetic sublayer 37 is composed of a magnetic material represented by the formula CoFeNi, wherein the Fe content is in the range of 7 to 15 atomic percent, the Ni content is in the range of 5 to 15 atomic percent, and the balance is Co.

Furthermore, in the present invention, preferably, both the second magnetic portion 35b of the first free magnetic sublayer 35 and the second free magnetic sublayer 37 are composed of CoFeNi having the composition described above.

Furthermore, in the present invention, preferably, both the second magnetic portion 35b of the first free magnetic sublayer 35 and the second free magnetic sublayer 37 are composed of CoFeNi having the composition described above.

Consequently, the exchange coupling magnetic field due to the RKKY interaction generated between the second magnetic portion 35b of the first free magnetic sublayer 35 and the second free magnetic sublayer 37 can be increased. Specifically, the strength of the magnetic field at which the antiparallel state is lost, i.e., the spin-flop magnetic field (Hsf), can be increased to approximately 293 kA/m.

If the compositional ranges described above are satisfied, the magnetostrictions of the second magnetic portion 35b of the first free magnetic sublayer 35 and the second free magnetic sublayer 37 can be set in the range of $-3\times10^{-6}$ to $3\times10^{-6}$, and the coercive forces can be decreased to 790 A/m or less.

In the magnetic sensing element shown in FIG. 6, the magnetization direction of the ferromagnetic layer 24 is strongly pinned in a direction substantially perpendicular to the magnetization direction of the pinned magnetic layer 28 by increasing the exchange coupling magnetic field between the second antiferromagnetic layer 23 and the ferromagnetic layer 24, and then the first free magnetic sublayer 35 and the second free magnetic sublayer 37 are aligned in a single domain state and the magnetization of the free magnetic layer 38 is reliably directed in a direction substantially perpendicular to the magnetization direction of the pinned magnetic layer 28 by setting the magnitude of the interlayer coupling magnetic field (RKKY interaction) between the first free magnetic sublayer 35 and the ferromagnetic layer 24 smaller than the magnitude of the exchange coupling magnetic field, and also the magnetization direction of the free magnetic layer 38 must be varied by the leakage magnetic field.

In order to increase the exchange coupling magnetic field between the second antiferromagnetic layer 23 and the ferromagnetic layer 24 and to set the magnitude of the interlayer coupling magnetic field between the first free magnetic sublayer 35 and the ferromagnetic layer 24 smaller than the magnitude of the exchange coupling magnetic field, in this embodiment, the magnetic moment (Ms×t) per unit area of the ferromagnetic layer 24 is smaller than the magnetic moment (Ms×t) per unit area of the first free magnetic sublayer 35.

Specifically, the ratio of the magnitude of the magnetic moment (Ms×t) per unit area of the first free magnetic sublayer 35 to the magnitude of the magnetic moment (Ms×t) per unit area of the ferromagnetic layer 24 is in the range of 3 to 20. The magnetic moment per unit area of the first free magnetic sublayer 35 is the sum of the magnetic moment per unit area of the first magnetic portion 35a and the magnetic moment per unit area of the second magnetic portion 35b.

By forming the second ferromagnetic sublayer 24b in contact with the nonmagnetic layer 25 using NiFe (Permalloy) or NiFeX, wherein X is at least one element selected from the group consisting of Al, Si, Ti, V, Cr, Mn, Cu, Zr, Nb, Mo, Ru, Rh, Hf, Ta, W, Ir, and Pt, the magnitude of the interlayer coupling magnetic field between the first free magnetic sublayer 35 and the ferromagnetic layer 24 can be appropriately decreased.

In the first free magnetic sublayer 35, by forming the first magnetic portion 35a in contact with the nonmagnetic layer 25 using NiFe (Permalloy) or NiFeX, wherein X is at least one element selected from the group consisting of Al, Si, Ti, V, Cr, Mn, Cu, Zr, Nb, Mo, Ru, Rh, Hf, Ta, W, Ir, and Pt, the magnitude of the interlayer coupling magnetic field between the first free magnetic sublayer 35 and the ferromagnetic layer 24 can be appropriately decreased.

In the magnetic sensing element shown in FIG. 6, the alignment in a single domain state and control of the magnetization direction of the free magnetic layer 38 are adjusted in two stages, i.e., by the magnitude of the exchange coupling magnetic field between the second antiferromagnetic layer 23 and the ferromagnetic layer 24 and by the magnitude of the interlayer coupling magnetic field between the ferromagnetic layer 24 and the first free magnetic sublayer 35, thus facilitating fine controls.

Therefore, since the alignment in a single domain state and control of the magnetization direction of the free magnetic layer 38 can be performed appropriately and easily, the magnetic sensing element can be made suitable for further track narrowing.

In a structure in which the ferromagnetic layer 24 and the second antiferromagnetic layer 23 are disposed above the region 38a corresponding to the track width of the free magnetic layer 38 with the nonmagnetic layer 25 therebetween, the magnetization of the free magnetic layer 38 can also be reliably directed in a direction substantially perpendicular to the magnetization direction of the pinned magnetic layer 28 and the magnetization direction of the free magnetic layer 38 can be varied by the leakage magnetic field.

Therefore, in the magnetic sensing element shown in FIG. 6, in region 38a corresponding to the track width of the free magnetic layer 38, the magnetization direction of the central part and the magnetization direction of both ends do not substantially differ from each other.

In the magnetic sensing element shown in FIG. 6, in the multilayer film E in which the underlayer 21, the seed layer 22, the second antiferromagnetic layer 23, the ferromagnetic layer 24, the nonmagnetic layer 25, the free magnetic layer 38, the nonmagnetic material layer 27, and the pinned magnetic layer 28, the first antiferromagnetic layer 29, and the protective layer 30 are deposited in-that order from the bottom, both sides of the multilayer film E from the protective layer 30 to the nonmagnetic intermediate sublayer 36 are trimmed so as to have a width in the track width direction corresponding to the track width Tw, and the widths in the track width direction of the first free magnetic sublayer 35, the ferromagnetic layer 24, the second antiferromagnetic layer 23, the seed layer 22, and the underlayer 21 are larger than the track width Tw. Consequently, side reading, in which external magnetic fields in regions outside the region corresponding to the track width are detected, can be reduced, and it is possible to provide a sufficiently large longitudinal bias magnetic field (interlayer coupling magnetic field between the ferromagnetic layer 24 and the free magnetic layer 38).

In the magnetic sensing element shown in FIG. 6, the side faces Ea in the track width direction (X direction) of the multilayer film E from the protective layer 30 to the nonmagnetic intermediate sublayer 36 are continuous planes perpendicular to a surface Eb of the multilayer film E. However, the side faces Ea may be inclined planes Ea1 as indicated by dotted lines in FIG. 6.

In the magnetic sensing element shown in FIG. 6, the optical track width Tw is determined by the width in the track width direction of the nonmagnetic material layer 27. In this embodiment, the optical track width Tw can be set at 0.1 µm or less, and more particularly, 0.06 µm or less so as to cope with a recording density of 200 Gbit/in$^2$ or more.

Figure 7:
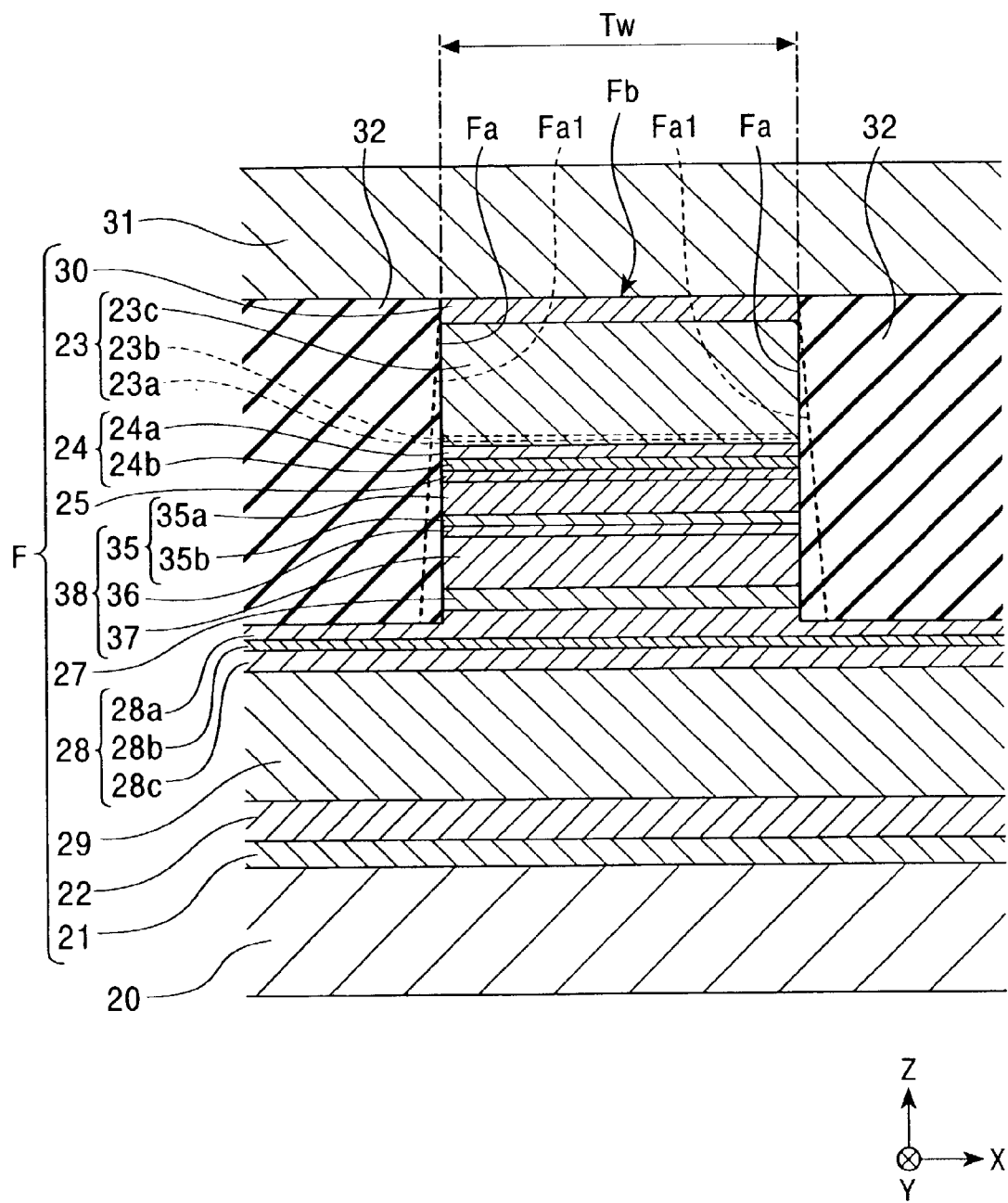
FIG. 7 is a sectional view of a magnetic sensing element in a seventh embodiment of the present invention.

FIG. 7 is a sectional view of a magnetic sensing element in a seventh embodiment of the present invention, viewed from the surface facing a recording medium.

The magnetic sensing element shown in FIG. 7 differs from the magnetic sensing element shown in FIG. 6 in that, instead of the multilayer film E, a multilayer film F is formed in which an underlayer 21; a seed layer 22; a first antiferromagnetic layer 29; a synthetic-ferri-pinned type pinned magnetic layer 28 including a first pinned magnetic sublayer 28c, a nonmagnetic intermediate sublayer 28b, and a second pinned magnetic sublayer 28a; a nonmagnetic material layer 27; a synthetic-ferry-free type free magnetic layer 38 including a second free magnetic sublayer 37, a nonmagnetic intermediate sublayer 36, and a first free magnetic sublayer 35; a nonmagnetic layer 25; a ferromagnetic layer 24 including a second ferromagnetic sublayer 24b and a first ferromagnetic sublayer 24a; a second antiferromagnetic layer 23; and a protective layer 30 are deposited in that order from the bottom. The magnetic sensing element shown in FIG. 7 is a so-called "bottom type spin-valve magnetic sensing element".

The first free magnetic sublayer 35 has a two-layer structure including a first magnetic portion 35a and a second magnetic portion 35b.

In FIG. 7, the layers represented by the same reference numerals as those in FIG. 6 are composed of the same materials with the same thicknesses as those of the layers shown in FIG. 6.

The magnetic sensing element shown in FIG. 7 differs from the magnetic sensing element shown in FIG. 6 in that the second antiferromagnetic layer 23 may have a multilayer structure including an intermediate antiferromagnetic layer 23a with a thickness of 10 to 50 Å, a nonmagnetic protective layer 23b composed of a noble metal with a thickness of 1 to 3 Å, and an upper antiferromagnetic layer 23c.

The intermediate antiferromagnetic layer 23a and the upper antiferromagnetic layer 23c are composed of the same antiferromagnetic material, and specifically, the PtMn alloy, X—Mn alloy, or Pt—Mn—X' alloy described above.

The total thickness of the intermediate antiferromagnetic layer 23a and the upper antiferromagnetic layer 23c is in the range of 80 to 300 Å, and, for example, 150 Å. The intermediate antiferromagnetic layer 23a does not exhibit antiferromagnetism alone because its thickness is small in the range of 10 to 50 Å. The intermediate antiferromagnetic layer 23a exhibits antiferromagnetism in combination with the upper antiferromagnetic layer 23c, thereby producing an exchange coupling magnetic field with the ferromagnetic layer 24.

The nonmagnetic protective layer 23b, which has a thickness of 1 to 3 Å and is composed of at least one of Ru, Re, Pd, Os, Ir, Pt, Au, and Rh, causes an antiferromagnetic interaction between the intermediate antiferromagnetic layer 23a and the upper antiferromagnetic layer 23c. Thus, the intermediate antiferromagnetic layer 23a and the upper antiferromagnetic layer 23c are allowed to function as a combined antiferromagnetic layer. Even if the material for the nonmagnetic protective layer 23b is diffused into the intermediate antiferromagnetic layer 23a and the upper antiferromagnetic layer 23c, the antiferromagnetism is not degraded.

The second antiferromagnetic layer 23 may be composed of the intermediate antiferromagnetic layer 23a and the upper antiferromagnetic layer 23c without the nonmagnetic protective layer 23b. The second antiferromagnetic layer 23 may be a single-layer antiferromagnetic layer.

As in the magnetic sensing element shown in FIG. 7, when a plurality of ferromagnetic material layers (the first free magnetic sublayer 35 and the second free magnetic sublayer 37) having different magnetic moments per unit area are in a synthetic ferrimagnetic state, the real magnetic moment (Msxt) per unit area of the free magnetic layer 38 can be decreased, and the rate of variation in the magnetization direction of the free magnetic layer 38 with respect to an external magnetic field can be improved. That is, it is possible to improve the magnetic sensitivity of the magnetic sensing element. The demagnetizing field in the free magnetic layer 38 can also be decreased.

In the magnetic sensing element shown in FIG. 7, both side faces of the multilayer film F from the protective layer 30 to a portion in the thickness direction of the second pinned magnetic sublayer 28a are trimmed so as to have a width in the track width direction corresponding to the track width Tw, and the width in the track width direction multilayer film F from the rest of the second pinned magnetic sublayer 28a to the underlayer 21 is larger than the track width Tw. Consequently, side reading, in which external magnetic fields in regions outside the region corresponding to the track width Tw are detected, can be reduced.

In the magnetic sensing element shown in FIG. 7, the side faces Fa in the track width direction (X direction) of the protective layer 30 to a portion of the second pinned magnetic sublayer 28a are continuous planes perpendicular to a surface Fb of the multilayer film F. However, the side faces in the track width direction of the protective layer 30 to a portion of the second pinned magnetic sublayer 28a may be inclined planes Fa1 as indicated by dotted lines in FIG. 7.

In the magnetic sensing element shown in FIG. 7, the optical track width Tw is determined by the width in the track width direction of the nonmagnetic material layer 27. In this embodiment, the optical track width Tw can be set at 0.1 μm or less, and more particularly, 0.06 μm or less so as to cope with a recording density of 200 Gbit/in$^2$ or more.

Figure 8:
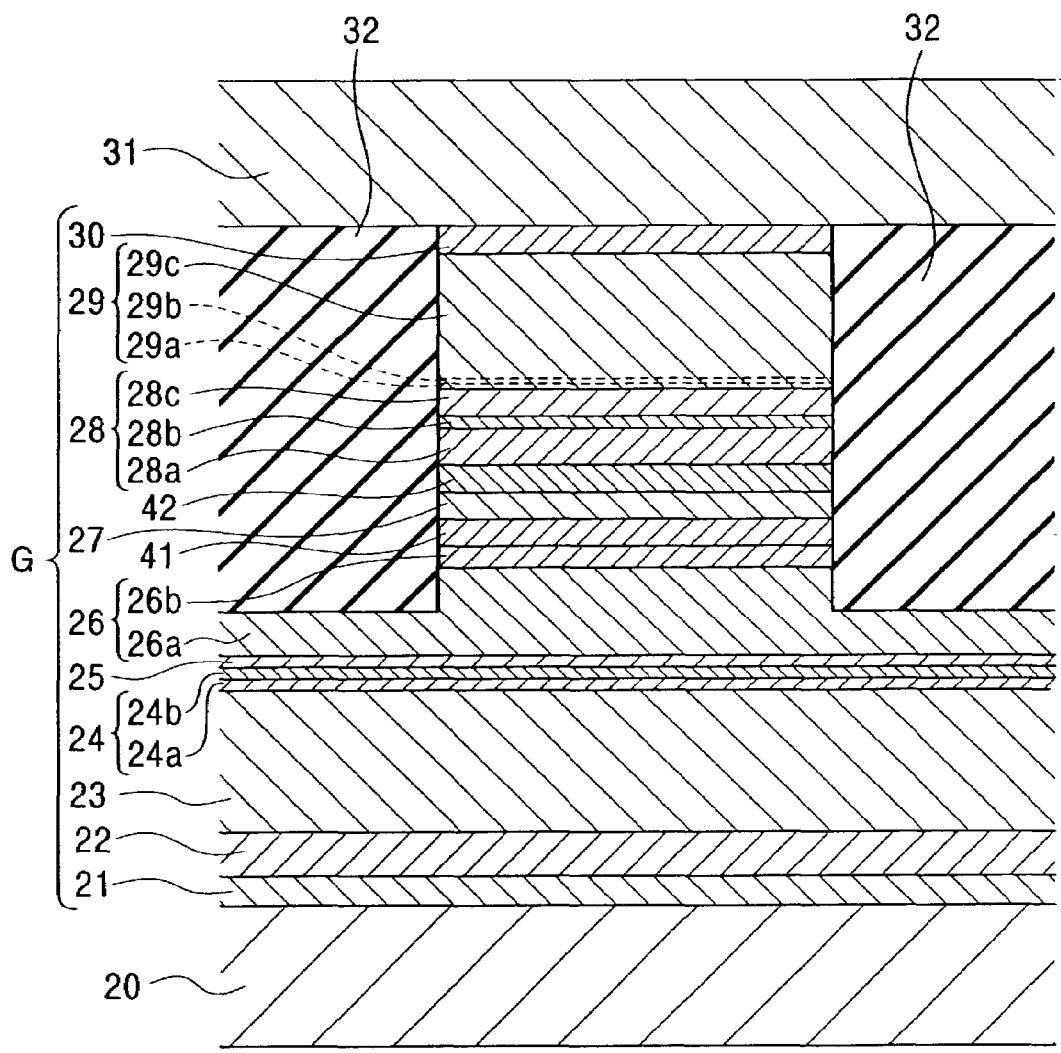
FIG. 8 is a sectional view of a magnetic sensing element in an eighth embodiment of the present invention.

FIG. 8 is a partial sectional view of a magnetic sensing element in an eighth embodiment of the present invention, viewed from the surface facing a recording medium.

The magnetic sensing element shown in FIG. 8 differs from the magnetic sensing element shown in FIG. 1 in that a metalloid ferromagnetic Heusler alloy layer 41 is disposed between the nonmagnetic material layer 27 and the free magnetic layer 26 and a metalloid ferromagnetic Heusler alloy layer 42 is disposed between the pinned magnetic layer 28 and the nonmagnetic material layer 27.

In FIG. 8, the layers represented by the same reference numerals as those in FIG. 1 are composed of the same materials and the same thicknesses as those of the layers shown in FIG. 1.

The metalloid ferromagnetic Heusler alloy layers 41 and 42 may be composed of a metalloid ferromagnetic Heusler alloy, such as NiMnSb, PtMnSb, PdMnSb, PtMnSn, Co$_2$MnSi, Co$_2$MnGe, Co$_2$MnSn, Co$_2$MnAl, or Co$_2$Mn$_1$(Al$_x$Si$_{100-x}$)$_1$, wherein x is in the range of 0 to 100.

The metalloid ferromagnetic Heusler alloy is a metalloid, has a Curie temperature of 200° C. or more, exhibits ferromagnetism at room temperature (25° C.), and has a resistivity of 50 μΩ·cm.

In the CPP-type magnetic sensing element, if the metalloid ferromagnetic Heusler alloy layers 41 and 42 as shown in FIG. 8 are provided, the spin-up electron/spin-down electron ratio in the multilayer film G can be controlled, and the rate of change in magnetoresistance (ΔR) can be improved.

The magnetization direction of the metalloid ferromagnetic Heusler alloy layer 41 must be varied together with the free magnetic layer 26. Preferably, a NiFe layer having superior soft magnetic properties is in contact with the metalloid ferromagnetic Heusler alloy layer 41. Consequently, the rate of change in magnetoresistance can be further improved.

The magnetic sensing element shown in any one of FIGS. 1 to 8 is a CPP-type magnetic sensing element in which a sensing current flows perpendicular to the planes of the individual layers of the multilayer film A, C, D, E, F, or G.

The present invention is also applicable to a spin-valve magnetic sensing element of a so-called "current-in-plane (CIP)" type, in which a sensing current flows parallel to the planes of a multilayer film including a pinned magnetic layer, a nonmagnetic material layer, and a free magnetic layer.

Figure 9:
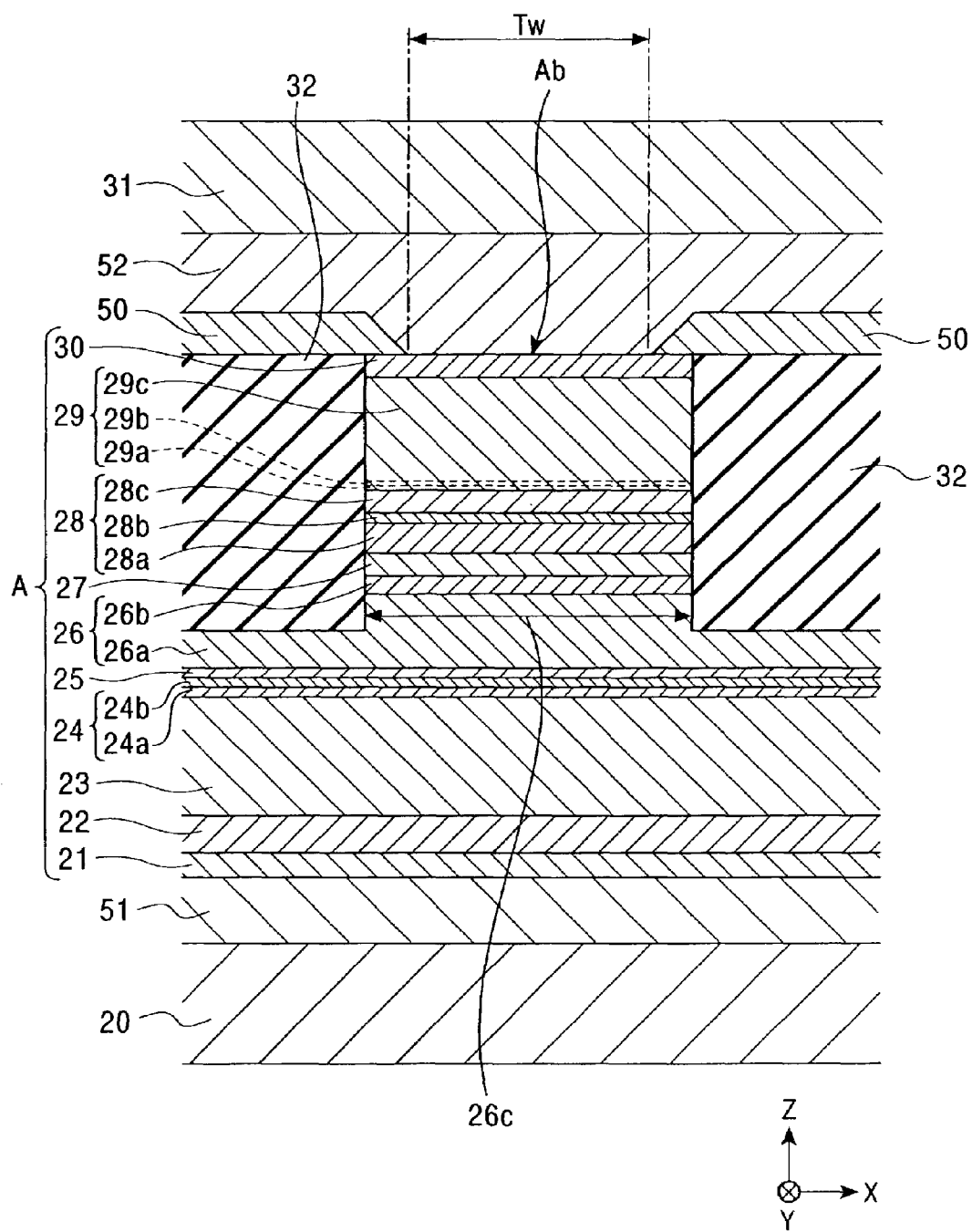
FIG. 9 is a sectional view of a magnetic sensing element in a ninth embodiment of the present invention.

FIG. 9 is a partial sectional view of a CIP-type spin-valve magnetic sensing element in a ninth embodiment of the present invention, viewed from the surface facing a recording medium.

Although the magnetic sensing element shown in FIG. 9 includes a multilayer film A in the same manner as that in the magnetic sensing element shown in FIG. 1, it differs from the magnetic sensing element shown in FIG. 1 in that electrode layers 50 are formed on an upper surface Ab of the multilayer film A with a distance corresponding to the track width Tw therebetween. In the magnetic sensing element shown in FIG. 9, a sensing current flows parallel to the planes of the individual layers in the multilayer film A. The electrode layers 50 are composed of W, Ta, Cr, Cu, Rh, Ir, Ru, Au, or the like.

The magnetic sensing element shown in FIG. 9 is also a spin-valve magnetic sensing element. The magnetization direction of the pinned magnetic layer 28 is appropriately pinned in a direction parallel to the Y direction, the magnetization of the free magnetic layer 26 is appropriately aligned in the X direction, and the magnetization directions of the pinned magnetic layer 28 and the free magnetic layer 26 are substantially perpendicular to each other. When a leakage magnetic field from a recording medium enters the magnetic sensing element in the Y direction, the magnetization of the free magnetic layer 26 is varied with high sensitivity, and electrical resistance changes due to the relationship between the varying magnetization direction of the free magnetic layer 26 and the pinned magnetization direction of the pinned magnetic layer 28. The leakage magnetic field from the magnetic recording medium is detected by a voltage change based on the change in the electrical resistance.

The relative angle between the magnetization direction of the second pinned magnetic sublayer 28a and the magnetization direction the free magnetic layer 26 directly contributes to a change in electrical resistance (output), and preferably, the magnetization direction of the second pinned magnetic sublayer 28a and the magnetization direction the free magnetic layer 26 are substantially perpendicular to each other when a sensing current is applied and a signal magnetic field is not applied.

Additionally, the recording medium facing the magnetic sensing element travels in the Z direction.

In the magnetic sensing element shown in FIG. 9, the alignment in a single domain state and control of the magnetization direction of the free magnetic layer are adjusted in two stages, i.e., by the magnitude of the exchange coupling magnetic field between the second antiferromagnetic layer 23 and the ferromagnetic layer 24 and by the magnitude of the interlayer coupling magnetic field between the ferromagnetic layer 24 and the free magnetic layer 26, thus facilitating fine controls.

Therefore, since the alignment in a single domain state and control of the magnetization direction of the free magnetic layer 26 can be performed appropriately and easily, the magnetic sensing element can be made suitable for further track narrowing.

Even in the structure in which the ferromagnetic layer 24 and the second antiferromagnetic layer 23 are disposed below the region 26c corresponding to the track width of the free magnetic layer 26 with the nonmagnetic layer 25 therebetween, the magnetization of the free magnetic layer 26 can be reliable directed in a direction substantially perpendicular to the magnetization direction of the pinned magnetic layer 28, and also the magnetization direction of the free magnetic layer 26 can be varied by a leakage magnetic field.

Consequently, in the magnetic sensing element shown in FIG. 9, the center and the sides in the region 26c corresponding to the track width of the free magnetic layer 26 hardly have different magnetization directions.

In the CIP-type magnetic sensing element, in order to improve the rate of change in magnetoresistance, the free magnetic layer 26 preferably has a thickness of 30 to 40 Å. However, if the free magnetic layer 26 has the thickness in this range, it is difficult to make adjustments so that the magnetization direction of the free magnetic layer 26 is varied by a leakage magnetic field (external magnetic field) after the exchange coupling magnetic field between the second antiferromagnetic layer 23 and the ferromagnetic layer 24 is increased so that the magnetization direction of the ferromagnetic layer 24 is substantially perpendicular to the magnetization direction of the pinned magnetic layer 28, the free magnetic layer 26 is aligned in a single domain state, and the magnetization direction of the free magnetic layer 26 is reliably directed in a direction substantially perpendicular to the magnetization direction of the pinned magnetic layer 28.

Since the sensing current flows through the second antiferromagnetic layer 23, the ferromagnetic layer 24, and the nonmagnetic layer 25, shunt loss occurs.

Therefore, the present invention is more effective when applied to a CPP-type magnetic sensing element.

Figure 10:
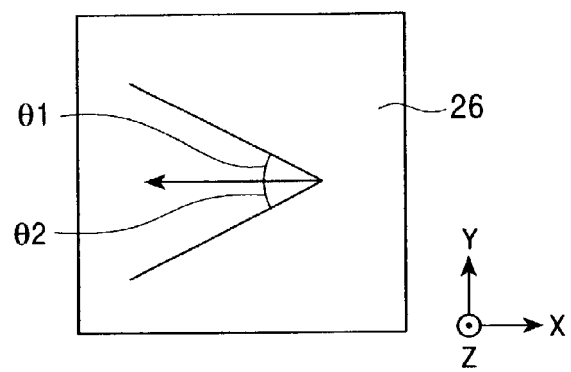
FIG. 10 is a plan view of a free magnetic layer in a magnetic sensing element of the present invention.

FIG. 10 is a plan view of the free magnetic layer 26 of the magnetic sensing element shown in any one of FIGS. 1 to 5, FIG. 8, and FIG. 9.

The arrow in the drawing shows the magnetization direction of the free magnetic layer 26 in the absence of an applied external magnetic field.

In the magnetic sensing element shown in any one of FIGS. 1 to 5, FIG. 8, and FIG. 9, the magnetization direction of the ferromagnetic layer 24 is strongly pinned in a direction substantially perpendicular to the magnetization direction of the pinned magnetic layer 28 by the exchange coupling magnetic field with the second antiferromagnetic layer 23, the free magnetic layer 26 is aligned in a single domain state by the interlayer coupling magnetic field between the free magnetic layer 26 and the ferromagnetic layer 24 with the nonmagnetic layer 25 therebetween, and the magnetization of the free magnetic layer 26 is directed in a direction substantially perpendicular to the magnetization direction of the pinned magnetic layer 28.

However, the magnetization direction of the free magnetic layer 26 is adjusted so as to be varied by a leakage magnetic field (external magnetic field) from a recording medium. That is, when the external magnetic field is applied to the magnetic sensing element, the magnetization direction of the free magnetic layer 26 varies by an angle θ1 or θ2 with respect to the magnetization direction in the absence of the applied external magnetic field. The sum of θ1 and θ2 can be set at 12° or more. If the sum of θ1 and θ2 is 12° or more, read efficiency η (%) can be set at 10% or more.

The read efficiency η is defined as follows.

η=[(maximum change in resistance in magnetic sensing element due to leakage magnetic field from recording medium)/(theoretical value of maximum change in resistance in magnetic sensing element)]×100

The theoretical value of the maximum change in resistance in the magnetic sensing element corresponds to a difference between the resistance obtained when the magnetization directions of the free magnetic layer and the pinned magnetic layer are antiparallel to each other and the resistance obtained when the magnetization directions of the free magnetic layer and the pinned magnetic layer are parallel to each other.

The free magnetic layer 26 has the two-layer structure including the first magnetic sublayer 26a and the second magnetic sublayer 26b, and the magnetizations of the first magnetic sublayer 26a and the second magnetic sublayer 26b are always directed in the same direction.

In the magnetic sensing element shown in FIG. 6 or 7, the free magnetic layer 38 has a laminated ferrimagnetic structure including the first free magnetic sublayer 35 and the second free magnetic sublayer 37. In such a case, the magnetization variation of the first free magnetic sublayer 35 and the second free magnetic sublayer 37 can be considered as the same as the magnetization variation of the free magnetic layer 26 described with reference to FIG. 10. However, the magnetization directions of the first free magnetic layer 35 and the second free magnetic sublayer 37 are antiparallel to each other.

A method for fabricating the magnetic sensing element shown in FIG. 1 will be described.

First, an alumina layer (not shown in the drawing) is formed on a substrate, which is a wafer serving as a slider (not shown in the drawing). A lower shielding layer 20, an underlayer 21, a seed layer 22, a second antiferromagnetic layer 23, a ferromagnetic layer 24 including a first ferromagnetic sublayer 24a and a second ferromagnetic sublayer 24b, a nonmagnetic layer 25, a free magnetic layer 26 including a first magnetic sublayer 26a and a second magnetic sublayer 26b, a nonmagnetic material layer 27, a synthetic-ferri-pinned-type pinned magnetic layer 28 including a second pinned magnetic sublayer 28a, a nonmagnetic intermediate sublayer 28b, and a first pinned magnetic sublayer 28c, an intermediate antiferromagnetic layer 29a, and a nonmagnetic protective layer 29b are deposited thereon in that order from the bottom by sputtering.

Sputtering may be performed using a known sputtering system, such as magnetron sputtering system, RF diode sputtering system, RF triode sputtering system, ion beam sputtering system, or face target sputtering system. In the present invention, in addition to sputtering and vapor deposition processes, a molecular beam epitaxy (MBE) process, an ionized cluster beam (ICB) process, etc., may be used.

Figure 11:
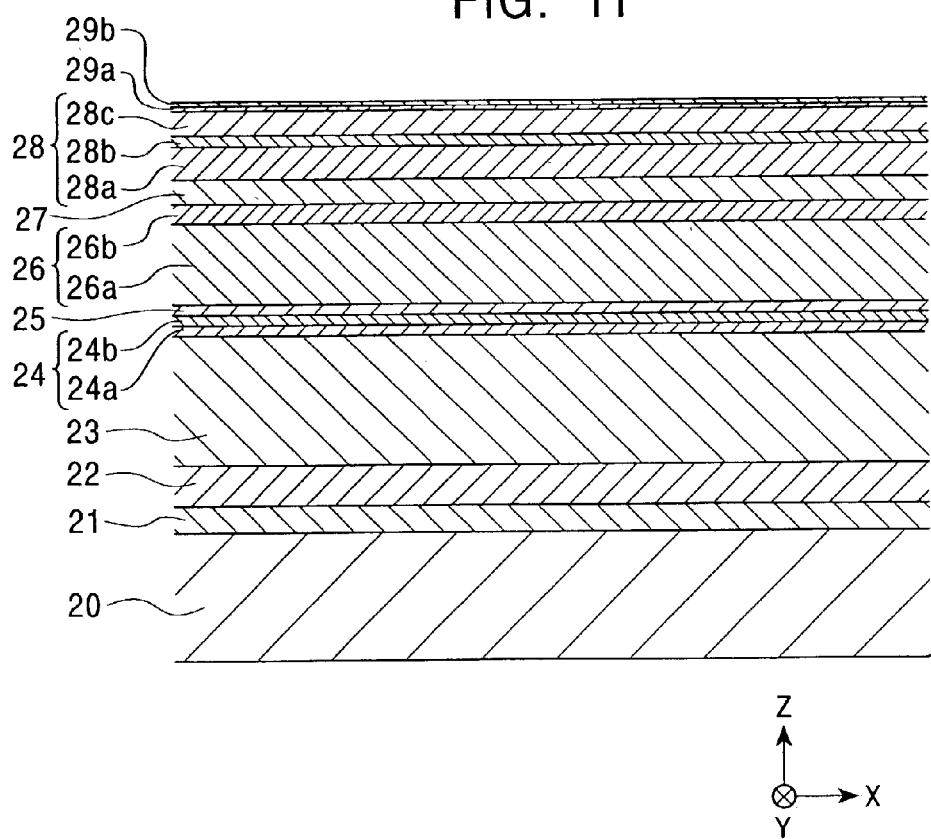
FIG. 11 is a sectional view which shows a step in a method for fabricating a magnetic sensing element in an embodiment of the present invention.

In FIG. 11, the layers represented by the same reference numerals as those in FIG. 1 are composed of the same materials and have the same thicknesses as those in FIG. 1.

The intermediate antiferromagnetic layer 29a constitutes a first antiferromagnetic layer 29 afterward and is composed of a material having the same composition as that for the second antiferromagnetic layer 23.

Specifically, the intermediate antiferromagnetic layer 29a is composed of a PtMn alloy; an X—Mn alloy, wherein X is at least one element selected from the group consisting of Pd, Ir, Rh, Ru, Os, Ni, and Fe; or a Pt—Mn—X' alloy, wherein X' is at least one element selected from the group consisting of Pd, Ir, Rh, Ru, Au, Ag, Os, Cr, Ni, Ar, Ne, Xe, and Kr.

The nonmagnetic protective layer 29b must be a dense layer which is not easily oxidized by exposure to air. In the present invention, the nonmagnetic protective layer 29b is composed of a noble metal. For example, the nonmagnetic protective layer 29b is preferably composed of at least one noble metal selected from the group consisting of Ru, Re, Pd, Os, Ir, Pt, Au, and Rh.

By sputtering a film using a noble metal, such as Ru, it is possible to obtain the dense nonmagnetic protective layer 29b which is not easily oxidized by exposure to air. Therefore, even if the thickness of the nonmagnetic protective layer 29b is decreased, the pinned magnetic layer 28 can be appropriately prevented from being oxidized by exposure to air.

In the present invention, the nonmagnetic protective layer 29b preferably has a thickness of 3 to 10 Å, and more preferably, 3 to 8 Å. Even by such a thin nonmagnetic protective layer 29b, the intermediate antiferromagnetic layer 29a can be appropriately prevented from being oxidized by exposure to air.

Figure 12:
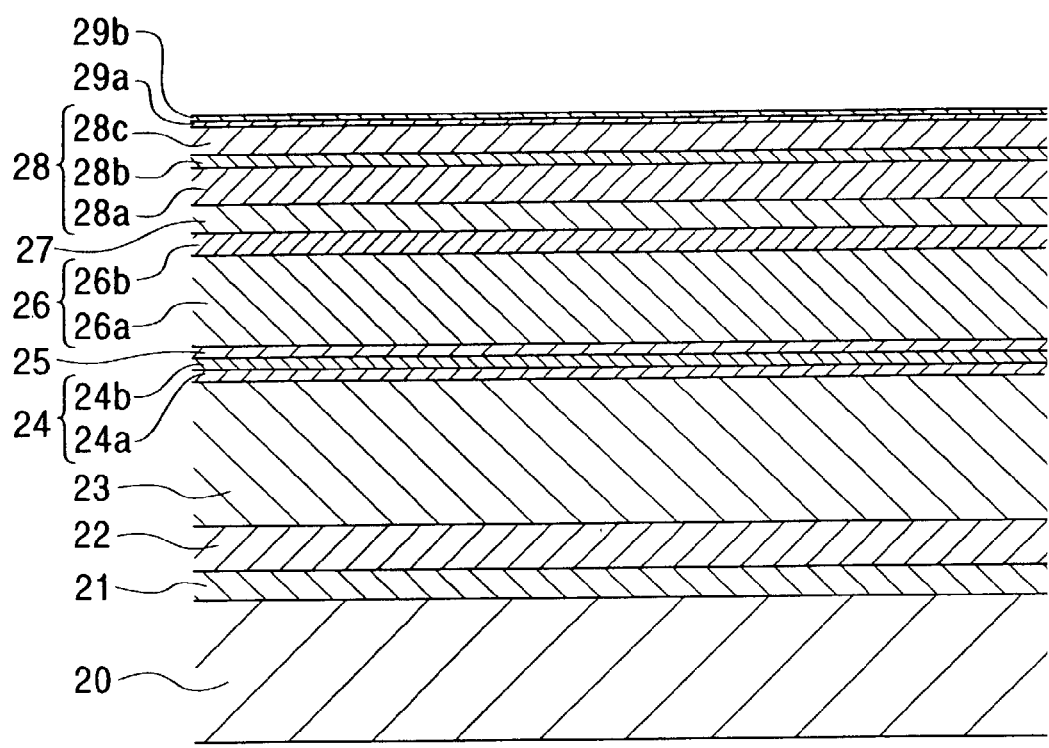
FIG. 12 is a sectional view which shows a step in the method for fabricating the magnetic sensing element in the embodiment of the present invention.

By forming the nonmagnetic protective layer 29b with such a small thickness, ion milling in the fabrication step shown in FIG. 12 can be performed with low energy, and milling control can be improved compared to the conventional method. This will be described in detail with respect to the fabrication step shown in FIG. 12.

After the individual layers from the lower shielding layer 20 to the nonmagnetic protective layer 29b are deposited on the substrate as shown in FIG. 11, annealing in a first magnetic field is performed. An exchange coupling magnetic field is generated between the second antiferromagnetic layer 23 and the ferromagnetic layer 24 by annealing at a first annealing temperature while applying a first magnetic field in the track width Tw direction (in the X direction), and the magnetization direction of the ferromagnetic layer 24 is pinned in the X direction, i.e., in the track width direction. The free magnetic layer 26 is aligned in a single domain state by an interlayer coupling magnetic field with the ferromagnetic layer 24 with the nonmagnetic layer 25 therebetween, i.e., by an RKKY interaction in this case, and the magnetization direction of the free magnetic layer 26 is directed antiparallel to the X direction. For example, the first annealing temperature is set at 270° C. and the strength of the first magnetic field is set at 800 kA/m. Additionally, the first magnetic field is larger than the saturation magnetic fields of the ferromagnetic layer 24 and the free magnetic layer 26.

The second antiferromagnetic layer 23 is composed of any one of a PtMn alloy; an X—Mn alloy, wherein X is at least one element selected from the group consisting of Pd, Ir, Rh, Ru, Os, Ni, and Fe; and a Pt—Mn—X' alloy, wherein X' is at least one element selected from the group consisting of Pd, Ir, Rh, Ru, Au, Ag, Os, Cr, Ni, Ar, Ne, Xe, and Kr. Although these alloys have a disordered face-centered cubic (fcc) structure as deposited, the structure is transformed into an ordered face-centered tetragonal (fct) structure of CuAuI type by annealing treatment. The second antiferromagnetic layer 23 has a thickness in the range of 80 to 300 Å, for example, a thickness of 150 Å.

In the PtMn alloy or the X—Mn alloy for forming the antiferromagnetic layer, the Pt content or the X content is preferably in the range of 37 to 63 atomic percent, and more preferably in the range of 47 to 57 atomic percent.

In the Pt—Mn—X' alloy, the X'+Pt content is preferably in the range of 37 to 63 atomic percent, and more preferably in the range of 47 to 57 atomic percent. Furthermore, in the Pt—Mn—X' alloy, the X' content is preferably in the range of 0.2 to 10 atomic percent. However, when X' is at least one element selected from the group consisting of Pd, Ir, Rh, Ru, Os, Ni, and Fe, the X' content is preferably in the range of 0.2 to 40 atomic percent.

By using the alloys described above, followed by annealing in the first magnetic field, the antiferromagnetic layer generating a large exchange coupling magnetic field can be obtained. In particular, if a PtMn alloy is used, it is possible to obtain an excellent second antiferromagnetic layer 23 with an exchange coupling magnetic field of 48 kA/m or more, for example, exceeding 64 kA/m, and with a blocking temperature, i.e., a temperature at which the exchange coupling magnetic field is lost, of 380° C. which is remarkably high.

The intermediate antiferromagnetic layer 29a deposited on the pinned magnetic layer 28 does not exhibit antiferromagnetism because its thickness is small in the range of 10 to 50 Å, and more preferably, 30 to 40 Å. Even if the intermediate antiferromagnetic layer 29a exhibits antiferromagnetism, it is very weak. Therefore, an exchange coupling magnetic field is not generated between the first pinned magnetic sublayer 28c and the intermediate antiferromagnetic layer 29a by annealing in the first magnetic field, and the magnetization of the pinned magnetic layer 28 is not pinned in the X direction.

By the annealing treatment in the first magnetic field described above, the noble metal element, such as Ru, constituting the nonmagnetic protective layer 29b is considered to be diffused into the intermediate antiferromagnetic layer 29a. Therefore, the intermediate antiferromagnetic layer 29a in the vicinity of the upper surface thereof is composed of the elements constituting the intermediate antiferromagnetic layer 29a and the noble metal element. The content of the noble metal element diffused into the intermediate antiferromagnetic layer 29a is higher at the upper surface side of the intermediate antiferromagnetic layer 29a compared to the lower surface side of the intermediate antiferromagnetic layer 29a, and the ratio of the diffused noble metal element is considered to gradually decrease from the upper surface of the intermediate antiferromagnetic layer 29a toward the lower surface.

Thermal diffusion of compositions also tends to occur between the first ferromagnetic sublayer 24a and the second ferromagnetic sublayer 24b constituting the ferromagnetic layer 24 and between the first magnetic sublayer 26a and the second magnetic sublayer 26b constituting the free magnetic layer 26.

The composition gradient described above can be determined by an apparatus for analyzing the chemical composition of a thin film, such as a secondary ion mass spectrometer (SIMS).

Next, in the fabrication step shown in FIG. 12, the nonmagnetic protective layer 29b is trimmed by ion milling. The nonmagnetic protective layer 29b remains at a thickness of 1 to 3 Å or is completely removed.

In the ion milling step shown in FIG. 12, ion milling with low energy may be performed. The reason for this is that the nonmagnetic protective layer 29b is remarkably thin at a thickness of approximately 3 to 10 Å.

The ion milling with low energy is defined as ion milling using an ion beam with a beam voltage (accelerating voltage) of less than 1,000 V. For example, a beam voltage of 150 to 500 V is used. In this embodiment, an argon (Ar) ion beam with a low beam voltage of 200 V is used.

In contrast, when a Ta film is used for the nonmagnetic protective layer 29b, since the Ta film itself is oxidized by exposure to air, in order to sufficiently protect the layer-beneath the Ta film from being oxidized, the Ta film must be thick with a thickness of 30 to 50 Å. Moreover, the volume of the Ta film is increased by oxidation and the thickness of the Ta film is increased to approximately 50 Å or more.

In order to remove such a thick Ta film by ion milling, the Ta film must be removed by ion milling with high energy, and it is extremely difficult to control the milling process so that only the Ta film is removed.

Therefore, the intermediate antiferromagnetic layer 29a formed beneath the Ta film is also trimmed deeply, and an inert gas, such as Ar, used during ion milling may enter the intermediate antiferromagnetic layer 29a from the exposed surface thereof, or the crystal structure in the surface region of the intermediate antiferromagnetic layer 29a may be broken, resulting in lattice defects (the mixing effect). The magnetic properties of the intermediate antiferromagnetic layer 29a are easily degraded by such damages. If the Ta film with a thickness of approximately 50 Å or more is trimmed by ion milling with low energy, treating time becomes excessively long, thus being impractical. Ta is easily diffused into the intermediate antiferromagnetic layer 29a during the deposition process compared to the noble metal. Even if the Ta film only is removed by trimming, Ta mixes into the exposed surface of the intermediate antiferromagnetic layer 29a. In the intermediate antiferromagnetic layer 29a mixed with Ta, the antiferromagnetic property is degraded.

In the present invention, the nonmagnetic protective layer 29b can be trimmed by ion milling with low energy. In the ion milling process with low energy, the milling rate is low, and the margin in the stop position of milling can be narrowed. In particular, it is also possible to stop milling immediately after the nonmagnetic protective layer 29b is removed by ion milling. Therefore, the intermediate antiferromagnetic layer 29a is not substantially damaged by ion milling. Additionally, in the fabrication step shown in FIG. 12, the incident angle of ion milling is preferably set at 30° to 70° with respect to the normal to the surface of the nonmagnetic protective layer 29b. Ion milling treatment time is approximately 1 minute.

However, if the nonmagnetic protective layer 29b is completely removed, the surface of the intermediate antiferromagnetic layer 29a may be damaged by ion milling, resulting in a decrease in antiferromagnetism. Therefore, preferably, the nonmagnetic protective layer 29b is left at a thickness of 1 to 3 Å.

Figure 13:
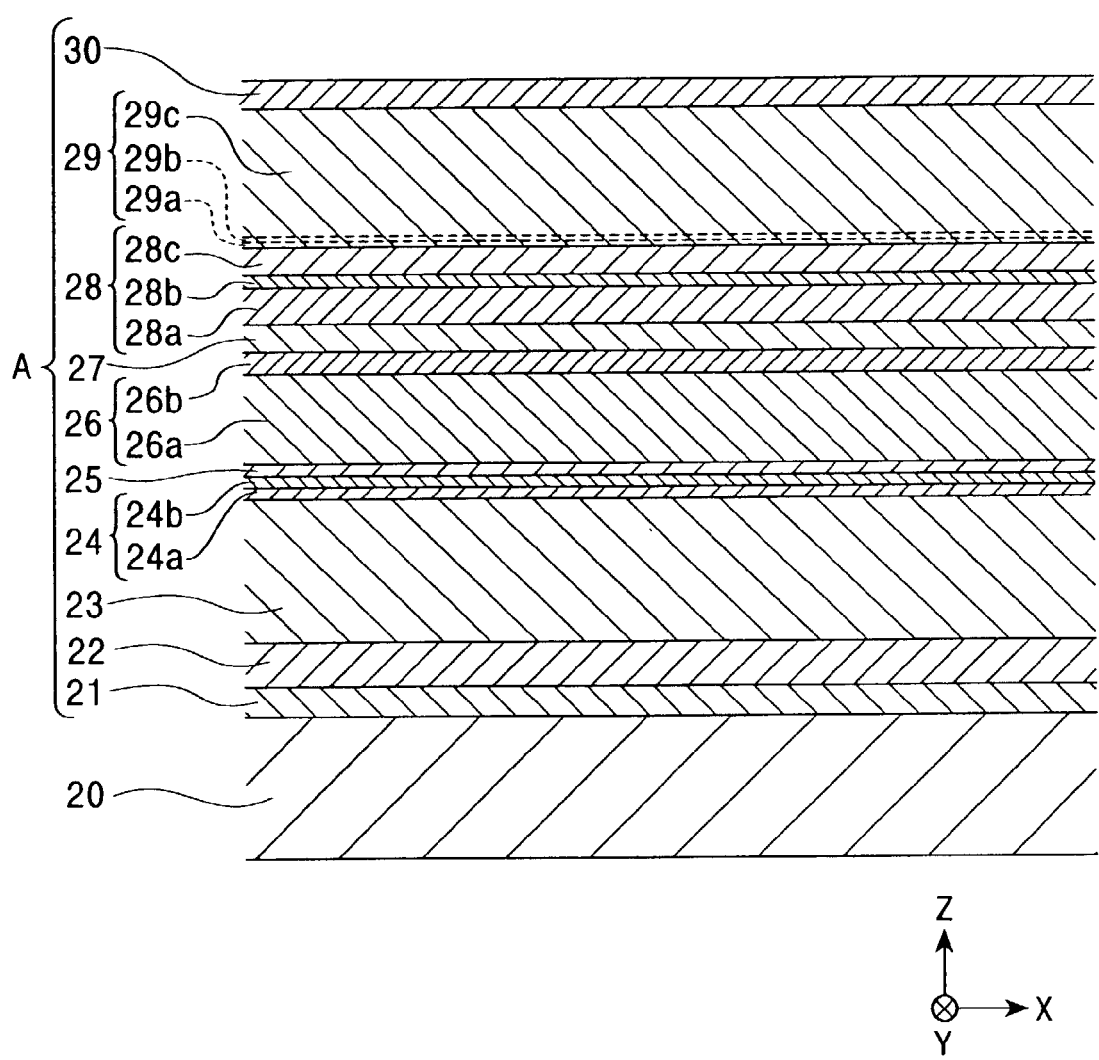
FIG. 13 is a sectional view which shows a step in the method for fabricating the magnetic sensing element in the embodiment of the present invention.

Next, in the fabrication step shown in FIG. 13, an upper antiferromagnetic layer 29c is formed in a vacuum-on the intermediate antiferromagnetic layer 29a or the remaining nonmagnetic protective layer 29b when the nonmagnetic protective layer 29b is not completely removed. Furthermore, a protective layer 30 is continuously formed in a vacuum. The layers may be formed by the sputtering or vapor deposition processes described above. The individual layers from the underlayer 21 to the protective layer 30 constitute a multilayer film A.

The upper antiferromagnetic layer 29c is preferably composed of the same antiferromagnetic material as that for the intermediate antiferromagnetic layer 29a. Specifically, the upper antiferromagnetic layer 29c is preferably composed of the PtMn alloy, X—Mn alloy, or Pt—Mn—X' alloy described above.

In FIG. 13, a combination of the intermediate antiferromagnetic layer 29a, the remaining nonmagnetic protective layer 29b, and the upper antiferromagnetic layer 29 constitutes the first antiferromagnetic layer 29. When the nonmagnetic protective layer 29b is completely removed, a combination of the intermediate antiferromagnetic layer 29a and the upper antiferromagnetic layer 29c constitutes the first antiferromagnetic layer 29.

The total thickness of the intermediate antiferromagnetic layer 29a and the upper antiferromagnetic layer 29c is in the range of 80 to 500 Å, and, for example, 150 Å. As described above, the intermediate antiferromagnetic layer 29a does not exhibit antiferromagnetism alone because its thickness is small in the range of 10 to 50 Å. The intermediate antiferromagnetic layer 29a exhibits antiferromagnetism in combination with the upper antiferromagnetic layer 29c, and an exchange coupling magnetic field is thereby generated between the first antiferromagnetic layer 29 and the pinned magnetic layer 28.

Even if the nonmagnetic protective layer 29b remains, since the remaining nonmagnetic protective layer 29b has a small thickness of 1 to 3 Å and is composed of at least one of Ru, Re, Pd, Os, Ir, Pt, Au, and Rh, the nonmagnetic protective layer 29b causes an antiferromagnetic interaction between the intermediate antiferromagnetic layer 29a and the upper antiferromagnetic layer 29c. Thus, the intermediate antiferromagnetic layer 29a, the nonmagnetic protective layer 29b, and the upper antiferromagnetic layer 29c are allowed to function as a combined antiferromagnetic layer 29. Even if the material for the nonmagnetic protective layer 29b is diffused into the intermediate antiferromagnetic layer 29a and the upper antiferromagnetic layer 29c, the antiferromagnetism is not degraded.

Next, annealing in a second magnetic field is performed. The direction of the second magnetic field is perpendicular to the track width direction (in the Y direction), i.e., the direction of a leakage magnetic filed from a recording medium. The applied second magnetic field is set smaller than the exchange anisotropic magnetic field between the second antiferromagnetic layer 23 and the ferromagnetic layer 24, and the annealing temperature is set lower than the blocking temperature of the second antiferromagnetic layer 23. Thereby, an exchange anisotropic magnetic field between the first antiferromagnetic layer 29 and the pinned magnetic layer 28 can be directed in the direction of the leakage magnetic field from the recording medium (in the Y direction) while the exchange anisotropic magnetic field between the second antiferromagnetic layer 23 and the ferromagnetic layer 24 is kept being directed in the track width direction. Consequently, the magnetization direction of the pinned magnetic layer 28 is pinned in a direction substantially perpendicular to the magnetization directions of the ferromagnetic layer 24 and the free magnetic layer 26.

The annealing temperature in the second magnetic field is, for example, 250° C., and the strength of the magnetic field is 8 to 30 kA/m, for example, 24 kA/m. The applied second magnetic field is larger than the coercive forces of the second pinned magnetic sublayer 28a and the first pinned magnetic sublayer 28c, and is smaller than the spin-flop magnetic field between the second pinned magnetic sublayer 28a and the first pinned magnetic sublayer 28c.

Therefore, the structure of the first antiferromagnetic layer 29 is appropriately transformed into an ordered structure by annealing in the second magnetic field, and an exchange coupling magnetic field with an appropriate magnitude is generated between the first antiferromagnetic layer 29 and the pinned magnetic layer 28.

By using the fabrication method in which the multilayer film A is formed in two stages and two annealing processes are performed in different magnetic fields as in the case of this embodiment, the first antiferromagnetic layer 29 and the second antiferromagnetic layer 23 can be composed of the same antiferromagnetic material.

Figure 14:
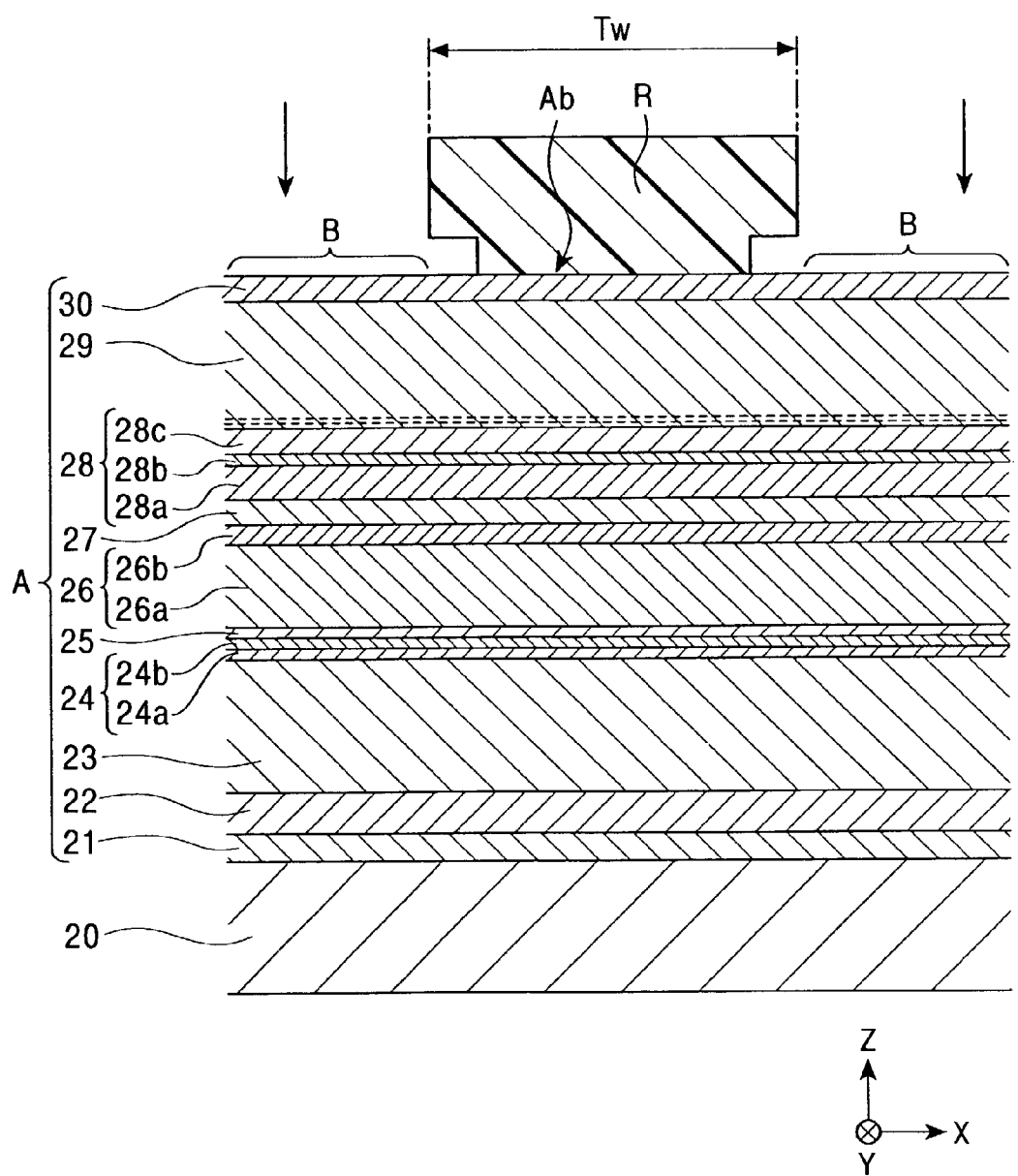
FIG. 14 is a sectional view which shows a step in the method for fabricating the magnetic sensing element in the embodiment of the present invention.

Next, in the fabrication step shown in FIG. 14, a resist layer is formed on the upper surface of the protective layer 30 of the multilayer film A, and by exposing and developing the resist layer, a resist layer R with a shape shown in FIG. 14 is left on the protective layer 30. For example, the resist layer R is provided with an undercut region for a lift-off process, and has a width in the track width direction equal to the track width Tw.

Figure 15:
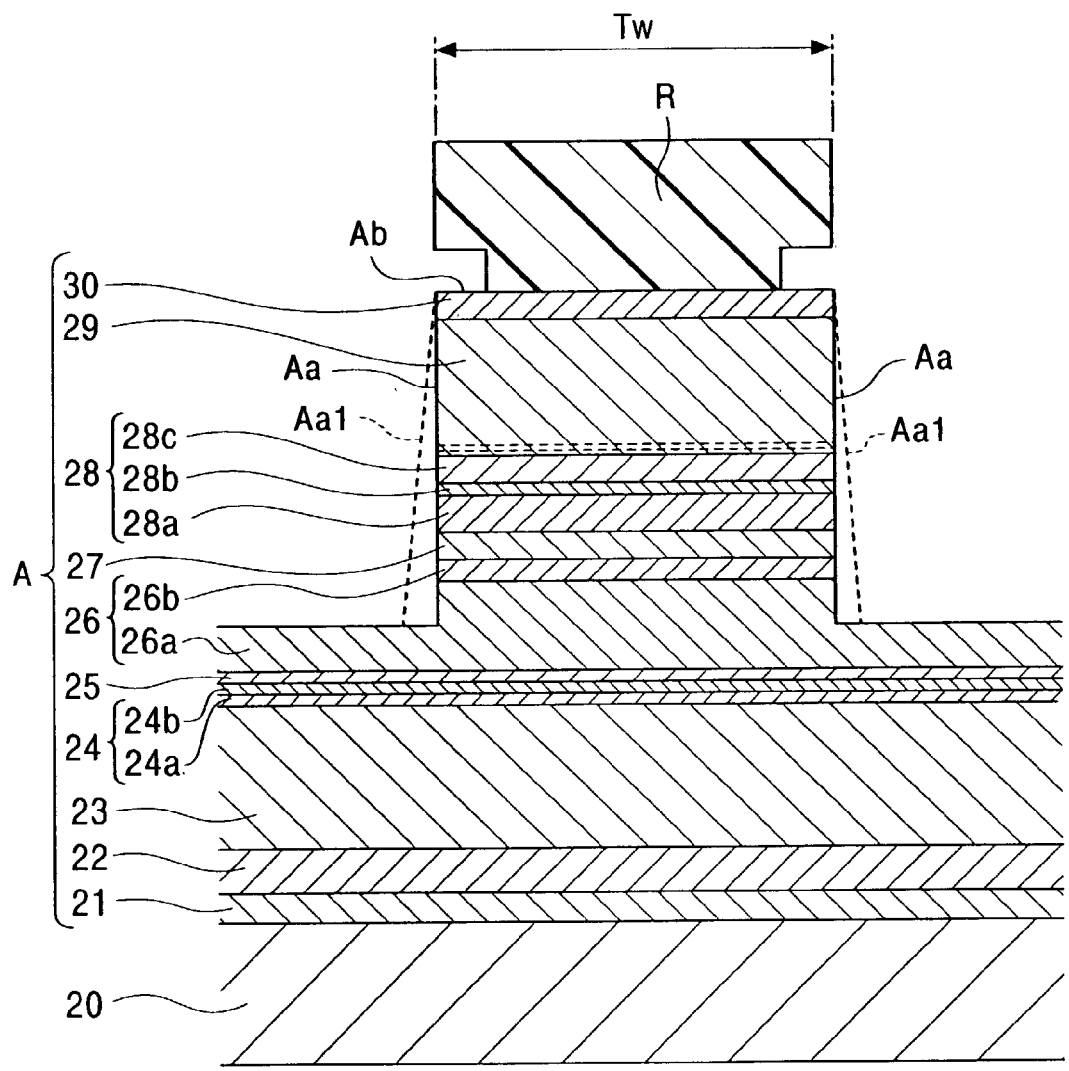
FIG. 15 is a sectional view which shows a step in the method for fabricating the magnetic sensing element in the embodiment of the present invention.

The side regions B not covered with the resist layer R are then trimmed by ion milling in a direction perpendicular to the surface Ab of the multilayer film A, from the protective layer 30 to a portion of the first magnetic sublayer 26a of the free magnetic layer 26, as shown in FIG. 15.

As a result of the ion milling in the fabrication step shown in FIG. 15, the width in the track width direction of the multilayer film A from the protective layer 30 to the middle to the first magnetic sublayer 26a of the free magnetic layer 26 is equal to the track width Tw, and the widths in the track width direction of the rest of the first magnetic sublayer 26a, the ferromagnetic layer 24, the second antiferromagnetic layer 23, the seed layer 22, and the underlayer 21 are larger than the track width Tw.

The side faces Aa in the track width direction (X direction) of the multilayer film A from the protective layer 30 to a portion of the first magnetic sublayer 26a of the free magnetic layer 26 are continuous planes perpendicular to the surface Ab of the multilayer film A. However, the side faces in the track width direction from the protective layer 30 to a portion of the first magnetic sublayer 26a of the free magnetic layer 26 may be inclined planes Aa1 as indicated by dotted lines in FIG. 15.

After the ion milling step is completed, insulating layers 32 composed of $Al_2O_3$ or $SiO_2$ are formed on both side faces in the track width direction of the multilayer film A from the protective layer 30 to the middle of the first magnetic sublayer 26a of the free magnetic layer 26. The insulating material for the insulating layers 32 also adheres to the upper surface and side faces of the resist layer R. After the insulating layers 32 are formed, the resist layer R is removed by the lift-off process using an organic solvent or the like.

Figure 16:
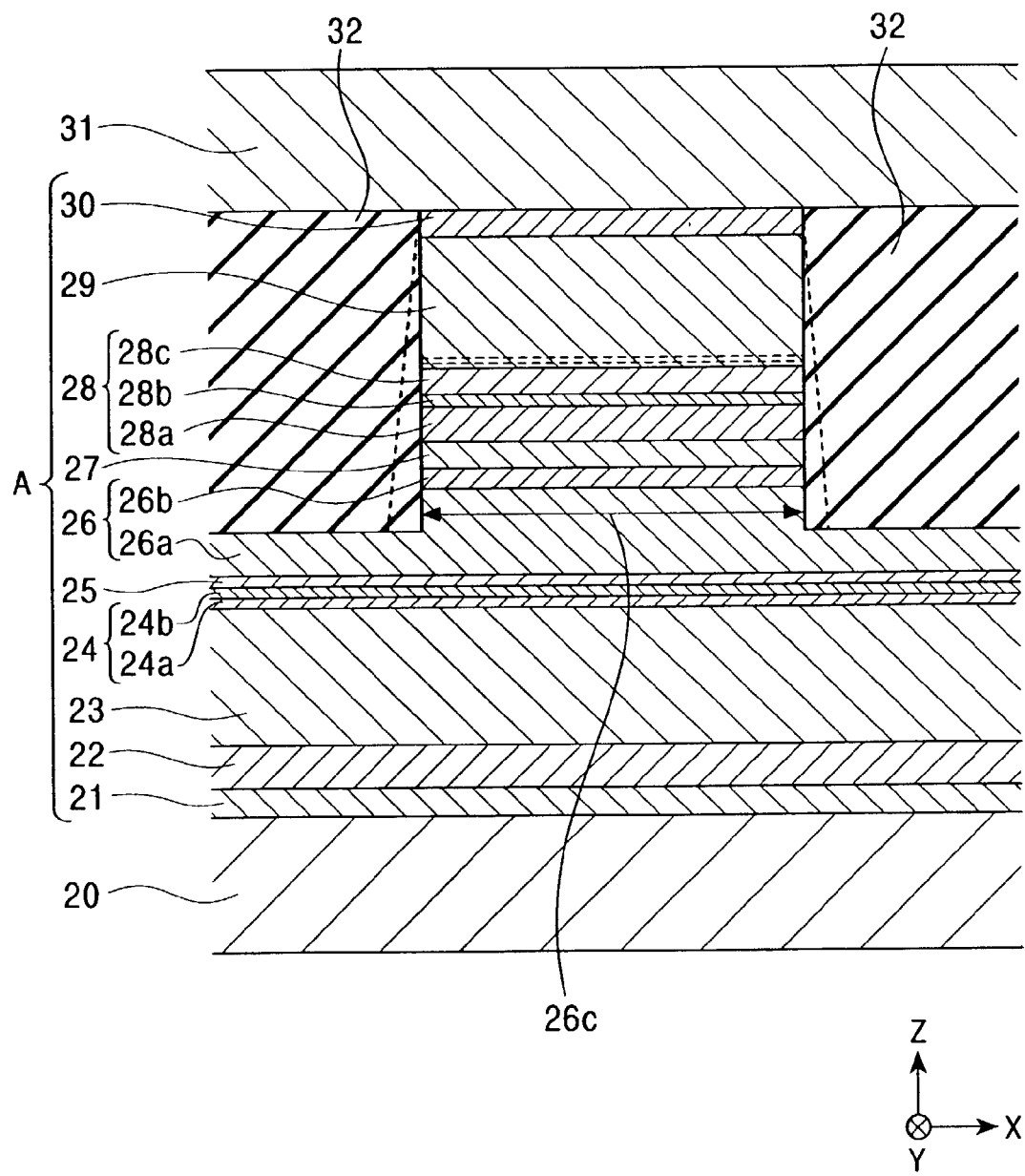
FIG. 16 is a sectional view which shows a step in the method for fabricating the magnetic sensing element in the embodiment of the present invention.
Figure 17:
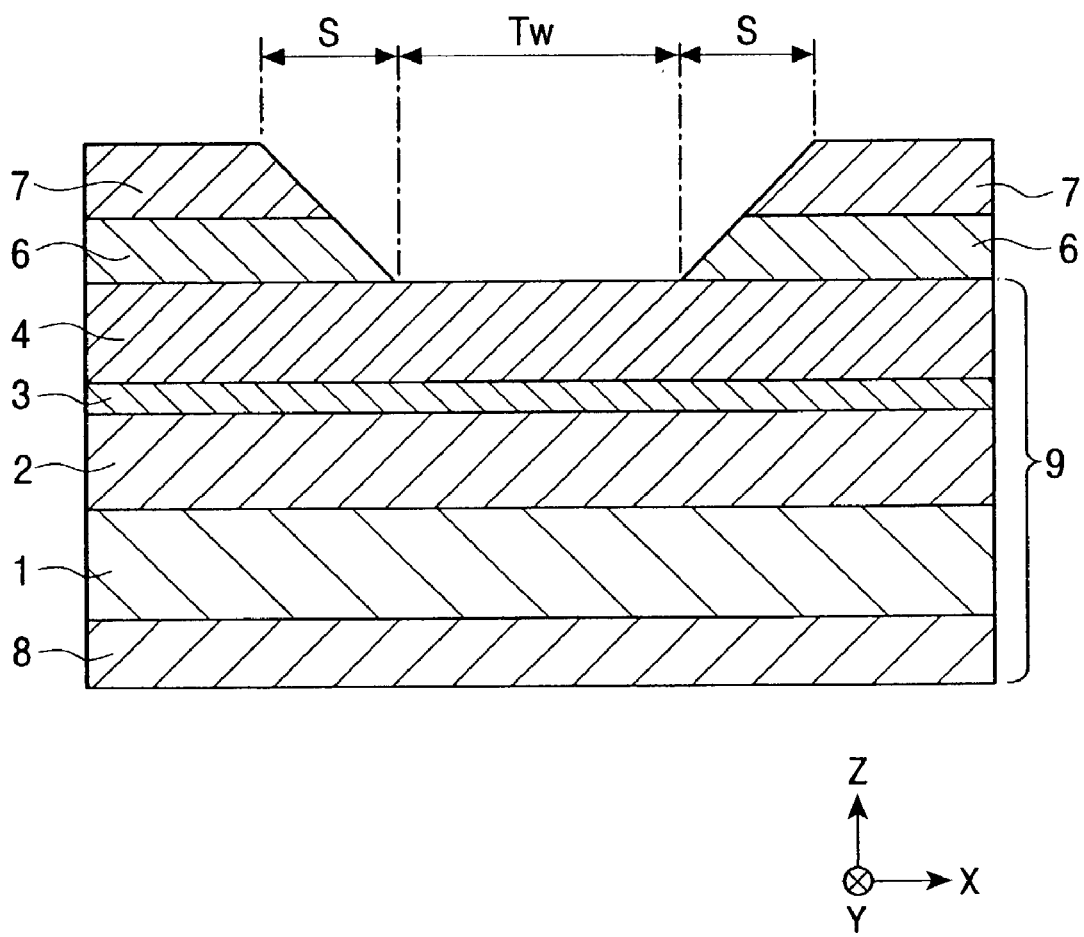
FIG. 17 is a sectional view of a conventional magnetic sensing element.
Figure 18:
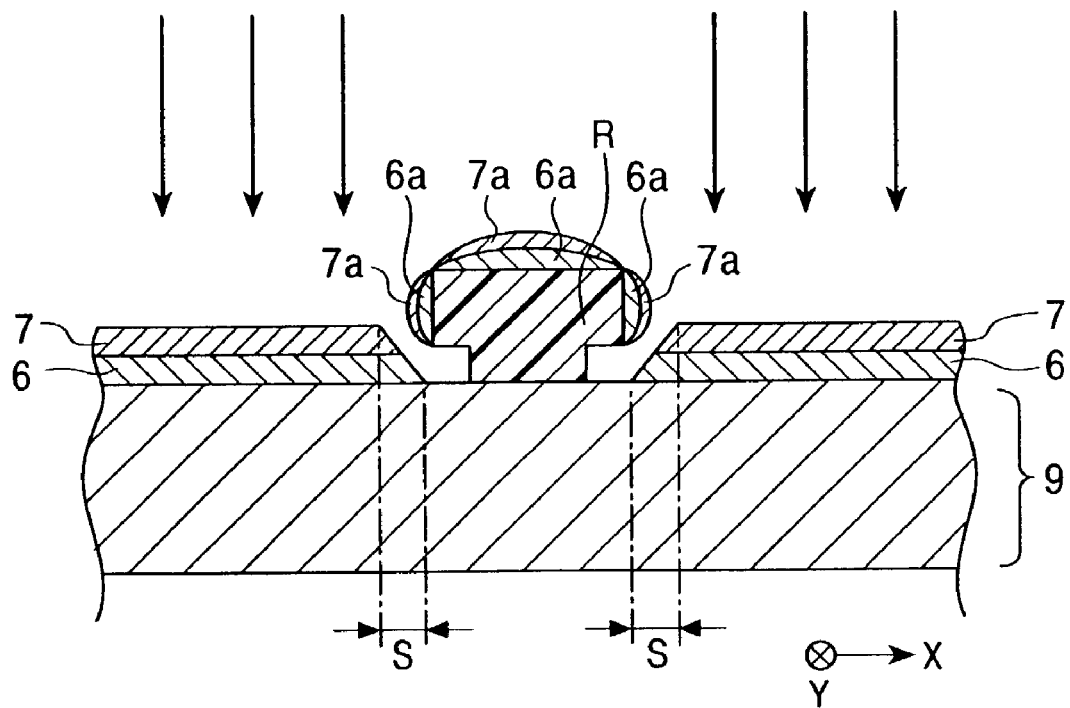
FIG. 18 is a sectional view which shows a step in a method for fabricating a conventional magnetic sensing element.
Figure 19:
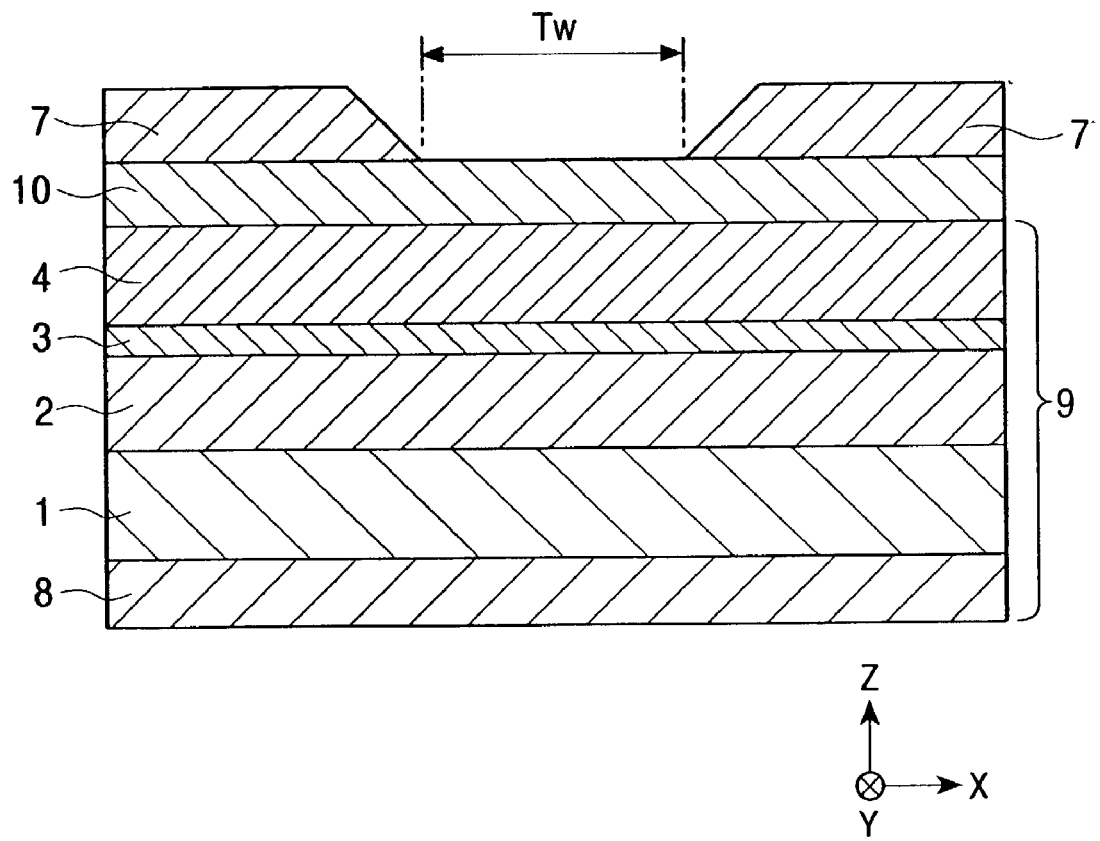
FIG. 19 is a sectional view of a conventional magnetic sensing element.

Furthermore, in the fabrication step shown in FIG. 16, an upper shielding layer 31 which also serves as an upper electrode layer is formed on the insulating layers 32 and the protective layer 30 of the multilayer film A. The magnetic sensing element shown in FIG. 1 is thereby obtained.

In the present invention, the magnetization direction of the ferromagnetic layer 24 is strongly pinned in a direction substantially perpendicular to the magnetization direction of the pinned magnetic layer 28 by increasing the exchange coupling magnetic field between the second antiferromagnetic layer 23 and the ferromagnetic layer 24, and then the free magnetic layer 26 is aligned in a single domain state and the magnetization of the free magnetic layer 26 is reliably directed in a direction substantially perpendicular to the magnetization direction of the pinned magnetic layer 28 by setting the magnitude of the interlayer coupling magnetic field between the free magnetic layer 26 and the ferromagnetic layer 24 smaller than the magnitude of the exchange coupling magnetic field, and also the magnetization direction of the free magnetic layer 26 must be varied by the leakage magnetic field.

In order to increase the exchange coupling magnetic field between the second antiferromagnetic layer 23 and the ferromagnetic layer 24 and to set the magnitude of the interlayer coupling magnetic field between the free magnetic layer 26 and the ferromagnetic layer 24 smaller than the magnitude of the exchange coupling magnetic field, in the fabrication step shown in FIG. 11, the ferromagnetic layer 24 and the free magnetic layer 26 are formed so that the magnitude of the magnetic moment (Ms×t) per unit area of the ferromagnetic layer 24 is smaller than the magnitude of the magnetic moment (Ms×t) per unit area of the free magnetic layer 26.

Specifically, the ratio of the magnitude of the magnetic moment (Ms×t) per unit area of the free magnetic layer 26 to the magnitude of the magnetic moment (Ms×t) per unit area of the ferromagnetic layer 24 is set in the range of 3 to 20.

In the ferromagnetic layer 24, by forming the second ferromagnetic sublayer 24b in contact with the nonmagnetic layer 25 using NiFe (Permalloy) or NiFeX, wherein X is at least one element selected from the group consisting of Al, Si, Ti, V, Cr, Mn, Cu, Zr, Nb, Mo, Ru, Rh, Hf, Ta, W, Ir, and Pt, the magnitude of the interlayer coupling magnetic field between the free magnetic layer 26 and the ferromagnetic layer 24 is appropriately decreased.

In the free magnetic layer 26, by forming the first magnetic sublayer 26a in contact with the nonmagnetic layer 25 using NiFe (Permalloy) or NiFeX, wherein X is at least one element selected from the group consisting of Al, Si, Ti, V, Cr, Mn, Cu, Zr, Nb, Mo, Ru, Rh, Hf, Ta, W, Ir, and Pt, the magnitude of the interlayer coupling magnetic field between the free magnetic layer 26 and the ferromagnetic layer 24 is appropriately decreased.

In accordance with the fabrication method described above, adjustments are made in two stages, i.e., by the magnitude of the exchange coupling magnetic field between the second antiferromagnetic layer 23 and the ferromagnetic layer 24 and by the magnitude of the interlayer coupling magnetic field between the ferromagnetic layer 24 and the free magnetic layer 26, and thus the alignment in a single domain state of the free magnetic layer 26 and fine control of the magnetization direction of the free magnetic layer 26 can be easily performed.

Therefore, since the alignment in a single domain state and control of the magnetization direction of the free magnetic layer 26 can be performed appropriately and easily, the magnetic sensing element can be made suitable for further track narrowing.

In the structure in which the ferromagnetic layer 24 and the second antiferromagnetic layer 23 are disposed below the region 26c corresponding to the track width of the free magnetic layer 26 with the nonmagnetic layer 25 therebetween, the magnetization of the free magnetic layer 26 can also be reliably directed in a direction substantially perpendicular to the magnetization direction of the pinned magnetic layer 28 and the magnetization direction of the free magnetic layer 26 can be varied by the leakage magnetic field. Consequently, in the region 26c corresponding to the track width of the free magnetic layer 26, the magnetization direction of the central part and the magnetization direction of both ends do not substantially differ from each other.

The layers, such as the nonmagnetic layer 25, the ferromagnetic layer 24, and the second antiferromagnetic layer 23, for applying longitudinal bias magnetic fields to the free magnetic layer 26 are formed all over in the step shown in FIG. 11, and the both side regions B of the multilayer film A are simply trimmed in the fabrication steps shown in FIGS. 14 and 15. Therefore, the fabrication process is simplified. Since the accuracy of the track width Tw is improved, track narrowing is facilitated.

The magnetic sensing element shown in FIG. 4 or 9 may be fabricated by the same method as that described above.

In the present invention, by forming the nonmagnetic material layer 27 of the magnetic sensing element using an insulating material, such as $Al_2O_3$ or $SiO_2$, a magnetic sensing element referred to as a tunneling magnetoresistive element may be produced.

Additionally, the magnetic sensing element of the present invention is also applicable to magnetic heads for tape recording, magnetic sensors, etc., in addition to the use for the thin-film magnetic head built in the hard disk drive.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims.

EXAMPLES

Magnetic sensing elements, each having a free magnetic layer 26 disposed above a pinned magnetic layer 28, such as the magnetic sensing element shown in FIG. 5, were used for experimentation. The film structure of the free magnetic layer 26 and film structure of the ferromagnetic layer 24 were varied, and the preferred materials for the free magnetic layer 26 and the ferromagnetic layer 24, the ratio of the magnetic moment (Ms×t) per unit area of the free magnetic layer 26 to the magnetic moment (Ms×t) per unit area of the ferromagnetic layer 24, etc., were evaluated.

First, in Table 1 below, with respect to various materials for the free magnetic layer 26 and layer structures of the free magnetic layer 26, the ratio of the magnetic moment (Ms×t) per unit area of the free magnetic layer 26 to the magnetic moment (Ms×t) per unit area of the ferromagnetic layer 24, read sensitivity η, and hysteresis are shown.

TABLE 1

| | Ferromagnetic Layer 24 | | Free Magnetic Layer 26 | | | Magnetic Moment Ratio | η (%) | Hysteresis (%) |
| | First Ferromagnetic Sublayer 10Å Fixed | Second Ferromagnetic Sublayer 10Å Fixed | Free (1) | Free (2) 120Å in total Fixed | Free (3) | | | |
|---|---|---|---|---|---|---|---|---|
| Example 1 | $Co_{80}Fe_{12}Cr_8$ | $Ni_{80}Fe_{20}$ | $Ni_{80}Fe_{20}(20Å)$ | $Co_{90}Fe_{10}(100Å)$ | | 11.4 | 22 | 1.6 |
| Example 2 | ↑ | ↑ | $Ni_{85}Fe_{10}Nb_5(20Å)$ | $Co_{90}Fe_{10}(100Å)$ | | 10.8 | 32 | 0.9 |
| Example 3 | ↑ | ↑ | $Ni_{80}Fe_{20}(100Å)$ | | $Co_{90}Fe_{10}(20Å)$ | 7.8 | 24 | 1.2 |
| Example 4 | ↑ | ↑ | $Ni_{85}Fe_{10}Nb_5(100Å)$ | | ↑ | 5.6 | 19 | 0.8 |
| Example 5 | ↑ | ↑ | $Ni_{85}Fe_{10}Nb_5(20Å)$ | $Ni_{80}Fe_{20}(80Å)$ | $Co_{90}Fe_{10}(20Å)$ | 7.9 | 28 | 0.5 |
| Example 6 | ↑ | ↑ | | $Ni_{80}Fe_{20}(120)$ | | 7.0 | 21 | 0.9 |
| Example 7 | ↑ | ↑ | | $Ni_{85}Fe_{10}Nb_5(120)$ | | 4.2 | 18 | 0.6 |
| Comparative Example 1 | ↑ | ↑ | $Co_{90}Fe_{10}(20Å)$ | $Ni_{80}Fe_{20}(80Å)$ | $Co_{90}Fe_{10}(20Å)$ | 8.8 | 8 | 3.4 |
| Comparative Example 2 | ↑ | ↑ | $Co_{90}Fe_{10}(20Å)$ | $Ni_{85}Fe_{10}Nb_5(80Å)$ | ↑ | 6.8 | 7 | 3.1 |

TABLE 1-continued

| | Ferromagnetic Layer 24 | | Free Magnetic Layer 26 | | | Magnetic | | |
|---|---|---|---|---|---|---|---|---|
| | First Ferromagnetic Sublayer 10Å Fixed | Second Ferromagnetic Sublayer 10Å Fixed | Free (1) | Free (2) 120Å in total Fixed | Free (3) | Moment Ratio | η (%) | Hysteresis (%) |
| Comparative Example 3 | ↑ | ↑ | | $Co_{90}Fe_{10}(120)$ | | 12.8 | 9 | 6.5 |
| Comparative Example 4 | $Co_{90}Fe_{10}$ | | $Co_{90}Fe_{10}(20Å)$ | $Ni_{80}Fe_{20}(80Å)$ | $Co_{90}Fe_{10}(20Å)$ | 4.4 | 6 | 3.2 |
| Comparative Example 5 | ↑ | | $Co_{90}Fe_{10}(20Å)$ | $Ni_{85}Fe_{10}Nb_{5}(80Å)$ | ↑ | 3.4 | 4 | 3.1 |
| Comparative Example 6 | ↑ | | | $Co_{90}Fe_{10}(120)$ | | 6.3 | 7 | 5.5 |

As shown in Table 1, in each of Examples 1 to 7 and Comparative Examples 1 to 3, the first ferromagnetic sublayer 24a of the ferromagnetic layer 24 is composed of $Co_{80at\%}Fe_{12at\%}Cr_{8at\%}$ with a thickness of 10 Å, and the second ferromagnetic sublayer 24b is composed of $Ni_{80at\%}Fe_{20at\%}$ with a thickness of 10 Å. In each of Comparative Examples 4 to 6, the ferromagnetic layer 24 is composed of $Co_{90at\%}Fe_{10at\%}$ with a thickness of 20 Å.

In the free magnetic layer 26 column in Table 1, the free magnetic layer 26 is divided into three, i.e., "Free (1)" "Free (2)", and "Free (3)". Herein, Free (1) represents a sublayer in contact with the nonmagnetic layer 25 shown in FIG. 1, and Free (3) represents a sublayer in contact with the nonmagnetic material layer 27 shown in FIG. 1. Free (2) represents an intermediate sublayer between Free (1) and Free (3). For example, in Example 1, Free (2) and Free (3) are combined to form a single layer, and the free magnetic layer 26 has a two-layer structure. The thickness of each sublayer in the free magnetic layer 26 is put in parentheses following the composition.

The magnetic sensing elements shown in Table 1 were prepared so as to have different number of sublayers constituting the free magnetic layer 26, the sublayers being composed of different materials with different thicknesses. The ratio of the magnetic moment (Ms×t) per unit area of the free magnetic layer 26 to the magnetic moment (Ms×t) per unit area of the ferromagnetic layer 24, read sensitivity η, and hysteresis were evaluated. The total thickness of the free magnetic layer 26 was set at 120 Å.

The read sensitivity η was calculated as follows.

(Change in resistance due to applied magnetic field with assumed leakage magnetic field of ±40 Oe from recording medium/maximum change in resistance within applied magnetic field of ±5 kOe)×100

The hysteresis was calculated as follows.

(Change in hysteresis resistance remaining at origin of hysteresis loop/change in resistance in applied magnetic field of ±40 Oe)×100

Additionally, 1 Oe corresponds to approximately 79 A/m. From Table 2 onward, read sensitivity η and hysteresis were calculated in the same manner as that described above.

As shown in Table 1, Examples 1 to 7 had higher read sensitivity η and lower hysteresis compared to Comparative Examples 1 to 6, thus exhibiting satisfactory read characteristics.

In Table 2 below, the materials for the first ferromagnetic sublayer 24a and the second ferromagnetic sublayer 24b constituting the ferromagnetic layer 24 were varied, and the ratio of the magnetic moment (Ms×t) per unit area of the free magnetic layer 26 to the magnetic moment (Ms×t) per unit area of the ferromagnetic layer 24, read sensitivity η, and hysteresis were evaluated. Both the thickness of the first ferromagnetic sublayer 24a and the thickness of the second ferromagnetic sublayer 24b were fixed at 10 Å.

In Example 2 and Examples 8 to 13, the free magnetic layer 26 had a two-layer structure, the first magnetic sublayer 26a (i.e., Free (1) in Table 2) was composed of $Ni_{85at\%}Fe_{10at\%}Nb_{5at\%}$ with a thickness of 20 Å, and the second magnetic sublayer 26b (i.e., Free (2) and Free (3) combined in Table 2) was composed of $Co_{90at\%}Fe_{10at\%}$ with a thickness of 100 Å. In Examples 14 and 15, the free magnetic layer 26 had a three-layer structure, the first magnetic sublayer 25a (i.e., Free (1) in Table 2) was composed of $Ni_{85at\%}Fe_{10at\%}Nb_{5at\%}$ with a thickness of 20 Å, the second magnetic sublayer 26b (i.e., Free (3) in Table 2) was composed of $Co_{90at\%}Fe_{10at\%}$ with a thickness of 20 Å, and the intermediate magnetic sublayer (i.e., Free (2) in Table 2) was composed of $Ni_{80at\%}Fe_{20at\%}$ with a thickness of 80 Å.

TABLE 2

| | Ferromagnetic Layer 24 | | Free Magnetic Layer 26 | | | Magnetic | | |
|---|---|---|---|---|---|---|---|---|
| | First Ferromagnetic Sublayer 10Å Fixed | Second Ferromagnetic Sublayer 10Å Fixed | Free (1) | Free (2) 120Å in total Fixed | Free (3) | Moment Ratio | η (%) | Hysteresis (%) |
| Example 2 | $Co_{80}Fe_{12}Cr_{8}$ | $Ni_{80}Fe_{20}$ | $Ni_{85}Fe_{10}Nb_{5}(20Å)$ | $Co_{90}Fe_{10}(100Å)$ | | 10.8 | 32 | 0.9 |
| Example 8 | $Co_{90}Fe_{10}$ | ↑ | ↑ | ↑ | | 6.8 | 26 | 1.4 |
| Example 9 | $Co_{80}Fe_{12}Cr_{8}$ | $Ni_{85}Fe_{10}Nb_{5}$ | ↑ | ↑ | | 14.4 | 38 | 1.2 |
| Example 10 | $Co_{90}Fe_{10}$ | ↑ | ↑ | ↑ | | 7.7 | 27 | 1.3 |

TABLE 2-continued

| | Ferromagnetic Layer 24 | | Free Magnetic Layer 26 | | | | | |
|---|---|---|---|---|---|---|---|---|
| | First | Second | | | | | | |
| | Ferromagnetic Sublayer 10Å Fixed | Ferromagnetic Sublayer 10Å Fixed | Free (1) | Free (2) 120Å in total Fixed | Free (3) | Magnetic Moment Ratio | η (%) | Hysteresis (%) |
| Example 11 | $Co_{80}Fe_{12}Cr_8$ | | | ↑ | | 13.6 | 20 | 1.1 |
| Example 12 | $Co_{90}Fe_{10}$ | | | ↑ | | 5.6 | 12 | 0.8 |
| Example 13 | $Ni_{80}Fe_{20}$ | | | ↑ | | 8.9 | 22 | 2.3 |
| Example 14 | $Co_{80}Fe_{12}Cr_8$ | $Ni_{80}Fe_{20}$ | $Ni_{85}Fe_{10}Nb_5(20Å)$ | $Ni_{80}Fe_{20}(80Å)$ | $Co_{90}Fe_{10}(20Å)$ | 7.9 | 28 | 0.5 |
| Example 15 | ↑ | $Ni_{85}Fe_{10}Nb_5$ | ↑ | ↑ | ↑ | 10.3 | 37 | 1.2 |

With respect to all the examples shown in Table 2, the read sensitivity η was high and the hysteresis was low as in the case of the examples shown in Table 1, and thus satisfactory read characteristics were exhibited.

In Table 3 below, the materials for the ferromagnetic layer 24 and the free magnetic layer 26 were fixed, and the thickness of the second magnetic sublayer 26b (i.e., Free (2) and Free (3) combined in Table 3) constituting the free magnetic layer 26 was varied. As shown in Table 3, the first ferromagnetic sublayer 24a constituting the ferromagnetic layer 24 was composed of $Co_{80at\,\%}Fe_{12at\,\%}Cr_{8at\,\%}$ with a thickness of 10 Å. The second ferromagnetic sublayer 24b constituting the ferromagnetic layer 24 was composed of $Ni_{80at\,\%}Fe_{20at\,\%}$ with a thickness of 10 Å. The first magnetic sublayer 26a (i.e., Free (1) in Table 3) was composed of $Ni_{85at\,\%}Fe_{10at\,\%}Nb_{5at\,\%}$ with a thickness of 20 Å. The second magnetic sublayer 26b constituting the free magnetic layer 26 was composed of $Co_{90at\,\%}Fe_{10at\,\%}$.

TABLE 3

| | Ferromagnetic Layer 24 | | Free Magnetic Layer 26 | | | | |
|---|---|---|---|---|---|---|---|
| | First | Second | | | | | |
| | Ferromagnetic Sublayer 10Å Fixed | Ferromagnetic Sublayer 10Å Fixed | Free (1) $Ni_{85}Fe_{10}Nb_5$ Fixed | Free (2) Free (3) $Co_{90}Fe_{10}$ Fixed | Magnetic Moment Ratio | η (%) | Hysteresis (%) |
| Example 16 | $Co_{80}Fe_{12}Cr_8$ | $Ni_{80}Fe_{20}$ | 20Å | 20Å | 3.1 | 12 | 0.2 |
| Example 17 | ↑ | ↑ | ↑ | 40 | 5.0 | 15 | 0.4 |
| Example 18 | ↑ | ↑ | ↑ | 60 | 6.7 | 21 | 0.4 |
| Example 19 | ↑ | ↑ | ↑ | 80 | 9.0 | 27 | 0.8 |
| Example 2 | ↑ | ↑ | ↑ | 100 | 10.8 | 32 | 0.9 |
| Example 20 | ↑ | ↑ | ↑ | 120 | 12.7 | 37 | 1.2 |
| Example 21 | ↑ | ↑ | ↑ | 140 | 14.4 | 39 | 1.8 |
| Example 22 | ↑ | ↑ | ↑ | 160 | 16.5 | 43 | 2.4 |
| Example 23 | ↑ | ↑ | ↑ | 180 | 18.2 | 47 | 2.8 |
| Comparative Example 7 | ↑ | ↑ | ↑ | 5 | 1.1 | 2 | 0.1 |
| Comparative Example 8 | ↑ | ↑ | ↑ | 10 | 1.5 | 4 | 0.1 |
| Comparative Example 9 | ↑ | ↑ | ↑ | 15 | 2.4 | 9 | 0.1 |
| Comparative Example 10 | ↑ | ↑ | ↑ | 200 | 21.6 | 57 | 3.7 |
| Comparative Example 11 | ↑ | ↑ | ↑ | 300 | 31.5 | 62 | 5.2 |

Next, in Table 4 below, the materials for the ferromagnetic layer 24 and the free magnetic layer 26 were fixed, and the thickness of the second ferromagnetic sublayer 24b constituting the ferromagnetic layer 24 was varied. As shown in Table 4, the first ferromagnetic sublayer 24a constituting the ferromagnetic layer 24 was composed of $Co_{80at\,\%}Fe_{12at\,\%}Cr_{8at\,\%}$ with a thickness of 10 Å. The second ferromagnetic sublayer 24b was composed of $Ni_{80at\,\%}Fe_{20at\,\%}$. The first magnetic sublayer 26a (Free (1) in Table 4) constituting the free magnetic layer 26 was composed of $Ni_{85at\,\%}Fe_{10at\,\%}Nb_{5at\,\%}$ with a thickness of 20 Å. The second magnetic sublayer 26b was composed of $Co_{90at\,\%}Fe_{10at\,\%}$ with a thickness of 100 Å.

TABLE 4

| | Ferromagnetic Layer 24 | | Free Magnetic Layer 26 | | Magnetic | | |
|---|---|---|---|---|---|---|---|
| | First Ferromagnetic Sublayer | Second Ferromagnetic Sublayer | | | | | |
| | $Co_{80}Fe_{12}Cr_8$ Fixed | $Ni_{80}Fe_{20}$ Fixed | Free (1) 20Å Fixed | Free (2) Free (3) 100Å Fixed | Moment Ratio | η (%) | Hysteresis (%) |
| Example 24 | 10Å | 2 | $Ni_{85}Fe_{10}Nb_5$(20Å) | $Co_{90}Fe_{10}$(100Å) | 19.2 | 46 | 2.8 |
| Example 25 | ↑ | 4 | ↑ | ↑ | 16.6 | 43 | 2.5 |
| Example 26 | ↑ | 6 | ↑ | ↑ | 14.2 | 38 | 2.2 |
| Example 27 | ↑ | 10 | ↑ | ↑ | 10.5 | 35 | 1.4 |
| Example 2 | ↑ | 20 | ↑ | ↑ | 10.8 | 32 | 0.9 |
| Example 28 | ↑ | 30 | ↑ | ↑ | 4.4 | 21 | 0.8 |
| Example 29 | ↑ | 40 | ↑ | ↑ | 3.4 | 14 | 0.7 |
| Comparative Example 12 | ↑ | 0 | ↑ | ↑ | 26.7 | 59 | 4.4 |
| Comparative Example 13 | ↑ | 1 | ↑ | ↑ | 24.5 | 53 | 3.4 |
| Comparative Example 14 | ↑ | 50 | ↑ | ↑ | 2.9 | 8 | 0.5 |
| Comparative Example 15 | ↑ | 60 | ↑ | ↑ | 2.6 | 7 | 0.5 |

In Tables 3 and 4, the ratio of the magnetic moment (Ms×t) per unit area of the free magnetic layer 26 to the magnetic moment (Ms×t) per unit area of the ferromagnetic layer 24 was evaluated.

With respect to each example shown in Tables 3 and 4, the magnetic moment ratio is in the range of 3 to 20.

As the magnetic ratio increases, the free magnetic layer is varied more sensitively with an external magnetic field. If the ratio becomes excessively large, hysteresis increased and the error rate is increased, resulting in degradation in read characteristics.

For example, in Comparative Examples 10 and 11 shown in Table 3, the magnetic moment ratio is large, and read sensitivity η exceeds 50%. However, hysteresis exceeds 3%, which is degraded compared to the examples shown in Table 3.

As described above the magnetic moment ratio must be evaluated in consideration of read sensitivity η and hysteresis. In each example shown in Tables 3 and 4, the magnetic moment ratio is 3 to 20, and the read sensitivity η is 10% to 50%. The hysteresis is 3% or less.

As a result, it has been found that by setting the magnetic moment ratio in the range of 3 to 20, read sensitivity η can be set at 10% to 50% and hysteresis can be set at 3% or less, resulting in satisfactory read characteristics.

Next, based on Tables 1 and 2, preferred materials and layer structures for the free magnetic layer 26 and the ferromagnetic layer 24 will be described.

For example, in Comparative Examples 1 to 6 shown in Table 1, the magnetic moment ratio is in the range of 3 to 20. Although the magnetic moment ratio is within the preferred range of the present invention, read sensitivity η is less than 10% and hysteresis is higher than 3%. The reason for this is considered to be that the first magnetic sublayer 26a of the free magnetic layer 26 is composed of CoFe.

Interlayer coupling is generated between the first magnetic sublayer 26a of the free magnetic layer 26 and the second ferromagnetic sublayer 24b of the ferromagnetic layer 24. The interlayer coupling must not be excessively strong. If the interlayer coupling is excessively strong, the magnetization of the free magnetic layer 26 is not easily rotated by the external magnetic field, resulting in a decrease in read sensitivity η.

However, if CoFe is used for the first magnetic sublayer 26a of the free magnetic layer 26 as shown in Table 1, interlayer coupling with the second ferromagnetic sublayer 24b of the ferromagnetic layer 24 is considered to be strengthened. Therefore, although the magnetic moment ratio is within the preferred range, read sensitivity η is decreased, and hysteresis is increased.

As a result, it has been found that preferably, a Co-based ferromagnetic material is not used for the first magnetic sublayer 26a constituting the free magnetic layer 26. In each of the examples shown in Tables 1 to 4, a NiFe alloy is used for the first magnetic sublayer 26a of the free magnetic layer 26. Therefore, in the present invention, the first magnetic sublayer 26a of the free magnetic layer 26 is preferably composed of NiFe or NiFeX, wherein X is at least one element selected from the group consisting of Al, Si, Ti, V, Cr, Mn, Cu, Zr, Nb, Mo, Ru, Rh, Hf, Ta, W, Ir, and Pt.

With respect to the number of sublayers in the free magnetic layer 26, for example, as in the case of Examples 6 and 7 in Table 1, the free magnetic layer 26 may be a single layer. As in the case of Examples 1 to 4, the free magnetic layer 26 may have a two-layer structure, or as in the case of Example 5, the free magnetic layer 26 may have a three-layer structure.

However, the free magnetic layer 26 is preferably composed of at least two layers. If the free magnetic layer 26 is a single layer composed of a NiFe-based alloy as in the case of Example 6 or 7, Ni, etc., is easily diffused into the nonmagnetic material layer 27 shown in FIG. 1, resulting in a decrease in the rate of change in magnetoresistance. Therefore, preferably, the free magnetic layer 26 includes a magnetic region composed of NiFe or NiFeX on the side in contact with the nonmagnetic layer 25 shown in FIG. 1 and a magnetic region composed of a Co-containing ferromagnetic material on the side in contact with the nonmagnetic material layer 27.

With respect to the material for the ferromagnetic layer 24, the second ferromagnetic sublayer 24b is preferably composed of a NiFe-based alloy so that interlayer coupling with the free magnetic layer 26 is not greatly strengthened. Most of the examples shown in Tables 1 to 4 are composed of such a material. However, as in the case of Example 11 or 12, even if the entire ferromagnetic layer 24 is composed of a CoFe-based ferromagnetic material, the magnetic moment ratio is in the range of 3 to 20, and read sensitivity η and hysteresis are in the preferred ranges.

The ferromagnetic layer 24 must generate a large exchange coupling magnetic field with the second antiferromagnetic layer 23 shown in FIG. 1 so that its magnetization is strongly pinned in a predetermined direction. Therefore, the ferromagnetic layer 24 preferably includes a magnetic region composed of a Co-containing ferromagnetic material on the side in contact with the second antiferromagnetic layer 23.

With respect to the number of sublayers of the ferromagnetic layer 24, as in the case of Examples 11 to 13 shown in Table 2, the ferromagnetic layer 24 may have a single-layer structure. Alternatively, the ferromagnetic layer 24 may have a two-layer structure, or a structure composed of three or more sublayers.

However, preferably, the ferromagnetic layer 24 has a structure composed of at least two sublayers. The reason for this is that by forming a magnetic region composed of a Co-containing ferromagnetic material on the side in contact with the second antiferromagnetic layer 23 in order to generate a large exchange coupling magnetic field with the second antiferromagnetic layer 23 and by forming a magnetic region composed of NiFe or NiFeX on the side in contact with the nonmagnetic layer 25 in order to appropriately weaken interlayer coupling with the free magnetic layer 26, a magnetic sensing element having superior read characteristics can be produced.

What is claimed is:

1. A magnetic sensing element comprising a multilayer film comprising:
    a first antiferromagnetic layer;
    a pinned magnetic layer, a magnetization direction of the pinned magnetic layer being pinned by the first antiferromagnetic layer;
    a nonmagnetic material layer;
    a free magnetic layer, a magnetization direction of the free magnetic layer being varied by an external magnetic field, each of the pinned magnetic layer and the free magnetic layer comprising a ferromagnetic material; and
    a ferromagnetic layer and a second antiferromagnetic layer disposed one of above and below at least a region corresponding to a track width of the free magnetic layer with a nonmagnetic layer therebetween, a magnetization direction of the ferromagnetic layer being oriented substantially perpendicular to the magnetization direction of the pinned magnetic layer by an exchange coupling magnetic field between the ferromagnetic layer and the second antiferromagnetic layer, wherein the ferromagnetic layer has a laminated structure comprising a sublayer comprising one of NiFe and NiFeX, wherein X is at least one element selected from the group consisting of Al, Si, Ti, V, Cr, Mn, Cu, Zr, Nb, Mo, Ru, Rh, Hf, Ta, W, Ir, and Pt, in contact with the nonmagnetic layer, and a sublayer comprising a Co-containing ferromagnetic material in contact with the second antiferromagnetic layer.

2. A magnetic sensing element according to claim 1, wherein the free magnetic layer is aligned in a single domain state by an interlayer coupling magnetic field between the free magnetic layer and the ferromagnetic layer with the nonmagnetic layer therebetween, and the magnetization of the free magnetic layer is directed substantially perpendicular to the magnetization direction of the pinned magnetic layer.

3. A magnetic sensing element according to claim 1, wherein the nonmagnetic layer comprises at least one material selected from the group consisting of Ru, Rh, Ir, Cr, Re, and Cu.

4. A magnetic sensing element according to claim 3, wherein the nonmagnetic layer comprises Ru, and a thickness of the nonmagnetic layer is one of in the range of 8 to 11 Å and in the range of 15 to 21 Å.

5. A magnetic sensing element according to claim 2, wherein a magnitude of the interlayer coupling magnetic field between the free magnetic layer and the ferromagnetic layer is smaller than a magnitude of the exchange coupling magnetic field between the second antiferromagnetic layer and the ferromagnetic layer.

6. A magnetic sensing element according to claim 1, wherein a magnitude of the magnetic moment per unit area of the ferromagnetic layer is smaller than a magnitude of the magnetic moment per unit area of the free magnetic layer.

7. A magnetic sensing element according to claim 6, wherein a ratio of the magnitude of the magnetic moment per unit area of the free magnetic layer to the magnitude of the magnetic moment per unit area of the ferromagnetic layer is in the range of 3 to 20.

8. A magnetic sensing element according to claim 1, wherein the free magnetic layer comprises a magnetic region comprising one of NiFe and NiFeX, wherein X is at least one element selected from the group consisting of Al, Si, Ti, V, Cr, Mn, Cu, Zr, Nb, Mo, Ru, Rh, Hf, Ta, W, Ir, and Pt, at least on a side in contact with the nonmagnetic layer.

9. A magnetic sensing element according to claim 8, wherein the free magnetic layer comprises a magnetic region comprising a Co-containing ferromagnetic material on the side in contact with the nonmagnetic material layer.

10. A magnetic sensing element according to claim 1, wherein the Co-containing ferromagnetic material is one of CoFe and CoFeCr.

11. A magnetic sensing element according to claim 9, wherein the Co-containing ferromagnetic material is one of CoFe and CoFeCr.

12. A magnetic sensing element according to claim 1, wherein the magnetic sensing element has a read efficiency η of 10% to 50%.

13. A magnetic sensing element according to claim 1, wherein, when an external magnetic field is applied, a magnetization direction in a region corresponding to a track width of the free magnetic layer is inclined at least 12° with respect to a magnetization direction in the absence of the applied external magnetic field.

14. A magnetic sensing element according to claim 1, wherein, in the multilayer film, the first antiferromagnetic layer, the pinned magnetic layer, the nonmagnetic material layer, the free magnetic layer, the nonmagnetic layer, the ferromagnetic layer, and the second antiferromagnetic layer are deposited in that order from the bottom.

15. A magnetic sensing element according to claim 1, wherein, in the multilayer film, the second antiferromagnetic layer, the ferromagnetic layer, the nonmagnetic layer, the free magnetic layer, the nonmagnetic material layer, the pinned magnetic layer, and the first antiferromagnetic layer are deposited in that order from the bottom.

16. A magnetic sensing element according to claim 15, wherein only a portion in a thickness direction of the free magnetic layer has a width in a track width direction that is equal to the track width, and a remaining portion has a width in the track width direction that is larger than the track width.

17. A magnetic sensing element according to claim 1, wherein the free magnetic layer comprises a plurality of ferromagnetic sublayers having different magnetic moments per unit area, a nonmagnetic intermediate sublayer being placed between the two adjacent ferromagnetic sublayers, and magnetization directions of the two adjacent ferromagnetic sublayers are antiparallel, and thus the free magnetic layer is in a ferrimagnetic state.

18. A magnetic sensing element according to claim 17, wherein the nonmagnetic intermediate sublayer comprises at least one material selected from the group consisting of Ru, Rh, Ir, Cr, Re, and Cu.

19. A magnetic sensing element according to claim 17, wherein at least one of the plurality of ferromagnetic sublayers comprises a magnetic material represented by a formula CoFeNi, wherein a Fe content is in the range of 9 to 17 atomic percent, a Ni content is in the range of 0.5 to 10 atomic percent, and a balance is Co.

20. A magnetic sensing element according to claim 17, further comprising an interlayer comprising one of CoFe and Co disposed between the ferromagnetic sublayer closest to the nonmagnetic material layer and the nonmagnetic material layer.

21. A magnetic sensing element according to claim 20, wherein at least one of the plurality of ferromagnetic sublayers comprises a magnetic material represented by a formula CoFeNi, wherein a Fe content is in the range of 7 to 15 atomic percent, the Ni content is in the range of 5 to 15 atomic percent, and a balance is Co.

22. A magnetic sensing element according to claim 18, wherein at least one of the plurality of ferromagnetic sublayers comprises a magnetic material represented by a formula CoFeNi, wherein a Fe content is in the range of 9 to 17 atomic percent, a Ni content is in the range of 0.5 to 10 atomic percent, and a balance is Co.

23. A magnetic sensing element according to claim 18, further comprising an interlayer comprising one of CoFe and Co disposed between the ferromagnetic sublayer closest to the nonmagnetic material layer and the nonmagnetic material layer.

24. A magnetic sensing element according to claim 23, wherein at least one of the plurality of ferromagnetic sublayers comprises a magnetic material represented by a formula CoFeNi, wherein a Fe content is in the range of 7 to 15 atomic percent, a Ni content is in the range of 5 to 15 atomic percent, and a balance is Co.

25. A magnetic sensing element according to claim 19, wherein all of the plurality of ferromagnetic sublayers comprise the CoFeNi.

26. A magnetic sensing element according to claim 21, wherein all of the plurality of ferromagnetic sublayers comprise the CoFeNi.

27. A magnetic sensing element according to claim 22, wherein all of the plurality of ferromagnetic sublayers comprise the CoFeNi.

28. A magnetic sensing element according to claim 24, wherein all of the plurality of ferromagnetic sublayers comprise the CoFeNi.

29. A magnetic sensing element according to claim 1, further comprising an upper electrode layer electrically connected to a top of the multilayer film and a lower electrode layer electrically connected to a bottom of the multilayer film, wherein a current is applied perpendicular to planes of individual layers of the multilayer film.

30. A magnetic sensing element according to claim 1, wherein the multilayer film further comprises a metalloid ferromagnetic Heusler alloy layer.

31. A magnetic sensing element according to claim 30, wherein the metalloid ferromagnetic Heusler alloy layer is in contact with a NiFe layer.

32. A magnetic sensing element according to claim 1, wherein the first antiferromagnetic layer and the second antiferromagnetic layer comprise the same antiferromagnetic material.

33. A magnetic sensing element according to claim 1, wherein one of the first antiferromagnetic layer and the second antiferromagnetic layer comprises one of a PtMn alloy; an X—Mn alloy, wherein X is at least one element selected from the group consisting of Pd, Ir, Rh, Ru, Os, Ni, and Fe; and a Pt—Mn—X' alloy, wherein X' is at least one element selected from the group consisting of Pd, Ir, Rh, Ru, Au, Ag, Os, Cr, Ni, Ar, Ne, Xe, and Kr.

* * * * *